(12) United States Patent
Sun et al.

(10) Patent No.: US 11,539,336 B2
(45) Date of Patent: Dec. 27, 2022

(54) FLOATING INVERTER AMPLIFIER DEVICE

(71) Applicant: BOARD OF REGENTS, THE UNIVERSITY OF TEXAS SYSTEM, Austin, TX (US)

(72) Inventors: Nan Sun, Austin, TX (US); Xiyuan Tang, Austin, TX (US)

(73) Assignee: BOARD OF REGENTS, THE UNIVERSITY OF TEXAS SYSTEM, Austin, TX (US)

( * ) Notice: Subject to any disclaimer, the term of this patent is extended or adjusted under 35 U.S.C. 154(b) by 13 days.

(21) Appl. No.: 17/339,592

(22) Filed: Jun. 4, 2021

(65) Prior Publication Data

US 2021/0384874 A1 Dec. 9, 2021

Related U.S. Application Data

(60) Provisional application No. 63/035,757, filed on Jun. 6, 2020.

(51) Int. Cl.
*H03F 3/217* (2006.01)
*H03F 1/02* (2006.01)
*H03F 3/00* (2006.01)

(52) U.S. Cl.
CPC ......... *H03F 3/2173* (2013.01); *H03F 1/0227* (2013.01); *H03F 3/005* (2013.01)

(58) Field of Classification Search
CPC ...... H03F 3/2173; H03F 1/0227; H03F 3/005; H03F 2203/45634; H03F 3/45475
USPC .......................................... 330/10, 252–261
See application file for complete search history.

(56) References Cited

PUBLICATIONS

S.-E. Hsieh and C.-C. Hsieh, "A 0.44-fJ/conversion-step 11-bit 600-kS/s SAR ADC with semi-resting DAC," IEEE J. Solid-State Circuits, vol. 53, No. 9, pp. 2595-2603, Sep. 2018.
H.-Y. Tai, Y.-S. Hu, H.-W. Chen, and H.-S. Chen, "A 0.85 fJ/conversionstep 10b 200 kS/s subranging SAR ADC in 40 nm CMOS," in IEEE Int. Solid-State Circuits Conf. (ISSCC) Dig. Tech. Papers, Feb. 2014, pp. 196-197.
S.-E. Hsieh and C.-C. Hsieh, "A 0.4-V 13-bit 270-kS/s SAR-ISDM ADC with opamp-less time-domain integrator," IEEE J. Solid-State Circuits, vol. 54, No. 6, pp. 1648-1656, Jun. 2019.
X. Tang, L. Chen, J. Song, and N. Sun, "A 1.5 fJ/conv-step 10b 100 kS/s SAR ADC with gain-boosted dynamic comparator," in Proc. IEEE Asian Solid-State Circuits Conf. (A-SSCC), Nov. 2017, pp. 229-232.

(Continued)

*Primary Examiner* — Hieu P Nguyen
(74) *Attorney, Agent, or Firm* — Meunier Carlin & Curfman LLC

(57) ABSTRACT

An exemplary system and method is disclosed employing a floating inverter amplifier comprising an inverter-based circuit comprising an input configured to be switchable between a floating reservoir capacitor during a first phase of operation and to a device power source during a second phase of operation. In some embodiments, the floating inverter amplifier is further configured for current reuse and dynamic bias. In other embodiments, the floating inverter amplifier is further configured with a dynamic cascode mechanism that does not need any additional bias voltage. The dynamic cascode mechanism may be used in combination with 2-step fast-settling operation to provide high-gain and high-speed noise suppression operation.

20 Claims, 36 Drawing Sheets

(56) References Cited

PUBLICATIONS

C.-C. Liu, S.-J. Chang, G.-Y. Huang, and Y.-Z. Lin, "A 10-bit 50-MS/s SAR ADC with a monotonic capacitor switching procedure," IEEE J. Solid-State Circuits, vol. 45, No. 4, pp. 731-740, Apr. 2010.
A. Sanyal and N. Sun, "SAR ADC architecture with 98% reduction in switching energy over conventional scheme," IET Electron. Lett., vol. 49, No. 4, pp. 248-250, Feb. 2013.
X. Tang, L. Chen, J. Song, and N. Sun, "A 10-b 750 μW 200 MS/s fully dynamic single-channel SAR ADC in 40 nm CMOS," in Proc. IEEE 42nd Eur. Solid-State Circuits Conf. ESSCIRC Conf., Sep. 2016, pp. 413-416.
T. Kobayashi, K. Nogami, T. Shirotori, Y. Fujimoto, and O. Watanabe, "A current-mode latch sense amplifier and a static power saving input buffer for low-power architecture," in IEEE Symp. VLSI Circuits Dig. Tech. Papers, Jun. 1992, pp. 28-29.
J. Montanaro et al., "A 160-MHz, 32-b, 0.5-W CMOS RISC microprocessor," IEEE J. Solid-State Circuits, vol. 31, No. 11, pp. 1703-1714, Nov. 1996.
M. van Elzakker, E. van Tuijl, P. Geraedts, D. Schinkel, E. A. M. Klumperink, and B. Nauta, "A 10-bit charge-redistribution ADC consuming 1.9 μW at 1 MS/s," IEEE J. Solid-State Circuits, vol. 45, No. 5, pp. 1007-1015, May 2010.
D. Schinkel, E. Mensink, E. Klumperink, E. Van Tuijl, and B. Nauta, "A double-tail latch-type voltage sense amplifier with 18 ps setup+ hold time," in IEEE Int. Solid-State Circuits Conf. (ISSCC) Dig. Tech. Papers, Feb. 2007, pp. 314-605.
H. S. Bindra, C. E. Lokin, D. Schinkel, A.-J. Annema, and B. Nauta, "A 1.2-V dynamic bias latch-type comparator in 65-nm CMOS with 0.4-mV input noise," IEEE J. Solid-State Circuits, vol. 53, No. 7, pp. 1902-1912, Jul. 2018.
M. Liu, K. Pelzers, R. van Dommele, A. van Roermund, and P. Harpe, "A 106 nW 10 b 80 kS/s SAR ADC with duty-cycled reference generation in 65 nm CMOS," IEEE J. Solid-State Circuits, vol. 51, No. 10, pp. 2435-2445, Oct. 2016.
X. Tang, B. Kasap, L. Shen, X. Yang, W. Shi, and N. Sun, "An energy efficient comparator with dynamic floating inverter preamplifier," in Proc. IEEE Symp. VLSI Circuits (VLSI), Jun. 2019, pp. C140-C141.
P. Nuzzo, F. De Bernardinis, P. Terreni, and G. Van der Plas, "Noise analysis of regenerative comparators for reconfigurable ADC architectures," IEEE Trans. Circuits Syst. I, Reg. Papers, vol. 55, No. 6, pp. 1441-1454, Jul. 2008.
L. Chen, A. Sanyal, J. Ma, X. Tang, and N. Sun, "Comparator commonmode variation effects analysis and its application in SAR ADCs," in Proc. IEEE Int. Symp. Circuits Syst. (ISCAS), May 2016, pp. 2014-2017.
B. Razavi, "The StrongARM latch [A circuit for all seasons]," IEEE Solid-State Circuits Mag., vol. 7, No. 2, pp. 12-17, Spring 2015.
T. Sepke, P. Holloway, C. G. Sodini, and H.-S. Lee, "Noise analysis for comparator-based circuits," IEEE Trans. Circuits Syst. I, Reg. Papers, vol. 56, No. 3, pp. 541-553, Mar. 2009.
M. S. Akter, K. A. A. Makinwa, and K. Bult, "A capacitively degenerated 100-dB linear 20-150 MS/s dynamic amplifier," IEEE J. Solid-State Circuits, vol. 53, No. 4, pp. 1115-1126, Apr. 2018.
L. Shen et al., "A 0.01 mm2 25 μW 2MS/s 74 dB-SNDR continuoustime pipelined-SAR ADC with 120fF input capacitor," in IEEE Int. Solid-State Circuits Conf. (ISSCC) Dig. Tech. Papers, Feb. 2019, pp. 64-66.
G. Reimbold and P. Gentil, "White noise of MOS transistors operating in weak inversion," IEEE Trans. Electron Devices, vol. ED-29, No. 11, pp. 1722-1725, Nov. 1982.
J. Fredenburg and M. Flynn, "A 90MS/s 11MHz bandwidth 62dB SNDR noise-shaping SAR ADC," in 2012 IEEE International Solid-State Circuits Conference, 2012, pp. 468-470.
Y. Shu, L. Kuo, and T. Lo, "27.2 an oversampling SAR ADC with DAC mismatch error shaping achieving 105dB SFDR and 101dB SNDR over 1kHz BW in 55nm CMOS," in 2016 IEEE International Solid-State Circuits Conference (ISSCC), 2016, pp. 458-459.
H. Zhuang et al., "A Second-Order Noise-Shaping SAR ADC With Passive Integrator and Tri-Level Voting," in IEEE Journal of Solid-State Circuits, vol. 54, No. 6, pp. 1636-1647, Jun. 2019.
Y. Lin, C. Lin, S. Tsou, C. Tsai, and C. Lu, "20.2 A 40MHz-BW 320MS/s Passive Noise-Shaping SAR ADC With Passive Signal-Residue Summation in 14nm FinFET," in 2019 IEEE International Solid-State Circuits Conference (ISSCC), 2019, pp. 330-332.
C. Liu and M. Huang, "28.1 A 0.46mW 5MHz-BW 79.7dB-SNDR noise-shaping SAR ADC with dynamic-amplifier-based FIR-IIR filter," in 2017 IEEE International Solid-State Circuits Conference (ISSCC), 2017, pp. 466-467.
S. Li, B. Qiao, M. Gandara, and N. Sun, "A 13-ENOB 2nd-order noise-shaping SAR ADC realizing optimized NTF zeros using an error-feedback structure," in 2018 IEEE International Solid—State Circuits Conference—(ISSCC), 2018, pp. 234-236.
Z. Chen, M. Miyahara, and A. Matsuzawa, "A 9.35-ENOB, 14.8 fj/conv.-step fully-passive noise-shaping SAR ADC," IEICE Transactions on Electronics, vol. 99, No. 8, pp. 963-973, 2016.
Z. Chen, M. Miyahara, and A. Matsuzawa, "A 2-nd order fully-passive noise-shaping SAR ADC with embedded passive gain," in 2016 IEEE Asian Solid-State Circuits Conference (A-SSCC). IEEE, 2016, pp. 309-312.
J. Liu, X. Wang, Z. Gao, M. Zhan, X. Tang, and N. Sun, "A 40kHz-BW 90dB-SNDR Noise-Shaping SAR with 4x Passive Gain and 2 nd-Order Mismatch Error Shaping," in 2020 IEEE International Solid-State Circuits Conference—(ISSCC). IEEE, 2020, pp. 158-160.
W. Guo and N. Sun, "A 12b-ENOB 61μW noise-shaping SAR ADC with a passive integrator," in ESSCIRC Conference 2016: 42nd European Solid-State Circuits Conference. IEEE, 2016, pp. 405-408.
M. Miyahara and A. Matsuzawa, "An 84 dB dynamic range 62.5-625 kHz bandwidth clock-scalable noise-shaping SAR ADC with open-loop integrator using dynamic amplifier," in 2017 IEEE Custom Integrated Circuits Conference (CICC). IEEE, 2017, pp. 1-4.
S. Li, B. Qiao, M. Gandara, D. Z. Pan, and N. Sun, "A 13-ENOB second-order noise-shaping SAR ADC realizing optimized NTF zeros using the error-feedback structure," IEEE Journal of Solid-State Circuits, vol. 53, No. 12, p. 3484-3496, 2018.
L. Jie, B. Zheng, and M. P. Flynn, "A Calibration-Free Time-Interleaved Fourth-Order Noise-Shaping SAR ADC," IEEE Journal of Solid-State Circuits, vol. 54, No. 12, pp. 3386-3395, 2019.
X. Tang, X. Yang, W. Zhao, C.-K. Hsu, J. Liu, L. Shen, A. Mukherjee, W. Shi, D. Z. Pan, and N. Sun, "A 13.5 b-ENOB Second-Order Noise-Shaping SAR with PVT-Robust Closed-Loop Dynamic Amplifier," in 2020 IEEE International Solid-State Circuits Conference—(ISSCC). IEEE, 2020, pp. 162-164.
X. Tang, L. Shen, B. Kasap, X. Yang, W. Shi, A. Mukherjee, D. Z. Pan, and N. Sun, "An Energy-Efficient Comparator With Dynamic Floating Inverter Amplifier," IEEE Journal of Solid-State Circuits, vol. 55, No. 4, pp. 1011-1022, 2020.
S.-H. W. Chiang, H. Sun, and B. Razavi, "A 10-Bit 800-MHz 19-mW CMOS ADC," IEEE Journal of Solid-State Circuits, vol. 49, No. 4, pp. 935-949, 2014.
Y. Lim and M. P. Flynn, "A 100 MS/s, 10.5 bit, 2.46 mW comparatorless pipeline ADC using self-biased ring amplifiers," IEEE Journal of Solid-State Circuits, vol. 50, No. 10, pp. 2331-2341, 2015.
J. Lagos, B. P. Hershberg, E. Martens, P. Wambacq, and J. Craninckx, "A 1-GS/s, 12-b, single-channel pipelined ADC with dead-zone-degenerated ring amplifiers," IEEE Journal of Solid-State Circuits, vol. 54, No. 3, pp. 646-658, 2019.
A. ElShater, P. K. Venkatachala, C. Y. Lee, J. Muhlestein, S. Leuenberger, K. Sobue, K. Hamashita, and U.-K. Moon, "A 10-mW 16-b 15-MS/s Two-Step SAR ADC With 95-dB DR Using Dual-Deadzone Ring Amplifier," IEEE Journal of Solid-State Circuits, vol. 54, No. 12, pp. 3410-3420, 2019.
S.-W. M. Chen and R. W. Brodersen, "A 6-bit 600-MS/s 5.3-mW Asynchronous ADC in 0.13-μm CMOS," IEEE Journal of Solid-State Circuits, vol. 41, No. 12, pp. 2669-2680, 2006.

(56) References Cited

PUBLICATIONS

J. A. Fredenburg and M. P. Flynn, "A 90-MS/s 11-MHz-Bandwidth 62-dB SNDR Noise-Shaping SAR ADC," IEEE Journal of Solid-State Circuits, vol. 47, No. 12, pp. 2898-2904, 2012.

Y.-S. Shu, L.-T. Kuo, and T.-Y. Lo, "An oversampling SAR ADC with DAC mismatch error shaping achieving 105 dB SFDR and 101 dB SNDR over 1 kHz BW in 55 nm CMOS," IEEE Journal of Solid-State Circuits, vol. 51, No. 12, pp. 2928-2940, 2016.

K. Obata, K. Matsukawa, T. Miki, Y. Tsukamoto, and K. Sushihara, "A 97.99 db sndr, 2 khz bw, 37.1 w noise-shaping sar-adc with dynamic element matching and modulation dither effect," in 2016 IEEE Symposium on VLSI Circuits (VLSI-Circuits). IEEE, 2016, pp. 1-2.

Y.-Z. Lin, C.-H. Tsai, S.-C. Tsou, R.-X. Chu, and C.-H. Lu, "A 2.4-mW 25-MHz BW 300-MS/s passive noise shaping SAR ADC with noise quantizer technique in 14-nm CMOS," in 2017 Symposium on VLSI Circuits. IEEE, 2017, pp. C234-C235.

S. Billa, A. Sukumaran, and S. Pavan, "Analysis and design of continuous-time delta-sigma converters incorporating chopping," IEEE Journal of Solid-State Circuits, vol. 52, No. 9, pp. 2350-2361, 2017.

B. Hershberg, S. Weaver, K. Sobue, S. Takeuchi, K. Hamashita, and U.-K. Moon, "Ring amplifiers for switched capacitor circuits," IEEE Journal of Solid-State Circuits, vol. 47, No. 12, pp. 2928-2942, 2012.

Y. Lim and M. P. Flynn, "A 1 mW 71.5 dB SNDR 50 MS/s 13 bit fully differential ring amplifier-based SAR-assisted pipeline ADC," IEEE Journal of Solid-State Circuits, vol. 50, No. 12, pp. 2901-2911, 2015.

FLOATING INVERTER AMPLIFIER DEVICE

RELATED APPLICATION

This application claims priority to, and the benefit of, U.S. Provisional Patent Application No. 63/035,757, which is incorporated by reference herein in its entirety.

FIELD OF THE INVENTION

Embodiments described herein relate generally to electric circuits, in particular, a mixed-signal device configured with floating inverter amplifier electric circuit.

SUMMARY

An exemplary system and method is disclosed employing a floating inverter amplifier comprising an inverter-based circuit (e.g., inverter bridge having a pair or more of inverters) comprising an input configured to be switchable between a floating reservoir capacitor during a first phase of operation and to a device power source during a second phase of operation (e.g., where the floating reservoir capacitor is charged by the device power source during the second phase of operation).

In some embodiments, the floating inverter amplifier is further configured for current reuse and dynamic bias. In other embodiments, the floating inverter amplifier is further configured with a dynamic cascode mechanism that does not need any additional bias voltage. The dynamic cascode mechanism may be used in combination with 2-step fast-settling operation to provide high-gain and high-speed noise suppression operation.

Several example designs are provided for an energy-efficient comparator and an energy-efficient data converter, high-speed and high-gain data converter, though the exemplary floating inverter amplifier may be implemented in other signal path or the feedback path application of various other devices. For example, the floating inverter amplifier may be implemented along the signal path of an amplifier device or comparator device to pre-amplify an input signal prior to subsequent processing. In another example, the floating inverter amplifier may be implemented in a loop filter, e.g., in a feedback path, as a switched-capacitor core amplifier or integrator of a data converter device. Examples of such data converter device include, but not limited to, Delta-Sigma modulator, pipeline ADC, capacitance-to-digital converter. In yet other examples, the floating inverter amplifier may be implemented in physical data conversion processes, such as, but not limited to, capacitance-to-digital converter, temperature sensors, and various other physical-sensing sensors. In yet other examples, the floating inverter amplifier may be used as a switch-capacitor based amplifier for analog devices such as DC-DC converter, low dropout regulator, etc.

In the example comparator device, the exemplary floating inverter amplifier is shown to significantly boost $g_m/I_D$ of the comparator, which reduces input-referred noise and increases amplification gain. As a result, the noise of its subsequent stages (e.g., SA latch) is also reduced. In the design, the exemplary floating inverter amplifier is also shown to greatly reduce the influence of the process corner and the input common-mode voltage on the comparator performance, which yields reduction in noise, offset, and delay variations. In addition, in a 180-nm prototype, the exemplary floating inverter amplifier was shown to provide an energy efficient comparator with a 46-μV input-referred noise that consumes only 1 pJ for each given comparison under a 1.2-V supply, which provides 7× energy-efficiency boost as compared to the same comparator circuit without the floating inverter amplifier. Indeed, there is no restriction to the processing technology, and the exemplary floating inverter amplifier can be implemented in other process, e.g., 14 nm, 22 nm, 40 nm, 90 nm, 130 nm, and other process described herein and the cited references.

In an example data converter device, the exemplary floating inverter amplifier is shown implemented in a second-order noise-shaping (NS) successive approximation register (SAR) analog-to-digital converter (ADC) (also referred to herein as "2nd-order NS-SAR ADC"). The floating inverter amplifier is particularly suitable for closed-loop operation because of its constant output common-mode and high gain. In the example data converter design, two stage inverters powered by two floating reservoir capacitors are cascaded in a closed-loop configuration to concurrently realize a process, voltage, and temperature (PVT)-robust, high accurate, high energy-efficient operation. The exemplary floating inverter amplifier stage is implemented in a loop filter stage of a noise-shaping (NS) successive approximation register (SAR) to facilitate a fully-dynamic NS-SAR ADC that realizes sharp noise transfer function (NTF) while not requiring any gain calibration. In a 40-nm CMOS technology prototype, the 2nd-order NS-SAR ADC was observed to achieve an SNDR of 83.8 dB over a bandwidth of 625 kHz while consuming only 107 μW to provide an SNDR-based Schreier figure-of-merit (FoM) of 181.5 dB.

In another example data converter device, the exemplary floating inverter amplifier is shown implemented as an event-driven pipelined ADC with a multi-stage cascoded floating inverter amplifier. The floating inverter amplifier can provide high gain in a multi-stage topology structure with dynamic cascode mechanism that does not need any additional bias voltage (providing for a more efficient and eloquent design). In addition, the floating inverter amplifier can provide high-speed operation using a multi-step fast-settling operation. In a 40-nm CMOS technology prototype, the event-driven pipelined ADC with a multi-stage cascoded floating inverter amplifier was observed to provide a 75.7 dB-SNDR that can linearly scaled power across 100× sampling rate adjustment from 0.4 MS/s to 40 MS/s. The floating inverter amplifier was observed to provide an 82 dB gain that has both fast settling and good stability while consuming only 821 uW at 40 MS/s, leading to Walden and Schreier FoMs of 4.1 fJ/conv-step and 179.6 dB, respectively.

In an aspect, an apparatus is disclosed comprising a floating inverter amplifier, wherein the floating inverter amplifier comprises a pair of inverters (e.g., dynamically-biased PMOS and a dynamically-biased NMOS) forming a bridge, the bridge comprising an input configured to be switchable between a floating reservoir capacitor that powers the pair of inverters during a first phase of operation and to a device power source that powers the pair of inverters during a second phase of operation, wherein the floating reservoir capacitor is charged by the device power source during the second phase of operation.

In some embodiments, the floating inverter amplifier is configured to boost $g_m/I_D$ from current reuse and dynamic bias.

In some embodiments, the floating inverter amplifier is configured for at least 2-time current reuse.

In some embodiments, the floating inverter amplifier is configured to provide an intrinsically constant output common-mode voltage.

In some embodiments, the floating inverter amplifier is configured to provide process, voltage, and temperature robustness.

In some embodiments, the floating inverter amplifier is configured to provide high-gain with constant output common-mode voltage.

In some embodiments, the apparatus comprises a comparator having input-referred noise less than 46-μV that consumes about or less than 1 pJ per comparison under a 1.2-V supply.

In some embodiments, the apparatus further includes a SA latch coupled to the floating inverter amplifier to collectively form a comparator (e.g., wherein the floating inverter amplifier is configured to significantly boost $g_m/I_D$ of the comparator, which reduces input-referred noise and increases amplification gain).

In some embodiments, the floating inverter amplifier is configured to reduce the influence of process corner and of input common-mode voltage on the comparator, which yields reduction in noise, offset, and delay variations.

In some embodiments, the apparatus is selected from an amplifier, a comparator, a sensor, a DC-DC converter, a power regulator, and a low drop-out regulator.

In some embodiments, the floating inverter amplifier is configured as a loop filter in a closed feedback-loop operation of the apparatus (e.g., to provide PVT-robust, fully dynamic, and accurate closed-loop operation), the apparatus being selected from the group consisting of Delta-Sigma modulator, a pipeline ADC, and capacitance-to-digital converter, configured with loop filter.

In some embodiments, the apparatus is configured as a mixed-signal circuit device (e.g., analog to digital converter, capacitance to digital converter), an integrated circuit device (e.g., comparator, amplifier), and microcontroller circuit device.

In some embodiments, the apparatus is configured for current reuse and dynamic bias and for constant output common-mode voltage and PVT/input common mode.

In some embodiments, the apparatus is configured as a $2^{nd}$-order noise-shaping successive-approximation register ADC.

In some embodiments, the $2^{nd}$-order noise-shaping successive-approximation register ADC comprise a multi-stage dynamic amplifier each comprising the floating inverter amplifier.

In some embodiments, the floating reservoir capacitor comprises a metal-on-metal (MoM) capacitor.

In some embodiments, the apparatus is fabricated with a 14-nm process, a 22-nm process, a 40-nm process, a 90-nm process, a 130-nm process, or a combination thereof.

In another aspect, an integrated circuit device is disclosed comprising a floating inverter amplifier, wherein the floating inverter amplifier comprises a pair of inverters (e.g., dynamically-biased PMOS and a dynamically-biased NMOS) forming a bridge, the bridge comprising an input configured to be switchable between a floating reservoir capacitor that powers the pair of inverters during a first phase of operation and to a device power source that powers the pair of inverters during a second phase of operation, wherein the floating reservoir capacitor is charged by the device power source during the second phase of operation.

In some embodiments, the floating inverter amplifier is located along an input signal path for the subsequent stage.

In some embodiments, the floating inverter amplifier is located along feedback path for the subsequent stage.

BRIEF DESCRIPTION OF DRAWINGS

Embodiments of the present invention may be better understood from the following detailed description when read in conjunction with the accompanying drawings. Such embodiments, which are for illustrative purposes only, depict novel and non-obvious aspects of the invention. The drawings include the following figures.

DETAILED SPECIFCATION

Figure 1:
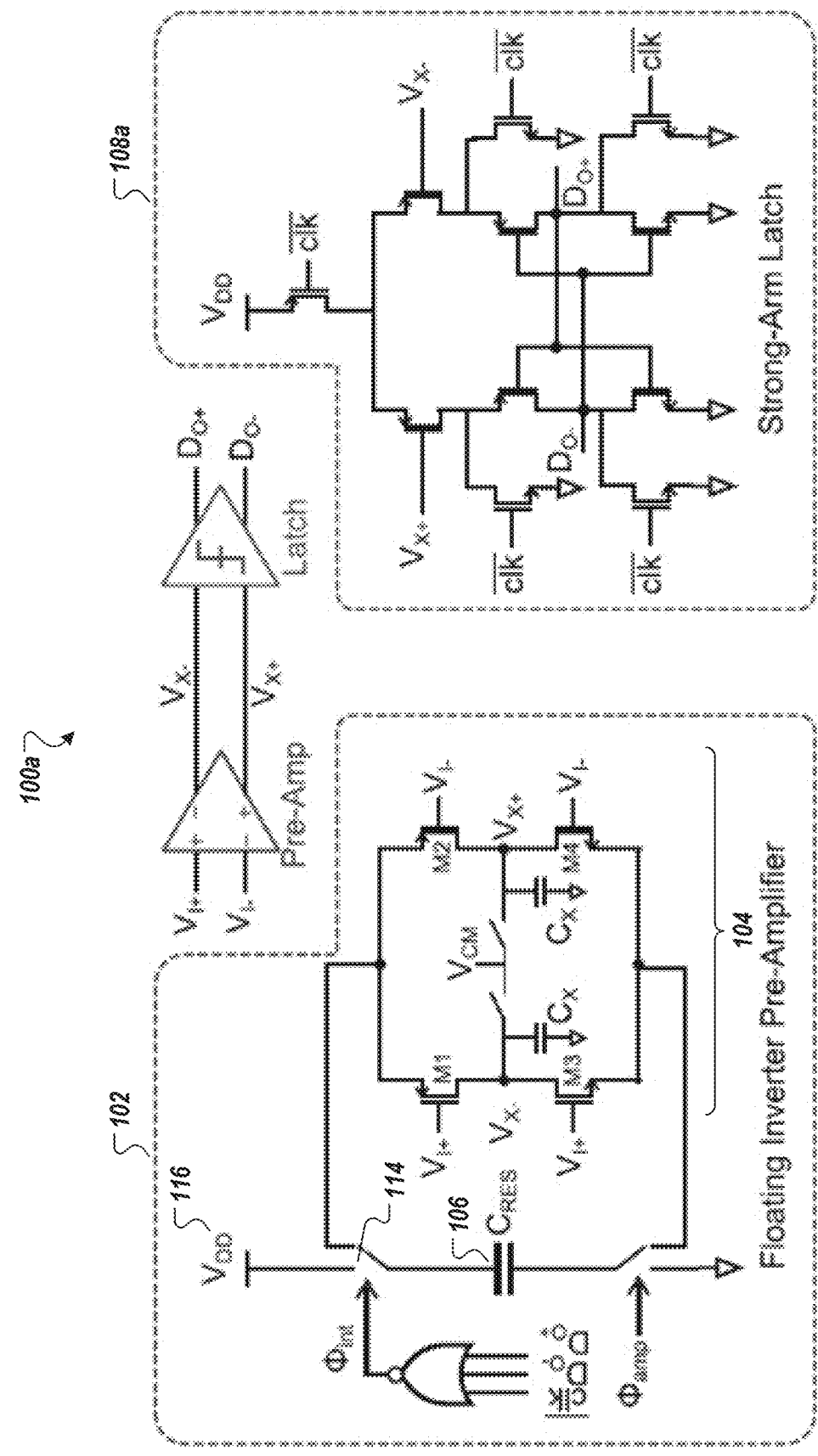
FIG. 1 shows a floating inverter amplifier of a device configured as a comparator in accordance with an illustrative embodiment.

Each and every feature described herein, and each and every combination of two or more of such features, is included within the scope of the present invention provided that the features included in such a combination are not mutually inconsistent.

In some aspects, the disclosed technology relates to capacitance-to-digital converter circuits and operations. Although example embodiments of the disclosed technology are explained in detail herein, it is to be understood that other embodiments are contemplated. Accordingly, it is not intended that the disclosed technology be limited in its scope to the details of construction and arrangement of components set forth in the following description or illustrated in the drawings. The disclosed technology is capable of other embodiments and of being practiced or carried out in various ways.

It must also be noted that, as used in the specification and the appended claims, the singular forms "a," "an" and "the" include plural referents unless the context clearly dictates otherwise. Ranges may be expressed herein as from "about" or "approximately" one particular value and/or to "about" or "approximately" another particular value. When such a range is expressed, other exemplary embodiments include from the one particular value and/or to the other particular value.

By "comprising" or "containing" or "including" is meant that at least the named compound, element, particle, or method step is present in the composition or article or method, but does not exclude the presence of other compounds, materials, particles, method steps, even if the other such compounds, material, particles, method steps have the same function as what is named.

In describing example embodiments, terminology will be resorted to for the sake of clarity. It is intended that each term contemplates its broadest meaning as understood by those skilled in the art and includes all technical equivalents that operate in a similar manner to accomplish a similar purpose. It is also to be understood that the mention of one or more steps of a method does not preclude the presence of additional method steps or intervening method steps between those steps expressly identified. Steps of a method may be performed in a different order than those described herein without departing from the scope of the disclosed technology. Similarly, it is also to be understood that the mention of one or more components in a device or system does not preclude the presence of additional components or intervening components between those components expressly identified.

Some references, which may include various patents, patent applications, and publications, are cited in a reference list and discussed in the disclosure provided herein. The citation and/or discussion of such references is provided merely to clarify the description of the disclosed technology and is not an admission that any such reference is "prior art" to any aspects of the disclosed technology described herein. In terms of notation, "[n.1]" corresponds to the nth reference in a first list and "[n.2]" corresponds to the nth reference in a second list. For example, [4.1] refers to the fourth reference in the first reference list, namely [4.1] X. Tang, L. Chen, J. Song, and N. Sun, "A 1.5 fJ/conv-step 10b 100 kS/s SAR ADC with gain-boosted dynamic comparator," in Proc. IEEE Asian Solid-State Circuits Conf. (A-SSCC), Nov. 2017, pp. 229-232, while [4.2] refers to the fourth reference in the second reference list, namely [4.2] J. A. Fredenburg and M. P. Flynn, "A 90-MS/s 11-MHz-Bandwidth 62-dB SNDR Noise-Shaping SAR ADC," IEEE Journal of Solid-State Circuits, vol. 47, no. 12, pp. 2898-2904, 2012. All references cited and discussed in this specification are incorporated herein by reference in their entireties and to the same extent as if each reference was individually incorporated by reference.

In the following description, references are made to the accompanying drawings that form a part hereof and that show, by way of illustration, specific embodiments or examples. In referring to the drawings, like numerals represent like elements throughout the several figures.

Example—Floating Inverter Amplifier

An exemplary system and method is disclosed employing a floating inverter amplifier comprising an inverter-based circuit (e.g., inverter bridge having a pair or more of inverters) coupled to a floating reservoir capacitor input configured for current reuse. In some embodiments, the floating reservoir capacitor input is coupled to a dynamic inverter bridge configured with dynamic bias.

FIG. 1 shows a floating inverter amplifier 102 of a device 100 (shown as 100a) configured as a comparator in accordance with an illustrative embodiment. The floating inverter amplifier 102 includes an inverter-based circuit 104 (having a pair or more of inverters) comprising an input 114 configured to be switchable between a floating reservoir capacitor 106 (shown as floating reservoir capacitor "$C_{RES}$" 106) during a first phase of operation and to a device power source (shown as "$V_{DD}$" 116) during a second phase of operation (e.g., where the floating reservoir capacitor 106 is charged by the device power source 116 during the second phase of operation). Indeed, during the first phase of operation, the inverter-based input pair is powered by a floating reservoir capacitor. The floating inverter amplifier 102 is further configured for current reuse and dynamic biasing, and PVT-robustness. The exemplary floating inverter amplifier is shown to significantly boost $g_m/I_D$ of the comparator, which reduces input-referred noise and increases amplification gain. As a result, the noise of its subsequent stages (e.g., SA latch) is also reduced. In the design, the exemplary floating inverter amplifier is also shown to greatly reduce the influence of the process corner and the input common-mode voltage on the comparator performance, which yields reduction in noise, offset, and delay variations.

The floating inverter amplifier 102 may be implemented, e.g., in a signal path, in an amplifier device or comparator device to pre-amplify the input signal prior to subsequent processing. In another example, the floating inverter amplifier 102 may be implemented in a loop filter, e.g., in a feedback path, as a switched-capacitor core amplifier or integrator of a data converter device. As noted, examples of such data converter device may include, but not limited to, Delta-Sigma modulator, pipeline ADC, capacitance-to-digital converter. In yet other examples, the floating inverter amplifier 102 may be implemented in physical data conversion processes, such as, but not limited to, capacitance-to-digital converter, temperature sensors, and various other physical-sensing sensors. In yet other examples, the floating inverter amplifier may be used as a switch-capacitor based amplifier for analog devices such as DC-DC converter, low dropout regulator, etc.

In FIG. 1, the comparator device 100a includes the floating inverter amplifier 102 coupled to a SA-latch 108 (shown as "Strong-Arm Latch" 108a) as a subsequent stage. The comparator device 100a is configured as an energy-efficient dynamic comparator with a floating-inverter-amplifier (FIA)-based pre-amplifier. The inverter-based input 104 in the floating inverter amplifier 102 is configured to naturally realize current reuse. In addition, by powering the floating inverter amplifier 102 with a floating reservoir capacitor 106, the floating inverter amplifier 102 provides an isolated power domain that can provide amplification independent of the input common-mode voltage. The output common-mode voltage of the floating inverter amplifier 102 can be kept constant, which can elongate the integration time and increases the gain. In addition, the floating reservoir capacitor 106 can provide dynamic source degeneration that can increase the $g_m/I_D$ and prevent the full discharge of the integration capacitors. In certain embodiments, the floating inverter amplifier 102 can improve energy efficiency of the comparator 100a by seven-time as compared to the comparator configured with the SA latch 108a that is input common-mode insensitive.

Figure 2:
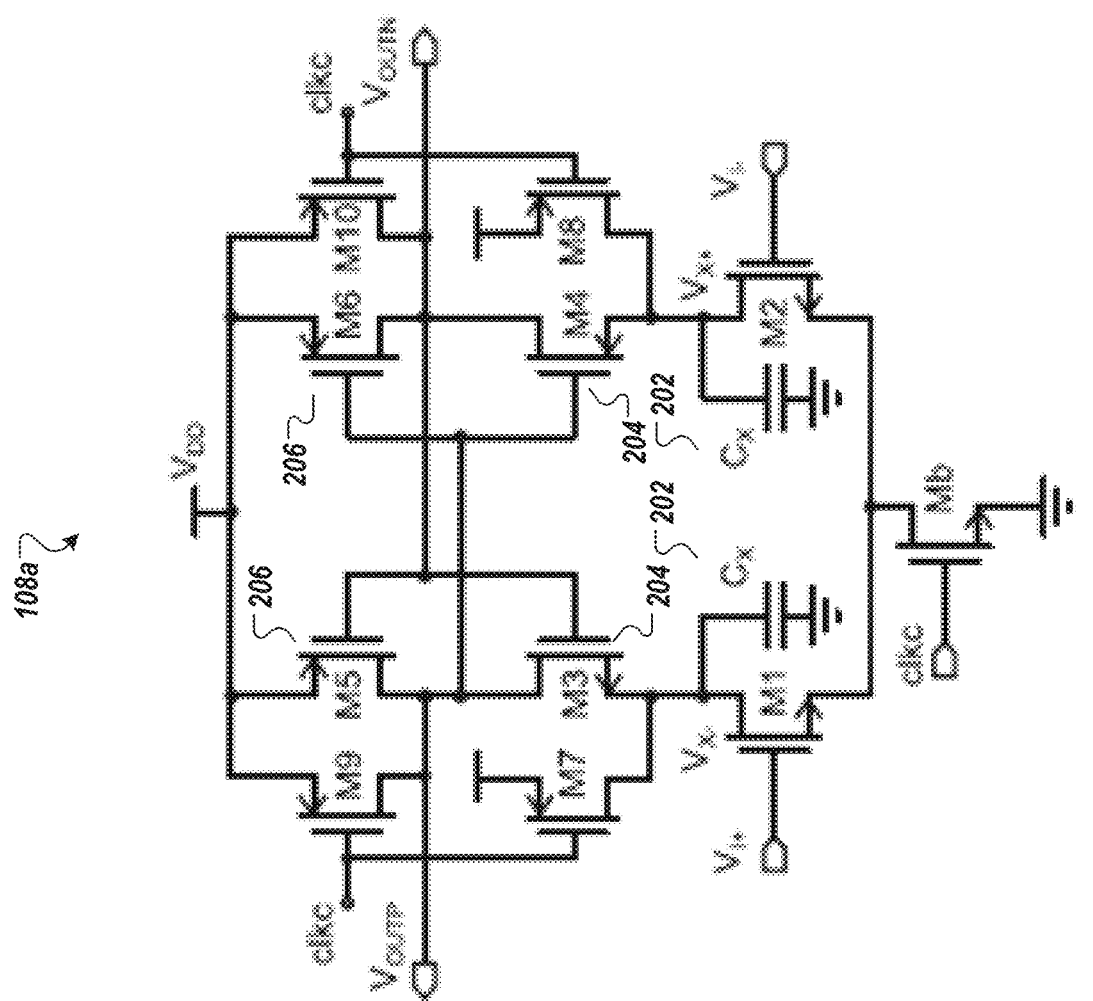
FIG. 2 shows an example implementation of a conventional SA latch configured with a conventional nMOS dynamic integrator-based pre-amplifier.

Example Conventional SA Latch. FIG. 2 shows an example implementation of a classical SA latch configured with a conventional nMOS dynamic integrator-based pre-amplifier. In FIG. 2, the SA latch is configured to integrate and latch in an integration phase and a latch regeneration phase. The turn-on of the pMOS cross-coupled pair separates the two phases. During the integration phase, the comparator configured with this SA latch works as a dynamic integrator to continuously integrate the input signal onto the integration capacitor $C_X$ 202. Switches M3/M4 (204) are gradually turned on during the integration process. With the output nodes dropping below ($V_{DD}$-$V_{THP}$), where $V_{THP}$ is the threshold voltage of switches M5/M6 (206), the comparator 100a enters the latch phase. The positive feedback provides the exponentially growing gain and dominates the behavior of the comparator during this phase.

Figure 3A:
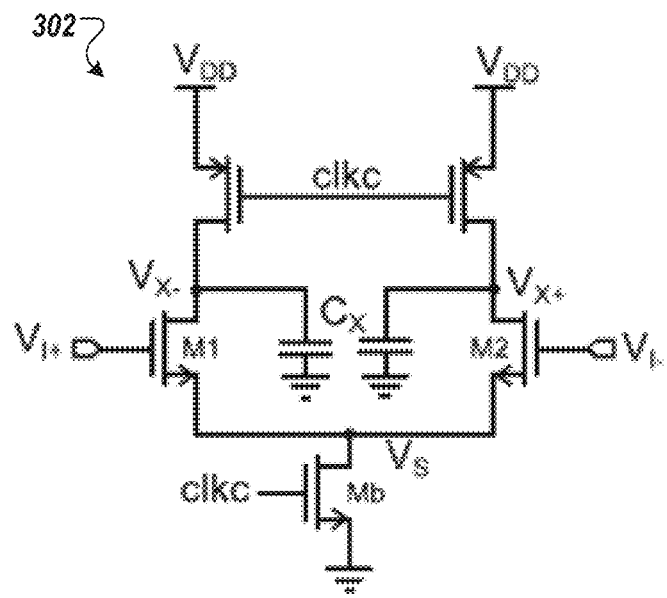
FIG. 3A shows a conventional nMOS integration pre-amplifier model.

FIG. 3A shows a conventional nMOS integration pre-amplifier model. In FIG. 3A, the simplified model shows a low-noise comparator with large capacitors $C_X$ placed at the integration nodes. The $C_X$ integration process plays the dominant role in setting the comparator noise and power [10.1], [12.1], [15.1], [16.1]. Analyses in [15.1]-[18.1] show that the integration time can approximated as shown in Equation 1.

$$T_{int} \approx \frac{C_X}{I_D} \cdot V_{THN} \qquad (1)$$

In Equation 1, $V_{THN}$ is the threshold voltage of M3/M4 (204). The integration gain $A_{int}$ depends on the input transistor $g_m/I_D$ and the threshold voltage $V_{THN}$ as shown in Equation 2.

$$A_{int} \approx \frac{g_m}{C_X} \cdot T_{int} \approx \frac{g_m}{I_D} \cdot V_{THN} \quad (2)$$

Conventionally, the input transistors may be biased in the strong-inversion region. A detailed analysis reveals that the input-referred comparator noise is dominated by the dynamic integrator, which is inversely proportional to gm/ID and the loading capacitor $C_X$ (202) as described in [15.1], [18.1], [19.1].

$$\sigma_{n,int}^2 \approx \frac{I_D}{g_m} \cdot \frac{4kT\gamma}{V_{THN}C_X} \quad (3)$$

To reduce the thermal noise, a high $g_m/I_D$ is desired along with a large loading capacitor $C_X$. The noise and offset contributed from the latch is attenuated by the integrator gain $A_{int}$ as shown in Equation 4.

$$\sigma_{n(os),in} \approx \sqrt{\sigma_{n,int}^2 + \frac{\sigma_{n(os),latch}^2}{A_{int}^2}}$$

(4)

Indeed, to design a low-noise comparator, a large integration gain $A_{int}$ is desired. In general, it is observed that this SA latch design can save energy by eliminating static current and can achieve high speed with use of a positive feedback in the latch phase.

Indeed, the nMOS dynamic integrator-based pre-amplifier of the SA latch of FIG. 2 suffers from several limitations. First, the integration phase stops when $V_{X+}/V_{X-}$ nodes reach ($V_{DD}$-$V_{THN}$), which means that only the initial discharge of the loading capacitors contributes to the noise reduction. Because $C_X$ is usually large, fully discharging the capacitors is a waste of energy. Second, the integration gain is limited by the bounded output common-mode drop $V_{THN}$, which can result in a low dynamic integrator gain less than 10. Third, the tail transistor works in the linear region, which can result in a strong correlated ID with input common-mode voltage. Thus, the comparator performance (e.g., noise, offset, and speed) may depend strongly on the input common-mode voltage.

Dynamic-Bias Integration. To address such deficiencies, the exemplary device 100 may include a dynamic bias integration (an example discussed in [12.1]) in conjunction with the SA latch (e.g., 108a) to increase the $g_m/I_D$ of the input pair and prevent the full discharge of the integration capacitors $C_X$, thus improving the energy efficiency. A comparison between the conventional nMOS integration model and the DB integration model is presented in FIG. 3A and a dynamic-bias nMOS integration pre-amplifier circuit 304 shown in FIG. 3B in accordance with an illustrative embodiment.

Figure 3B:
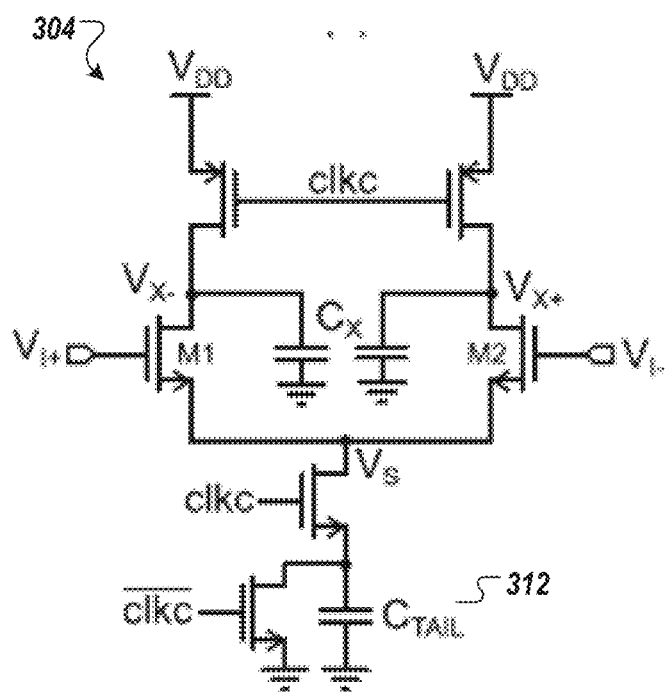
FIG. 3B shows a dynamic-bias nMOS integration pre-amplifier circuit 304 in accordance with an illustrative embodiment.
Figure 3C:
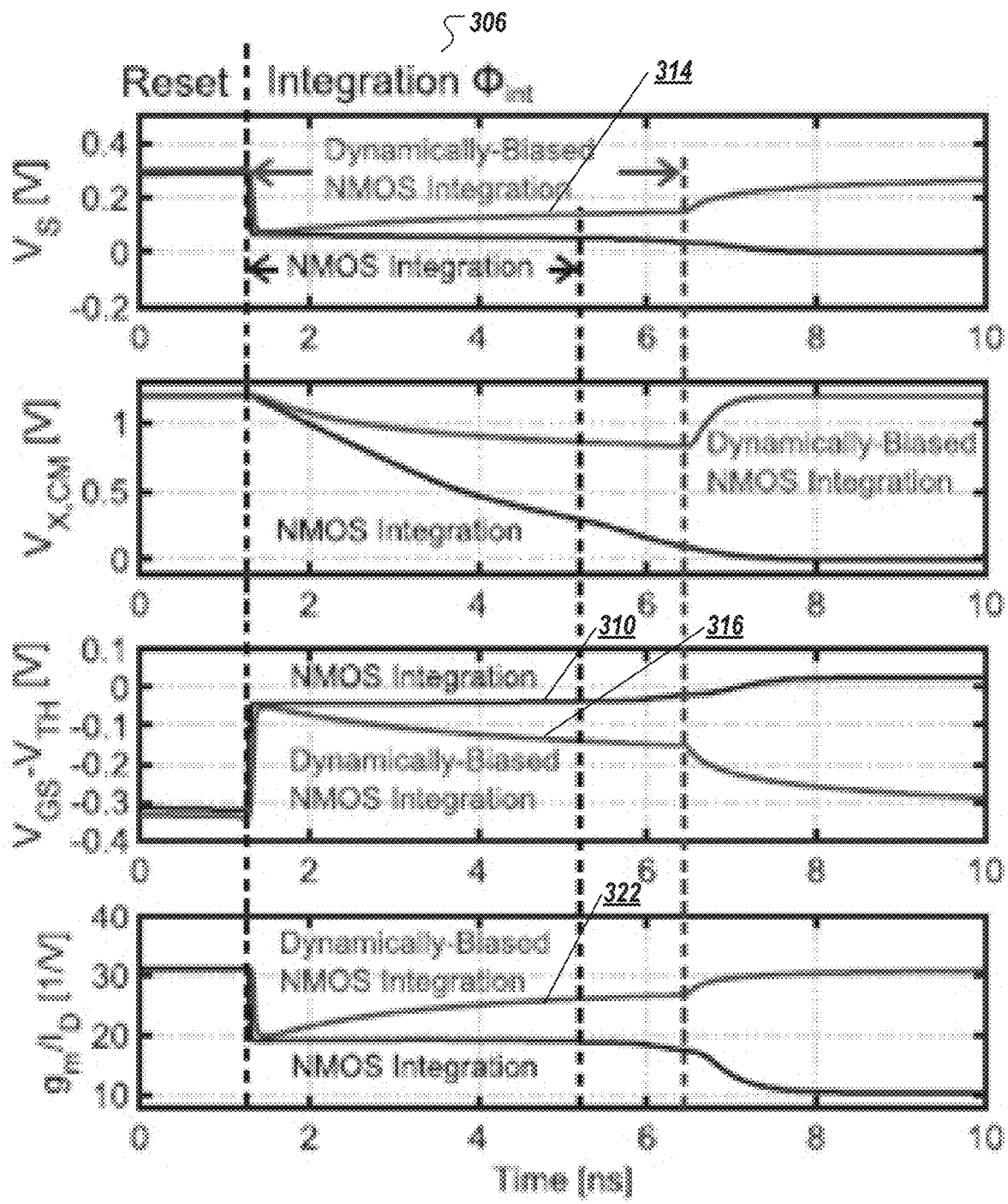
FIG. 3C shows the simulated pre-amplifier behavior between the conventional nMOS integration pre-amplifier circuit of FIG. 3A and the dynamic-bias nMOS integration pre-amplifier of FIG. 3B in accordance with an illustrative embodiment.

FIGS. 3C shows the simulated pre-amplifier behavior between the conventional nMOS integration pre-amplifier circuit 302 of FIG. 3A and the dynamic-bias nMOS integration pre-amplifier 304 of FIG. 3B. As shown in FIG. 3C, during the integration phase $\Phi_{int}$ (306) of a SA latch 302, the overdrive voltage ($V_{GD}$-$V_{TH}$) (shown as 310) of the input pair stays approximately constant, which results in a constant $g_m/I_D$ of 20 $V^{-1}$. However, in the dynamic-bias integrator 304, which comprises a tail capacitor $C_{TAIL}$ (312), the tail capacitor 312 cause the source voltage $V_S$ (314) to charge up, which results in the reduced overdrive voltage (316) of the input pair.

Indeed, the tail capacitor 312 provides several benefits to the SA latch 108a. First, as the voltage $V_S$ increases (314), the $V_{GS}$ of M1/M2 reduces until the source voltage reaches the cutoff point, $V_S=V_I-V_{TH}$, where $V_{TH}$ is a threshold voltage of the transistors M1/M2. Then, the input pair turns off, and the dynamic integration stops, which prevents the full discharge of the loading capacitors, as can been seen from the common-mode voltage behavior of the integration nodes VX,CM. In addition, a reduced overdrive voltage (316) results in an increased $g_m/I_D$ (322) during $\Phi_{int}$ (306). FIG. 3C indeed shows that the average $g_m/I_D$ of the dynamic-bias integration of FIG. 3B is increased by 30% compared with the conventional nMOS integration of FIG. 3A. The higher $g_m/I_D$ (322) of the integrator directly reduces the input-referred noise of the dynamic integration phase, which is inversely proportional to $g_m/I_D$. The higher $g_m/I_D$ (322) also provides higher integration gain, thus reducing the noise contribution of the SA latch (e.g., 108a), as pointed out in [4.1]. In this example, the dynamic-bias integration-based comparator configured with the SA latch of FIG. 3B (as described in [12.1]) achieves three-time energy efficiency improvement compared with the conventional dynamic comparator of FIG. 2A.

Figure 4A:
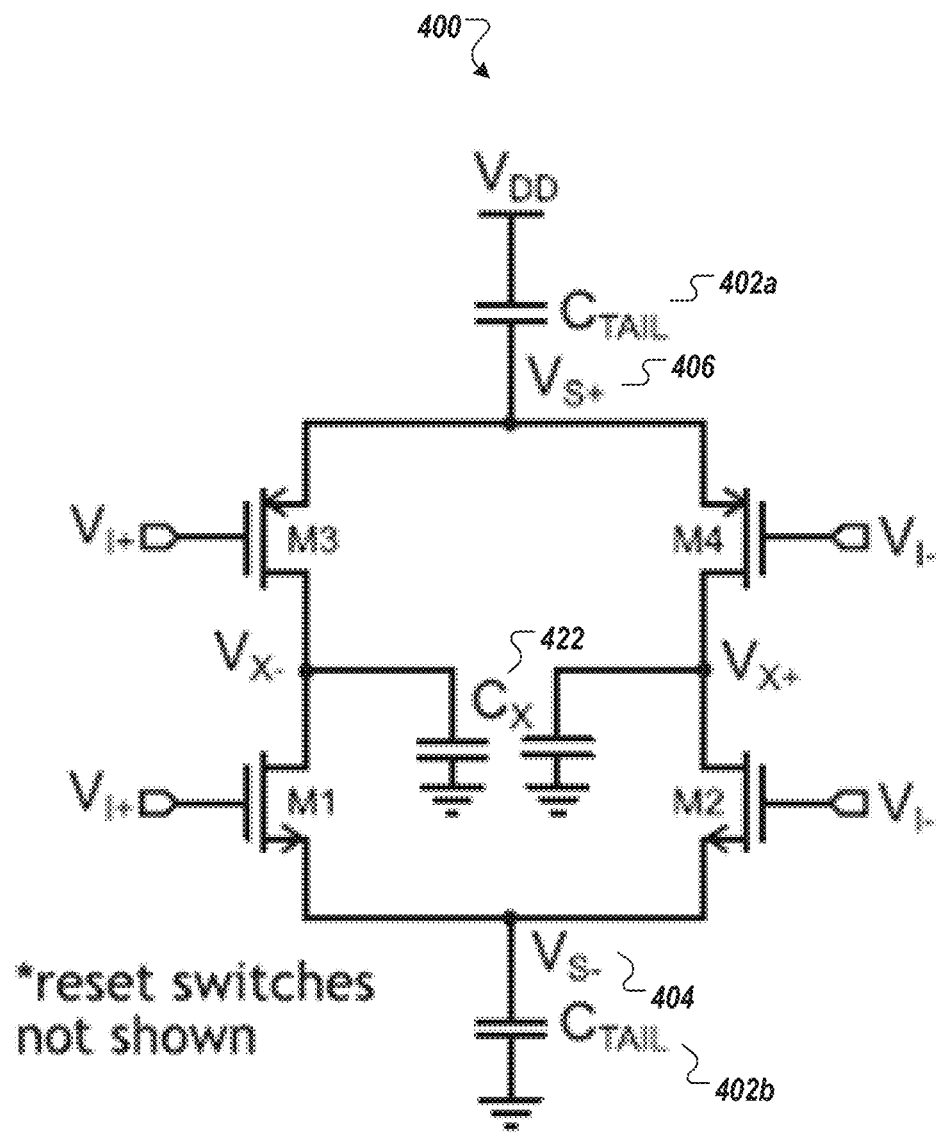
FIG. 4A shows a differential-mode CMOS dynamic bias integration model comprising a CMOS input pair that is coupled to two tail capacitors in accordance with an illustrative embodiment.
Figure 4B:
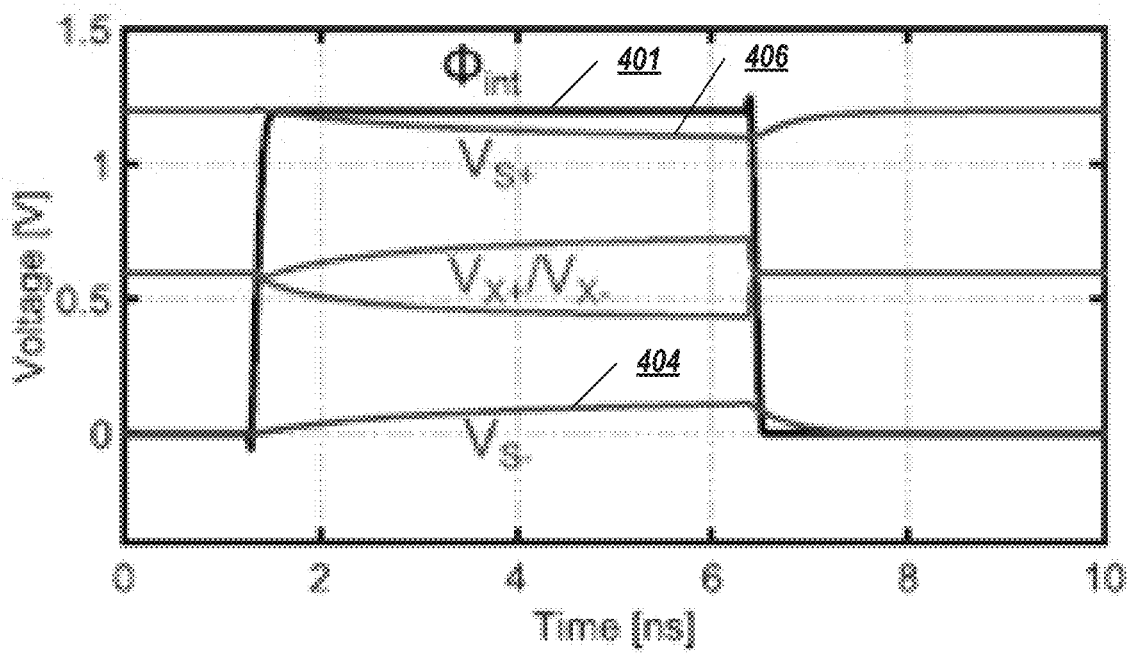
FIG. 4B shows simulated amplifier behavior comprising the CMOS dynamic bias integration model of FIG. 4A in accordance with an illustrative embodiment.
Figure 4C:
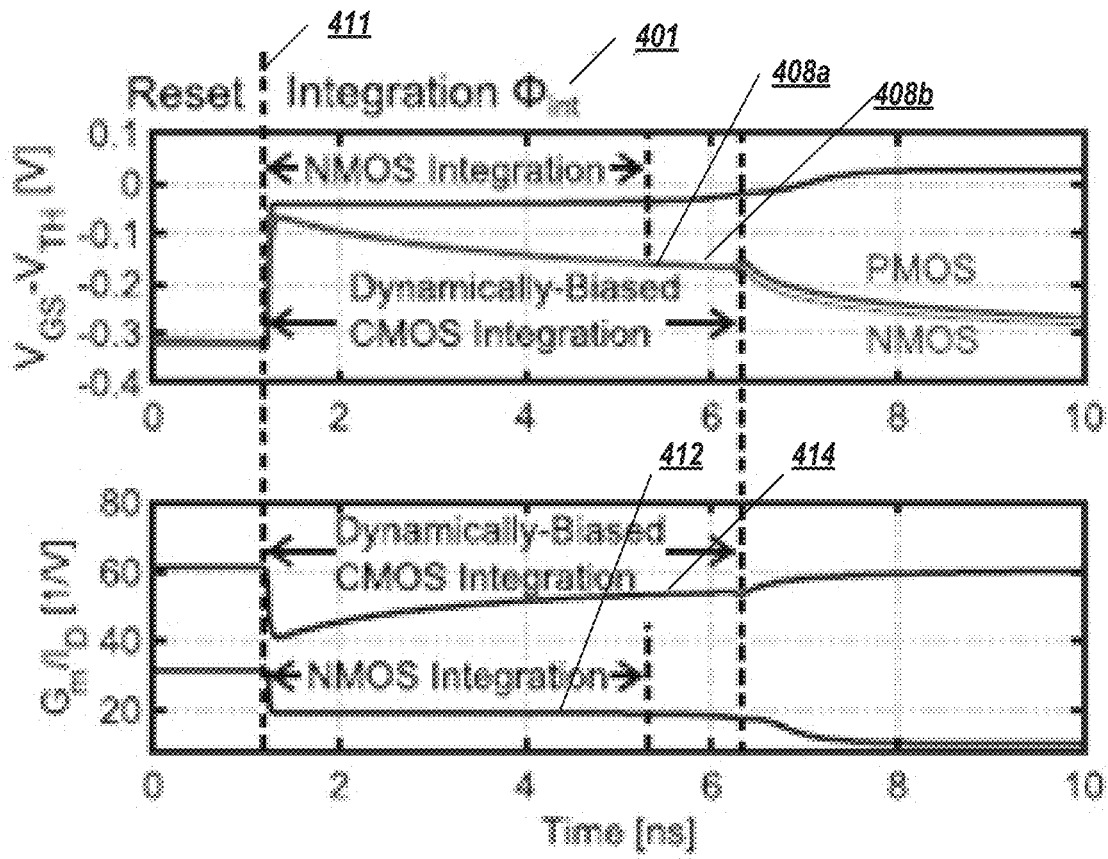
FIG. 4C shows compared performance between the SA latch configured with the CMOS dynamic bias integration model of FIG. 4A as compared to the conventional SA latch of FIG. 2A in accordance with an illustrative embodiment.

CMOS Dynamic Bias Integration Pre-Amplifier. To improve the energy efficiency of the pre-amplifier further, the pre-amplifier may include a CMOS dynamic-bias integration. FIG. 4A shows a differential-mode CMOS dynamic bias integration model 400 comprising a CMOS input pair that is coupled to two tail capacitors (shown as "$C_{TAIL}$" 402a, 402b). FIG. 4B shows simulated pre-amplifier behavior comprising the CMOS dynamic bias integration model 400 of FIG. 4A. FIG. 4C shows compared performance between the SA latch configured with the CMOS dynamic bias integration model 400 of FIG. 4A as compared to the SA latch of FIG. 2A.

In FIG. 4B, during the integration phase (shown as $\Phi_{int}$ 401), the bottom source node $V_{S-}$ 404 is shown to increases while the upper one $V_{S+}$ 406 is shown to decrease. The result is a decrease in the overdrive voltage of both nMOS and pMOS input pairs (shown as 408a and 408b).

In FIG. 4C, $G_m \equiv g_{m,n}+g_{m,p}$ represent the overall transconductance of the pre-amplifier, where $g_{m,n}$ and $g_{m,p}$ are the transconductance of the nMOS and pMOS input pairs, respectively. As shown in FIG. 4C, at the beginning (411) of the dynamic integration phase $\Phi_{int}$ (401), the $G_m/I_D$ of the pre-amplifier of FIG. 4A can be twice that of one in the SA latch of FIG. 2A due to the current reuse. Throughout the integration phase $\Phi_{int}$ 401, the average $G_m/I_D$ of the pre-amplifier can be observed to increase (from 412 to 414) by over 2.5 times, which can lead to a large improvement in the power efficiency.

In addition, during the integration phase $\Phi_{int}$ 401, only the differential charge is integrated on the loading capacitors, and the common-mode voltage stays constant, which is 0.6 V with a 1.2-V supply. It prevents the full discharge of $C_X$ (422) and removes the bounded common-mode drop limitation for the pre-amplifier gain.

However, a caveat in this CMOS integration is the input common-mode and process corner sensitivity due to the lack of output common-mode feedback (CMFB). To ensure the CMOS integration functionality, the currents flowing through the pMOS and nMOS input pairs should be equal. In the nominal corner, as shown in FIG. 4B, the pMOS and nMOS transistors are well balanced, so that the current reuse is achieved, and the integration performs well.

Figure 5A:
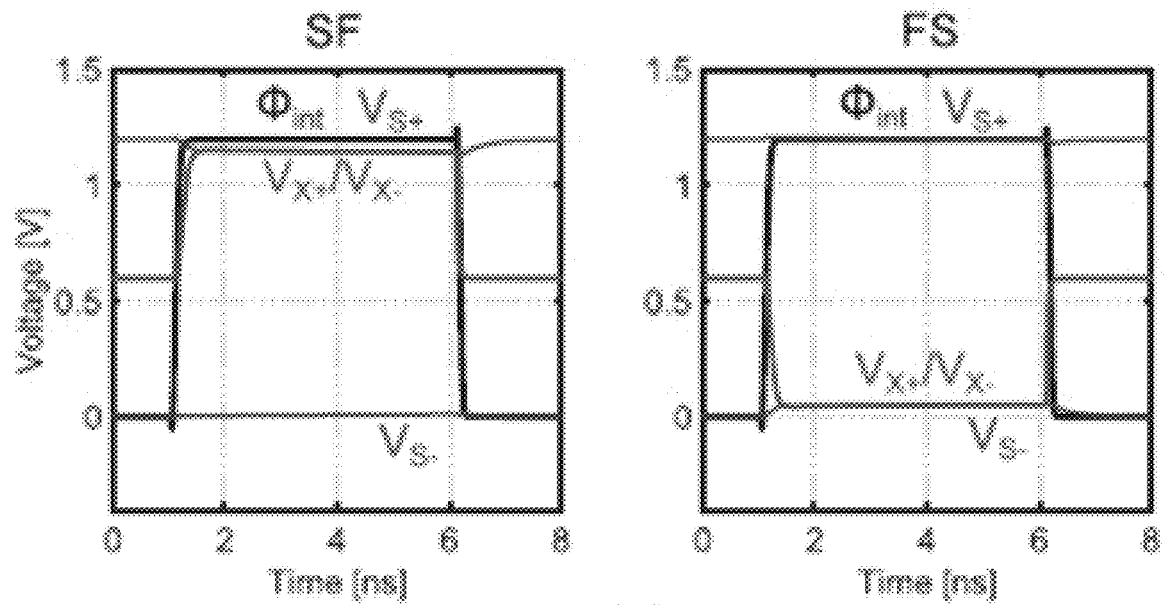
FIG. 5A shows pre-amplifier behavior simulation with process corner variation for the CMOS dynamic bias integration model of FIG. 4A in accordance with an illustrative embodiment.
Figure 5B:
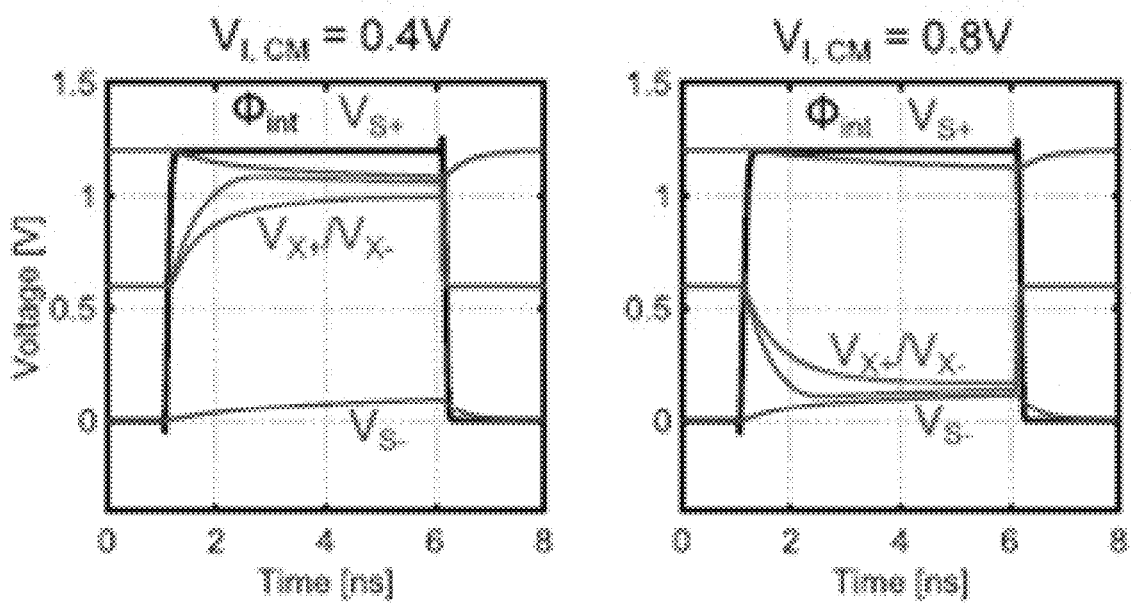
FIG. 5B shows pre-amplifier behavior simulation with input common-mode voltage variation for the CMOS dynamic bias integration model of FIG. 4A in accordance with an illustrative embodiment.

FIG. 5A shows pre-amplifier behavior simulation with process corner variation. FIG. 5B shows pre-amplifier behavior simulation with input common-mode voltage variation.

As shown in FIG. 5A, in the extreme corner like SF where nMOS is in the slow corner while pMOS is in the fast corner, the pMOS input transistor dominates the dynamic integration. The outputs are pulled to the supply, resulting in the failure of the integration. Similarly, as shown in FIG. 5B, in the FS corner, the nMOS side dominates the amplifier operation and pulls the output to the ground. The failure mechanism may be similar for the input common-mode voltage variations. With the lower input common-mode voltage, the pMOS input pair dominates the amplifier operation and vice versa.

Floating Inverter Amplifier With Floating Reservoir Capacitor. To provide a robust dynamic integrator against process corner and input common-mode variations, the device 100a is configured with floating inverter amplifier 102 in accordance with an illustrative embodiment.

Figure 6:
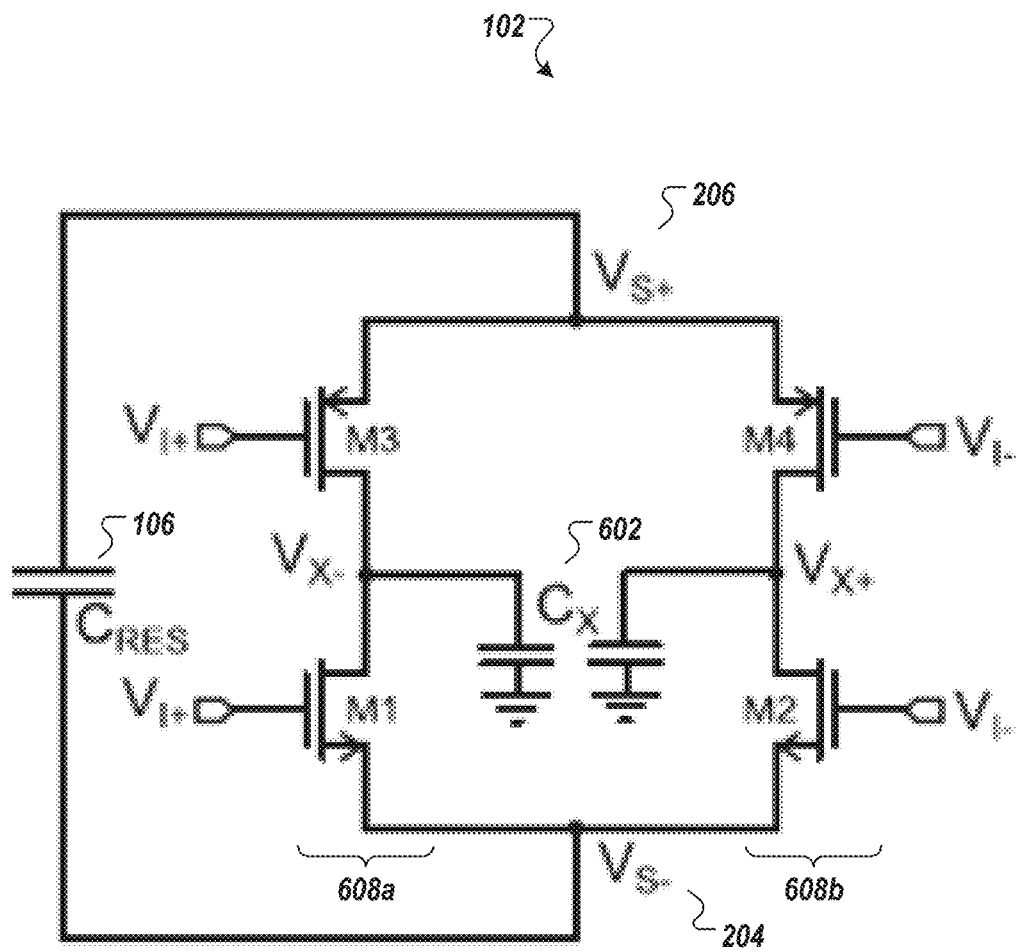
FIG. 6 shows a floating inverter amplifier configured with a floating reservoir capacitor in accordance with an illustrative embodiment.

FIG. 6 shows a floating inverter amplifier 102 configured with a floating reservoir capacitor 106 in accordance with an illustrative embodiment. In some embodiments, and as shown in FIG. 6, the two tail capacitors $C_{TAIL}$ are merged into single floating reservoir capacitor $C_{RES}$ 106. The floating reservoir capacitor 106 reduces, in some embodiments, the total capacitance size by 75% since floating reservoir capacitor $C_{RES}=C_{TAIL}/2$ while also providing an isolated voltage domain for the floating inverter amplifier.

FIG. 6 shows a common-mode equivalent of the floating inverter amplifier 102 of FIG. 6 in accordance with an illustrative embodiment. Because the input and output currents from the floating reservoir capacitor $C_{RES}$ must be equal ($I_{AMP+}=I_{AMP-}$), the common-mode current flowing into the integration capacitor $I_{X,CM}$ is forced to be 0, thus achieving a constant output common-mode voltage (without a dedicated CMFB circuit as described in [20.1], [21.1]).

Figure 7:
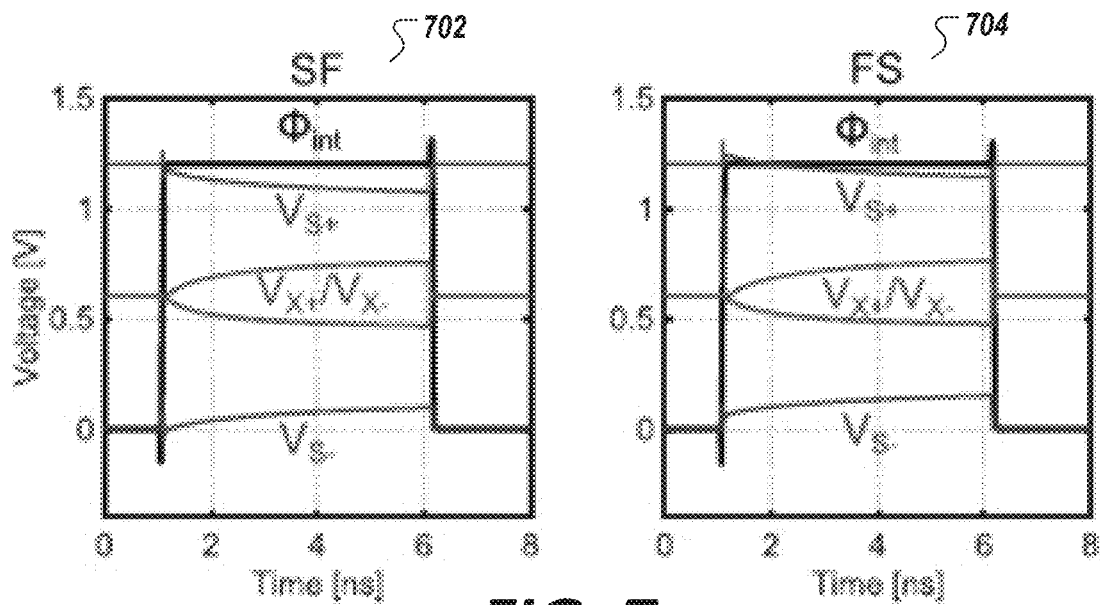
FIG. 7 show behavioral simulation of the floating inverter amplifier of FIG. 6 with different process corner variation in accordance with an illustrative embodiment.
Figure 8:
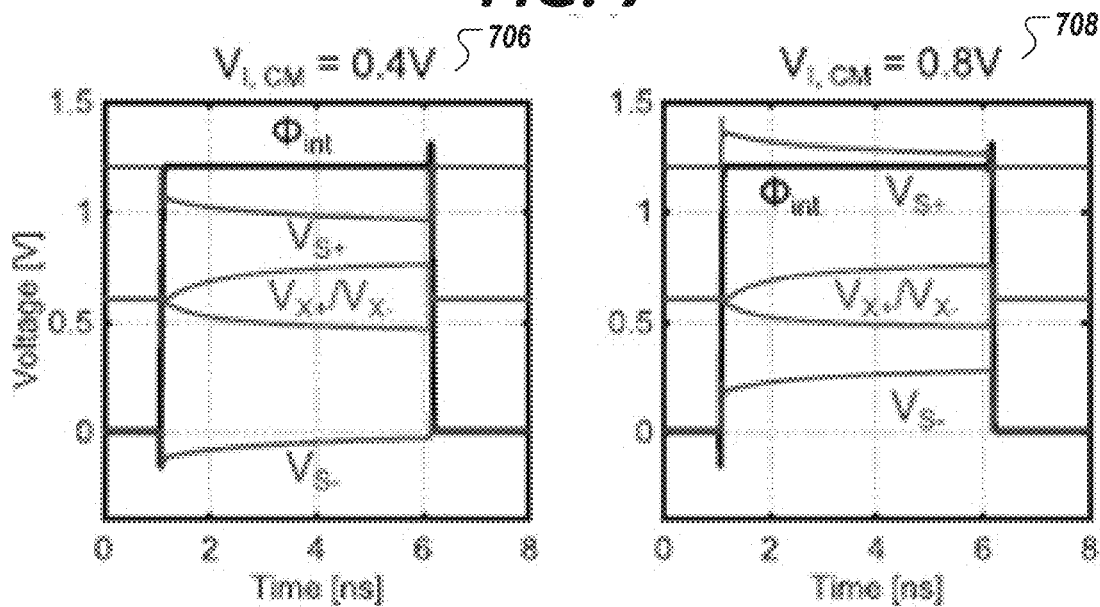
FIG. 8 show behavioral simulation of the floating inverter amplifier of FIG. 6 with input common-mode voltage variation in accordance with an illustrative embodiment.

FIG. 7 show behavioral simulation of the floating inverter amplifier 102 of FIG. 6 with different process corner variation in accordance with an illustrative embodiment. FIG. 8 show behavioral simulation of the floating inverter amplifier 102 of FIG. 6 with input common-mode voltage variation in accordance with an illustrative embodiment.

In FIG. 7, it can be observed that in the fast pMOS (SF) corner (702), with the reduced pMOS $V_{TH}$, both the initial $V_{S+}$ and $V_{S-}$ is reduced at the beginning of the amplification phase. This downshift of the isolated voltage domain results in a decreased $V_{GS}$ for pMOS and an increased $V_{GS}$ for nMOS, thus forcing the currents to be the same and maintaining the correct operation. In the fast nMOS (FS) corner (704), both $V_{S+}$ and $V_{S-}$ are observed to increase initially to maintain the correct integration.

As shown in FIG. 8, the same mechanism may also ensure input common-mode insensitivity. The transistor strengths are balanced with 600-mV input common-mode voltage. If the input common-mode is decreased to 400 mV (706), to ensure the input-output current for floating reservoir capacitor $C_{RES}$ to be the same, the isolated voltage domain is automatically downshifted by approximately 200 mV to balance the nMOS and pMOS overdrive voltages. Similarly, with the 800-mV input common-mode voltage (708), the isolated voltage domain will be shifted up by about 200 mV, and as a result, the overall FIA operation is unaffected.

Pre-Amplifier Gain Analysis. In this example, with $V_{DD}=1.2$ V and $V_{TH}\approx 0.55$ V in the typical corner, the input transistors M1-M4 are biased in the vicinity of the weak-inversion region when the comparison starts. With the decrease in $V_{GS}$ during the operation, the transistors are further pushed into the deep-subthreshold region. For simplicity of analysis, the input transistors can be assumed to always work in the weak-inversion region. The transconductance is expressed in Equation 5 [22.1], [23.1].

$$G_m(t) \approx 2 \cdot \frac{I_D(t)}{n \cdot U_T} = \frac{I_{AMP}(t)}{n \cdot U_T} \quad (5)$$

In Equation 5, $I_D(t)\approx(\frac{1}{2})I_{AMP}(t)$ is the instantaneous current of the transistor with a small differential input voltage, n is the weak-inversion slope factor, and $U_T=kT/q$ is the thermal voltage. By simplifying the output impedance of the input transistors, the differential pre-amplifier output voltage can be approximated as shown in Equation 6.

$$\Delta V_{X,DM}(t) = \frac{\int_0^t \Delta V_{I,DM} \cdot G_m(\tau) d\tau}{C_X} \quad (6)$$

$$\approx \frac{\Delta V_{I,DM} \int_0^t I_{AMP}(\tau) d\tau}{n \cdot U_T C_X}$$

In Equation 6, the tail current $I_{AMP}(t)$ can be calculated in Equation 7.

$$I_{AMP}(t) = \frac{I_{AMP}(0^+)}{1 + \frac{I_{AMP}(0^+)}{n \cdot U_T C_{TAIL}}} \quad (7)$$

In Equation 7, $I_{AMP}(0^+)$ is the tail current at the instant ($t=0^+$) when the comparator starts.

The source voltage $V_{S+}/V_{S-}$ change $\Delta V_S(t)$ can be shown in Equation 8.

$$\Delta V_S(t) = \frac{\int_0^t I_{AMP}(\tau) d\tau}{2 \cdot C_{RES}} \quad (8)$$

$$= n \cdot U_T \cdot \ln\left(1 + \frac{I_{AMP}(0^+)}{2 \cdot n \cdot U_T \cdot C_{RES}} t\right)$$

The derived logarithmic behavior thus matches with the simulation results in FIG. 4B. The integration gain is calculated per Equation 9.

$$A_V(T_{INT}) = \frac{\Delta V_{X,DM}(T_{INT})}{\Delta V_{I,DM}} \quad (9)$$

$$= \frac{2 \cdot C_{REST} \cdot \Delta V_X(T_{INT})}{n \cdot C_X \cdot U_T}$$

In this example, the floating reservoir capacitor $C_{RES}$ is assumed to be 2 pF and $C_X$ is approximated as 250 fF including the parasitics. With a 1-mV differential input $V_I$, $\Delta V_S(T_{INT})$ is approximately 125 mV according to the simulation. The calculated $A_V(T_{INT})$ is approximately 60. Due to the finite output impedance of the input transistors M1-M4, the simulated gain is around 30, which is still significantly higher than that of the SA latch (e.g., 108a).

Pre-Amplifier Noise Analysis. An analysis is performed to compare the pre-amplifier noise analysis of a conventional nMOS Integration pre-amplifier (e.g., of FIG. 2A), a dynamic-bias integration pre-amplifier (e.g., of FIG. 4A), and an example floating inverter amplifier 102 (e.g., of FIG. 6).

Conventional nMOS Integration Pre-Amplifier. In the analysis of the conventional nMOS integration pre-amplifier (e.g., of FIG. 2A), the derivations assume a weak inversion noise model. The general expression of the dynamic integrator's output noise can be described as a convolution of the power spectral density (PSD) $S_i(t)$ of the noise source and the magnitude squared impulse response from the noise source to the output voltage ($|h_n(t)|^2$) [12.1], [15.1], [18.1] as shown in Equation 10.

$$\sigma_o^2(t) = \tfrac{1}{2}\int_0^t S_i(t-\tau) \cdot |h_n(\tau)|^2 d\tau \tag{10}$$

In Equation 10, $S_i(t) = 4qI_D(t)$ is the input-referred single-sided white noise PSD contributing from M1 and M2 biased in the weak-inversion region [24.1]. Since $I_D(t)$ depends on the overdrive voltage ($V_{GS}-V_{TH}$), which is relatively constant during the dynamic integration, as shown in FIG. 3C, $S_i(t)$ can be assumed to be independent of time for simplicity. With an approximated impulse response $h_n(t) = (1/C_X) u(t)$, the mean square noise voltage at the pre-amplifier output can be derived as Equation 11.

$$\sigma_{o,SA}^2(t) = \frac{2nkT \cdot 2q \cdot \Delta V_{X,CM}(t)}{C_X} \cdot \frac{g_m}{I_D} \tag{11}$$

Recalling the integration gain from Equation (2), the input-referred noise of the conventional nMOS integration pre-amplifier at the end of the integration phase $T_{INT}$ can be expressed as Equation 12.

$$\sigma_{in,SA}^2(T_{INT}) = \frac{2nkT}{V_{THN} \cdot C_X} \cdot \frac{I_D}{g_m} \tag{12}$$

DB Integration Pre-Amplifier. In an analysis of the dynamic-bias integration pre-amplifier (e.g., of FIG. 4A), similarly, in the dynamic bias comparator [12.1], the input-referred noise $\sigma_{o,DB}^2(t)$ may be expressed as Equation 13.

$$\sigma_{o,DB}^2(t) = \frac{2q \cdot \Delta V_{X,CM}(t)}{C_p} \tag{13}$$

The differential-mode signal gain can be calculated per Equation 14.

$$A_V(T_{INT}) = \frac{\Delta V_{X,CM}(T_{INT})}{n \cdot kT/q} \tag{14}$$

The input-referred noise of the DB comparator at the end of the pre-amplification phase TINT may be derived in Equation 15.

$$\sigma_{o,DB}^2(T_{INT}) = \frac{2nkT}{C_p \cdot \Delta V_{X,CM}(T_{INT})} \cdot \frac{I_D}{g_m} \tag{15}$$

Exemplary floating inverter amplifier. In an analysis of the exemplary floating inverter amplifier 102, $S_i(t) = 8qI_D(t)$ contributed from the differential CMOS input-pairs M1-M4. The mean-square noise voltage generated across the floating inverter amplifier output may be derived per Equation 16.

$$\sigma_{o,FIA}^2(t) = \frac{4q \cdot C_{RES}}{C_X^2} \Delta V_S(t) \tag{16}$$

Given the voltage gain of the floating inverter amplifier in (Equation 9), the input-referred noise at the end of the pre-amplification time TINT can be calculated as Equation 17.

$$FoM_{SA} = \frac{2nkT}{C_{RES} \cdot \Delta V_S(T_{INT})} \cdot \frac{I_D}{G_m} \tag{17}$$

As can be seen, the input-referred noise of the exemplary floating inverter amplifier 102 can be inversely proportional to $G_m/I_D$. In addition, the larger floating reservoir capacitor $C_{RES}$ and $\Delta V_S(T_{INT})$ lead to a larger integration gain, which reduces the input-referred noise.

Energy Efficiency Analysis. Due to the fundamental tradeoff between energy consumption and thermal noise, a figure of merit (FoM) analysis may be performed to analyze the energy efficiency of a comparator. FoM is defined as the product of the comparator energy consumption and the input-referred noise power as shown in Equation 18.

$$FoM = \text{Energy} \cdot (\text{Noise Power}) \tag{18}$$

The lower the FoM, the higher the efficiency the comparator achieves. In a low-noise comparator, the pre-amplifier dominates the power consumption as well as noise contribution, and thus, the comparator's energy efficiency can be approximated by that of the pre-amplifier.

With the energy consumption per SA latch comparison as ($2 \cdot CX \cdot V_{DD}^2$) and input-referred noise derived in Equation 12, the FoM of the pre-amplifier in the classic SA latch (e.g., of FIG. 2A) can be expressed as Equation 19.

$$FoM_{SA} = \frac{4nkT \cdot V_{DD}^2}{V_{THN}} \cdot \frac{I_D}{g_m} \tag{19}$$

Similarly, the energy consumption for the dynamic bias pre-amplifier is ($2 \cdot C_X \cdot \Delta V_{X,CM} \cdot V_{DD}$), which results in an FoM shown in Equation 20.

$$FoM_{DB} = 4nkT \cdot V_{DD} \cdot \frac{I_D}{g_m} \tag{20}$$

The energy consumption of operation of the exemplary floating inverter amplifier 102 is ($2 \cdot C_{RES} \cdot \Delta V_S \cdot V_{DD}$), leading to the energy efficiency representation as shown in Equation 21.

$$FoM_{FIA} = 4nkT \cdot V_{DD} \cdot \frac{I_D}{G_m} \quad (21)$$

The energy efficiency improvement can be calculated as shown in Equation 22.

$$\frac{FoM_{SA}}{FoM_{FIA}} = \frac{V_{DD}}{V_{THN}} \cdot \frac{(G_m/I_D)_{FIA}}{(g_m/I_D)_{SA}} \quad (22)$$

Equation 22 shows two major advantages of the exemplary floating inverter amplifier 102 as compared with the classic SA latch (e.g., of FIG. 2A). In Equation 22, the coefficient ($V_{DD}/V_{THN}$) comes from the avoidance of unnecessary full discharge of the integration capacitors $C_X$. In addition, the energy efficiency is proportional to $G_m/I_D$ of the pre-amplifier, which is 2.5 times larger in the exemplary floating inverter amplifier 102 as shown in FIG. 4C. With $V_{DD}$=1.2 V and $V_{TH}$≈0.55 V in the typical corner, the theoretical analysis predicts a greater than five-time energy-efficiency improvement of a comparator implementing the exemplary floating inverter amplifier 102 over a conventional SA latch. Compared with the dynamic-bias pre-amplifier [12.1], the exemplary floating inverter amplifier 102 doubles the energy-efficiency by realizing current reuse. In addition, given the higher integration gain provided in exemplary floating inverter amplifier 102, which attenuates the input-referred noise of the following latch, the exemplary comparator configured with the exemplary floating inverter amplifier 102 can achieve an even larger overall energy efficiency improvement.

Parasitic Capacitance Impact. When the floating reservoir capacitor $C_{RES}$ is a perfect capacitor without any parasitic, the exemplary floating inverter amplifier 102 may operate in an isolated voltage domain, and thus ensures the zero-output common-mode change. In practice, with the parasitic capacitances, the output common-mode voltage can slightly change.

Figure 9:
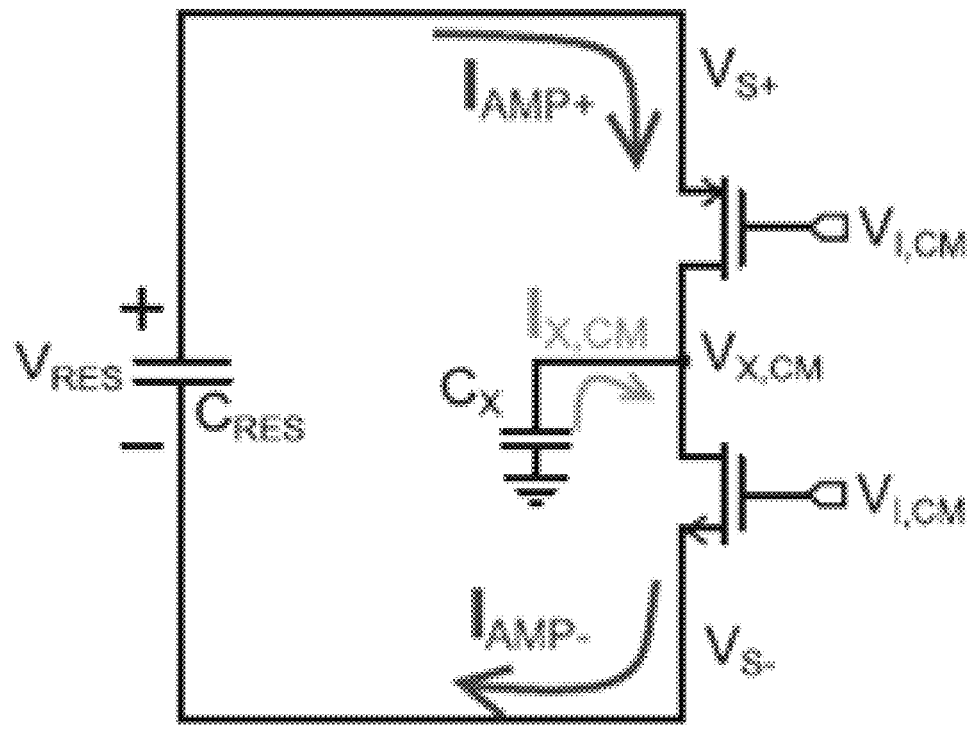
FIG. 9 shows a common-mode operation model of the floating inverter amplifier of FIG. 6 with parasitic capacitance in accordance with an illustrative embodiment.

To better analyze the parasitic effect, a model is shown in FIG. 9. FIG. 9 shows a common-mode operation model with parasitic capacitance.

In the example design, the floating reservoir capacitor $C_{RES}$ is implemented as a symmetric metal-on-metal (MoM) capacitor with equal parasitic capacitors on both plates.

The parasitic-induced common-mode rejection degradation can be derived through the current equation of Equation 23.

$$I_{P+}(t) - I_{P-}(t) = I_{X,CM}(t) \quad (23)$$

It can lead to a change in the output common-mode voltage as shown in Equation 24.

$$\Delta V_{X,CM}(t) = -(\Delta V_{S+}(t) + \Delta V_{S-}(t)) \cdot \frac{C_P}{C_X} \quad (24)$$

Since the $\Delta V_{S+}/\Delta V_{S-}$ is proportional to the input common-mode voltage shift $\Delta V_{I,CM}$, the output common-mode voltage change can be approximated as Equation 25.

$$\Delta V_{X,CM} \approx -2 \cdot \Delta V_{I,CM} \cdot \frac{C_P}{C_X} \quad (25)$$

With $C_P$=0, there is no output common-mode voltage change, as pointed out above. In this design example, the floating reservoir capacitor $C_{RES}$ is implemented as a 2-pF MoM capacitor with the bottom layer of metal 2. The post-layout-extracted parasitics including routing is 1.5%. With $C_X$≈250 fF including the integration-node parasitics, the $\Delta V_{X,CM}$ is expected to be around ¼ of the input common-mode voltage change. Comparing with the simple CMOS dynamic-bias integration pre-amplifier, where the common-mode gain is around 20, the exemplary floating inverter amplifier 102 can provide over 30-dB common-mode rejection ratio improvement.

Figure 10:
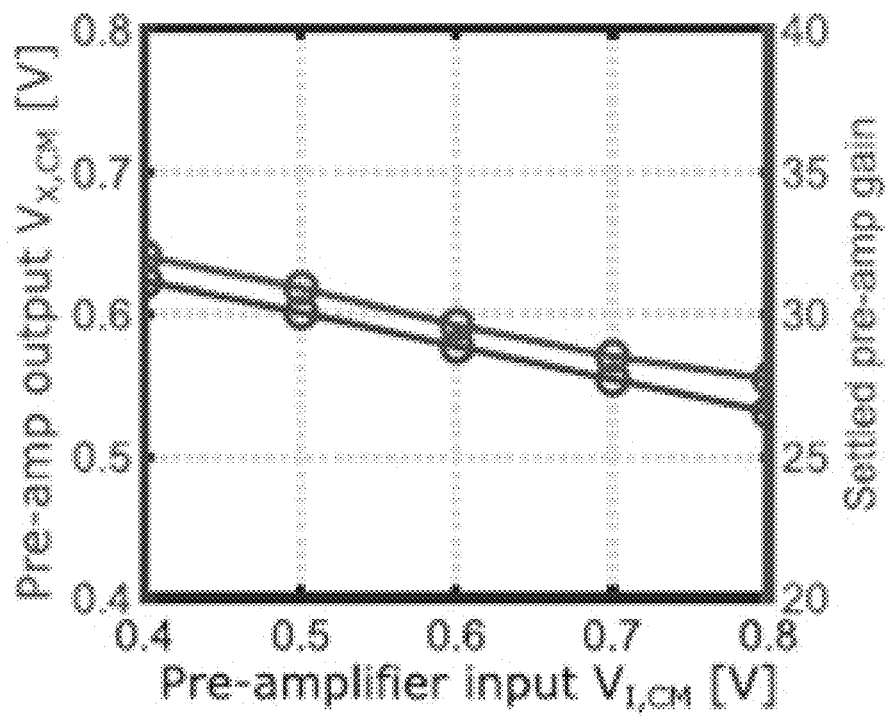
FIG. 10 shows simulated pre-amplifier output common-mode voltage and gain of the floating inverter amplifier of FIG. 6 as a function of the input common-mode voltage in accordance with an illustrative embodiment.

To verify the output common-mode behavior with the parasitic impact, a post-layout simulation is shown in FIG. 10. FIG. 10 shows simulated pre-amplifier output common-mode voltage and gain as a function of the input common-mode voltage. With the input common-mode voltage varying from 0.4 to 0.8 V, the output common-mode has a variation below 100 mV, and the variation in the settled gain of the exemplary floating inverter amplifier 102 is within 15%, which only has a limited impact on the comparator performance. This is confirmed by measurements.

EXAMPLE #1—Energy-Efficient Comparator Device with Exemplary Floating Inverter Amplifier As shown in FIG. 1, the exemplary comparator 100a includes the floating inverter amplifier 102 and a SA latch 108a. During the reset phase (clk=0), the floating reservoir capacitor $C_{RES}$ is pre-charged to $V_{DD}$/GND, and the floating inverter amplifier output $V_{X+}/V_{X-}$ is reset to $V_{CM}=V_{DD}/2$. When the comparison starts (Φint=1), the exemplary floating inverter amplifier 102 performs dynamic integration. Once the SA latch resolves (Φint=0), the exemplary floating inverter amplifier 102 may be disabled to prevent the further discharge of the floating reservoir capacitor $C_{RES}$ to save energy.

Figure 11:
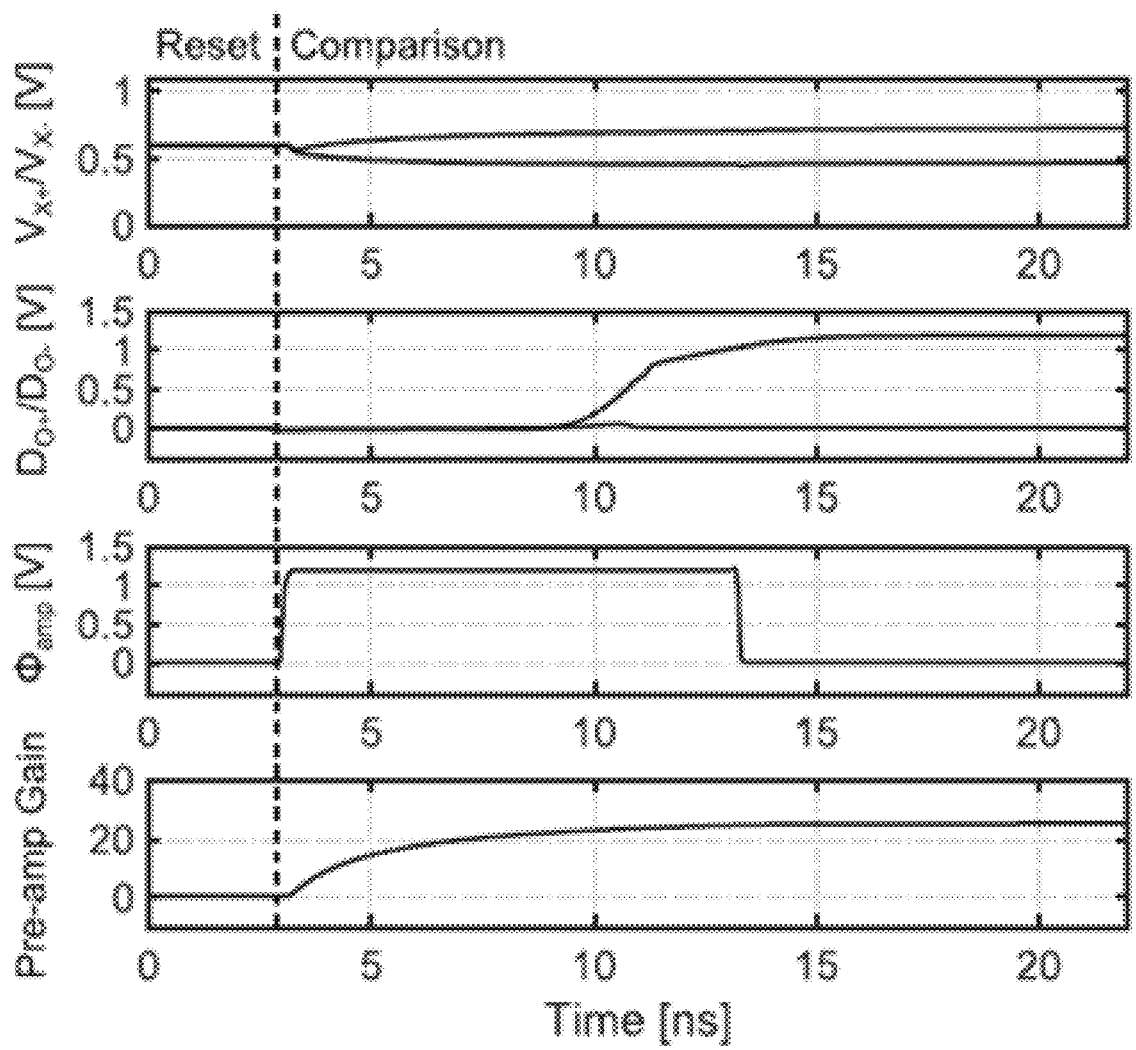
FIG. 11 shows an example operation of the exemplary comparator configured with the floating inverter amplifier of FIG. 6 in accordance with an illustrative embodiment.

Method of Operation. FIG. 11 shows an example operation of the exemplary comparator 100a configured with the floating inverter amplifier 102 in accordance with an illustrative embodiment. Unlike the SA latch example (of FIG. 2A), as shown in FIG. 11, the integration nodes $V_{X+}/V_{X-}$ are only partially discharged, which saves considerable energy. In addition, it also removes the bounded common-mode limitation and can provide a sufficiently large gain. With a floating inverter amplifier gain greater than 25, the noise contributed from the following latch is negligible.

The $V_{CM}$ only needs to replenish the charge loss caused by the output common-mode shift on the integration nodes during the reset phase. As indicated in (Equation 25), with the nominal input common-mode voltage input, there is beneficially no net charge consumption from the $V_{CM}$. And, even with 200 mV in the input common-mode voltage shift, only a 50-mV $\Delta V_{X,CM}$ is expected. In this example, the requirement of the $V_{CM}$ buffer is relaxed. In a prototype design later discussed, $V_{CM}$ is provided by an off-chip regulator as an example implementation.

To select a suitable value of the floating reservoir capacitor $C_{RES}$, several factors may be considered. Larger floating reservoir capacitor $C_{RES}$ leads to faster pre-amplification, which increases the comparator speed. Although the theoretical energy efficiency (FoM) is independent of the floating reservoir capacitor $C_{RES}$, as indicated by Equation 21), in practice, they may be correlated. To this end, if floating reservoir capacitor $C_{RES}$ is too small, the pre-amplification gain may not be sufficiently large to suppress the latch stage noise, causing the degradation of comparator precision.

While with larger floating reservoir capacitor $C_{RES}$, the dynamic bias effect may be reduced, which diminishes the $g_m/I_D$ boost, the larger floating reservoir capacitor $C_{RES}$ can also have area/size implementation penalty. In one example having tradeoffs among energy efficiency, comparison speed, and area consumption, a 2-pF floating reservoir capacitor $C_{RES}$ for example may be used. Compared with a conventional SA latch having similar noise performance, the exemplary comparator configured with floating reservoir capacitor may have an additional area overhead of about 30%. Table 1 shows one example sizes of components in an example prototype design.

TABLE 1

Device Sizes

| Transistor | Width [µm] | Length [µm] |
|---|---|---|
| $M_1$ | 44 | 0.18 |
| $M_2$ | 44 | 0.18 |
| $M_3$ | 22 | 0.18 |
| $M_4$ | 22 | 0.18 |

| Capacitor | Size [pF] |
|---|---|
| $C_X$* | 0.25 |
| $C_{RES}$ | 2 |

*$C_X$ includes the integration node parasitic

When the target application is mostly concerned with power efficiency instead of speed, the current sources in the comparators can be scaled to achieve a low $I_D$ while providing maximum $G_m/I_D$, at the cost of longer integration and regeneration times. The opposite can be performed to emphasize speed.

Figure 12:
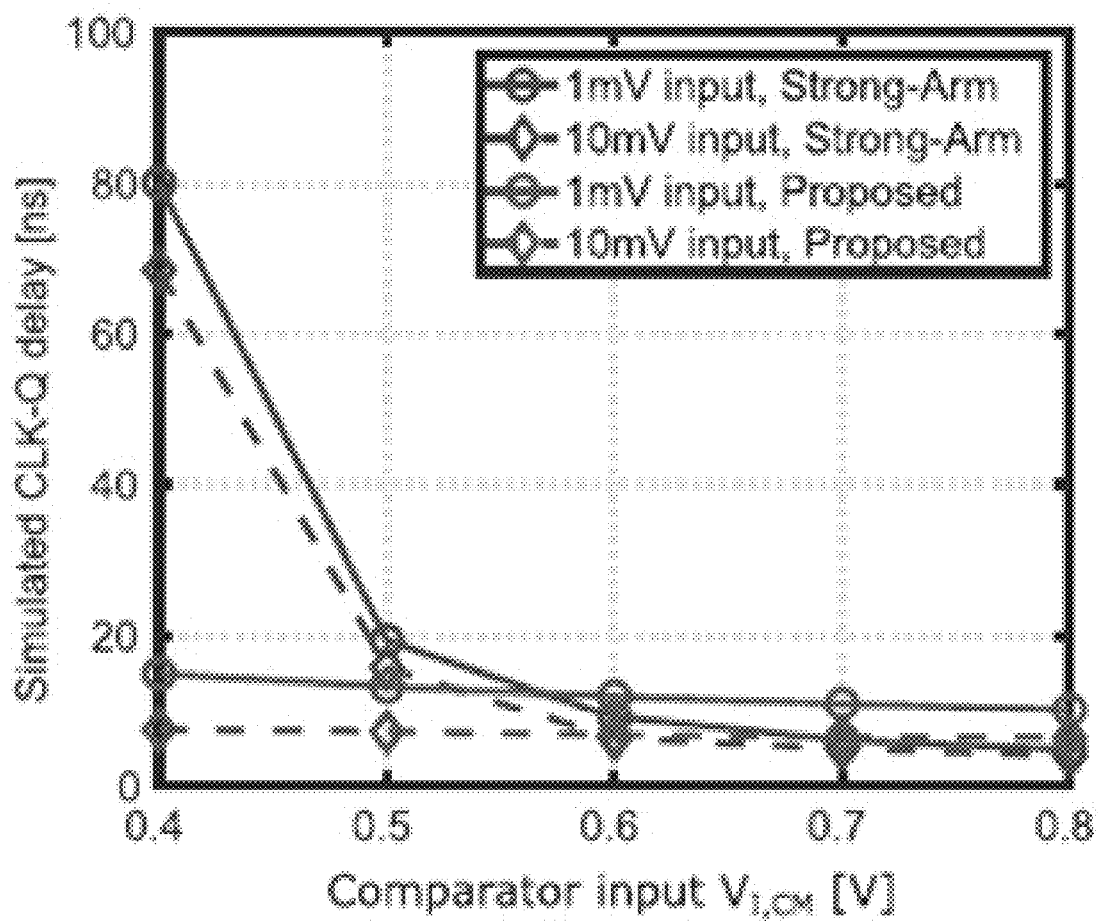
FIG. 12 shows simulated CLK-Q delay of the floating inverter amplifier of FIG. 6 versus input common-mode voltage in accordance with an illustrative embodiment.

The simulated CLK-Q delay versus the input common-mode voltage variation is shown in FIG. 12. FIG. 12 shows simulated CLK-Q delay versus input common-mode voltage in accordance with an illustrative embodiment.

As shown in FIG. 12, with a low-input common-mode, the current in the SA latch, $I_D$, reduces greatly, thus significantly increasing the delay in the SA latch. For instance, with the input common-mode voltage decreases from 0.6 to 0.4 V, the simulated CLK-Q delay in the SA latch is increased by ten times. In contrast, the exemplary comparator configured with the floating inverter amplifier 102 has only a small increase of 15%, which again illustrates its insensitivity to the input common-mode variation.

The instant comparator design is provided merely as one example and one instance a device configured with the floating inverter amplifier 102. As noted above, the floating inverter amplifier 102 may be similarly implemented in an amplifier device or comparator device to pre-amplify the input signal prior to subsequent processing. In other examples, the floating inverter amplifier 102 may be implemented in a loop filter as a switched-capacitor core amplifier or integrator of a data converter device, e.g., a Delta-Sigma modulator, pipeline ADC, capacitance-to-digital converter, or the like. In other examples, the floating inverter amplifier 102 may be implemented in physical data conversion processes, such as, but not limited to, capacitance-to-digital converter, temperature sensors, and various other physical-sensing sensors. In other examples, the floating inverter amplifier may be used as a switch-capacitor based amplifier for analog devices such as DC-DC converter, low dropout regulator, etc.

Figure 13:
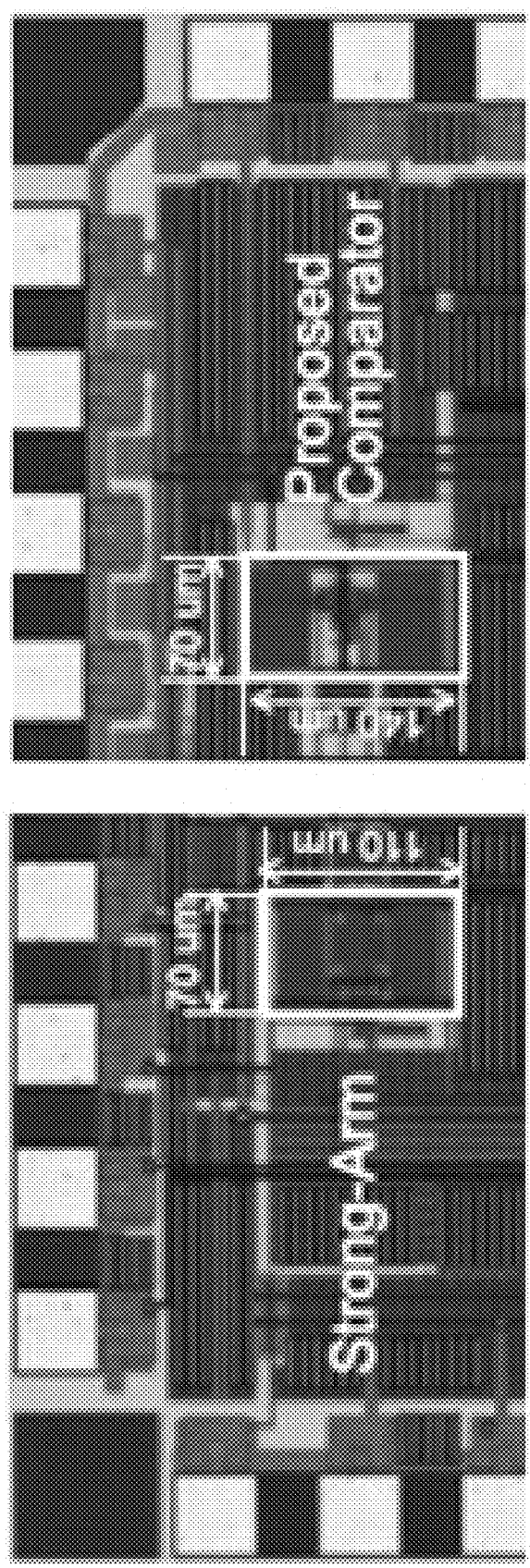
FIG. 13 shows a die micrograph of a SA latch coupled to an implementation of the exemplary comparator configured with the floating inverter amplifier of FIG. 6 in accordance with an illustrative embodiment.

Experimental Results and Example. A prototype has been fabricated in 180-nm CMOS. FIG. 13 shows a die micrograph of a SA latch coupled to an implementation of the exemplary comparator 100a. For a comparison, a stand-alone SA latch with two-time nMOS input pair size was also fabricated, which shares the same initial $G_m$ as the implemented floating inverter amplifier.

Figure 14:
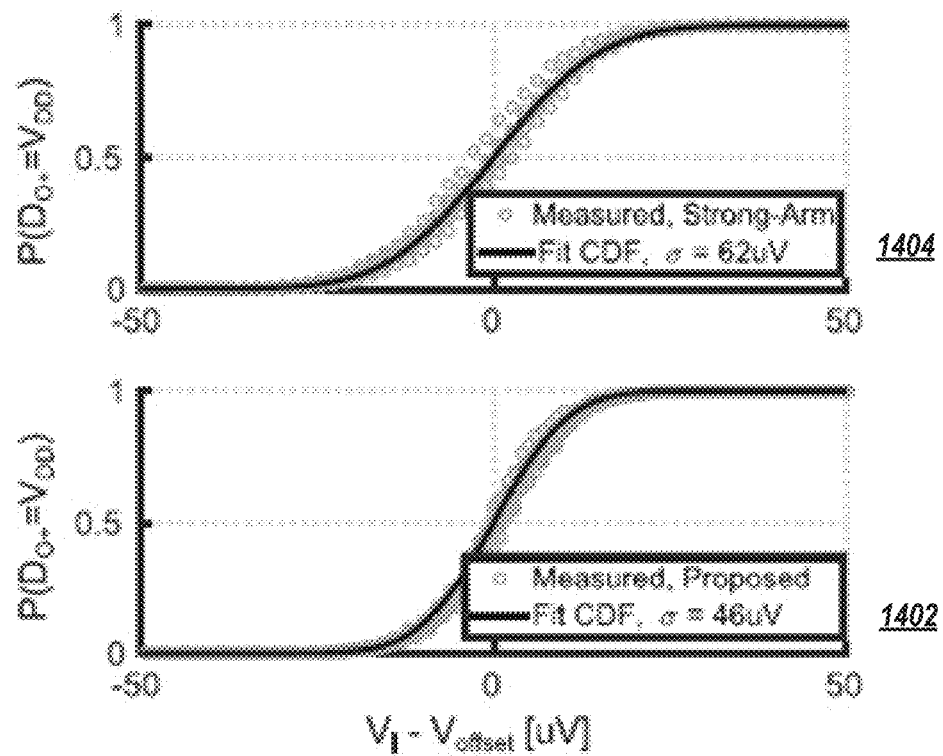
FIG. 14 shows measured cumulative probability density distribution and a fit to Gaussian distribution for an implementation of the exemplary comparator configured with the floating inverter amplifier of FIG. 6 as compared to a conventional SA latch in accordance with an illustrative embodiment.

To measure the input-referred noise of both comparators, a dc input voltage $V_I$ was applied. By firing the comparator for large number of times (e.g., 105), the output probability was calculated. FIG. 14 shows measured cumulative probability density distribution and a fit to Gaussian distribution for an implementation of the exemplary comparator 100a (shown as 1402) and a SA latch (shown as 1404) in accordance with an illustrative embodiment. Each circuit was coupled to a 1.2-V supply and 0.6-V input common-mode voltage. This process was repeated for small increments (5 µV) in VI to measure the accurate cumulative distribution functions (CDFs). Fitting the measurement results to a Gaussian CDF, the comparator performance were extracted. The measured rms input-referred noises are 62 µV for the SA latch and 46 µV for the exemplary comparator (e.g., of FIG. 1) configured with the exemplary floating inverter amplifier 102.

Figure 15:
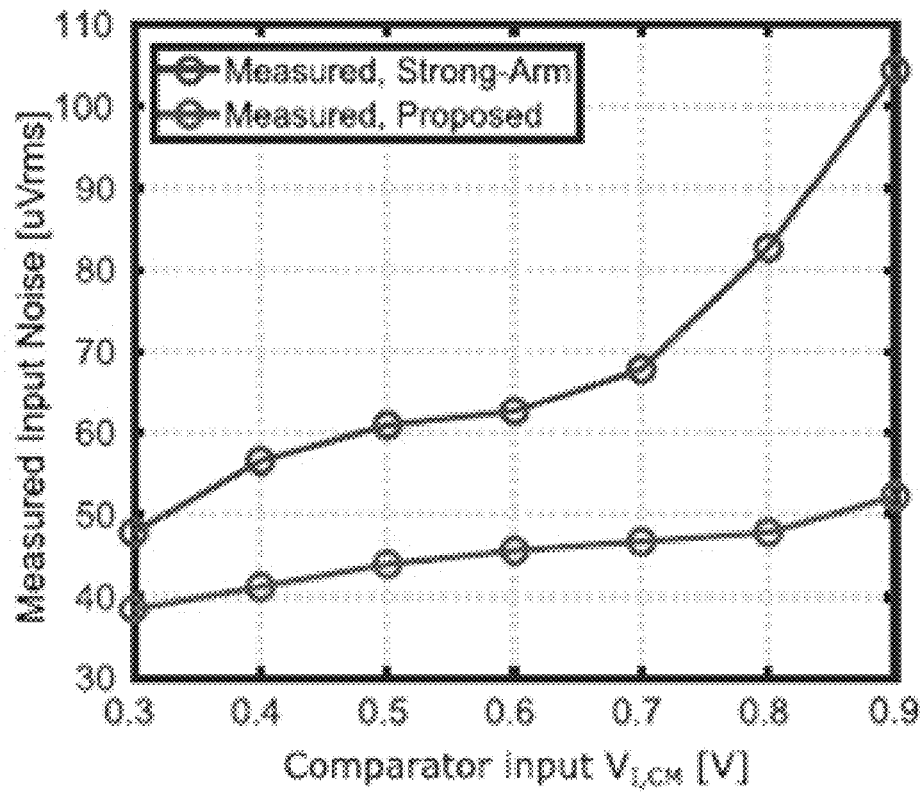
FIG. 15 shows measured input-referred noise versus input common-mode voltage for a conventional SA latch and for the exemplary floating inverter amplifier of FIG. 6 in accordance with an illustrative embodiment.

FIG. 15 shows measured input-referred noise versus input common-mode voltage for the SA latch and the exemplary floating inverter amplifier 102 in accordance with an illustrative embodiment.

In FIG. 15, for the SA latch, with higher input $V_{CM}$, larger ($V_{GS}$-$V_{TH}$) resulted and lower gm/ID were observed for the nMOS input pair. Because the input-referred noise is inversely proportional to the $g_m/I_D$, as shown in (Equation 12), the noise was observed to be significantly larger with higher input common-mode voltage.

Figure 16A:
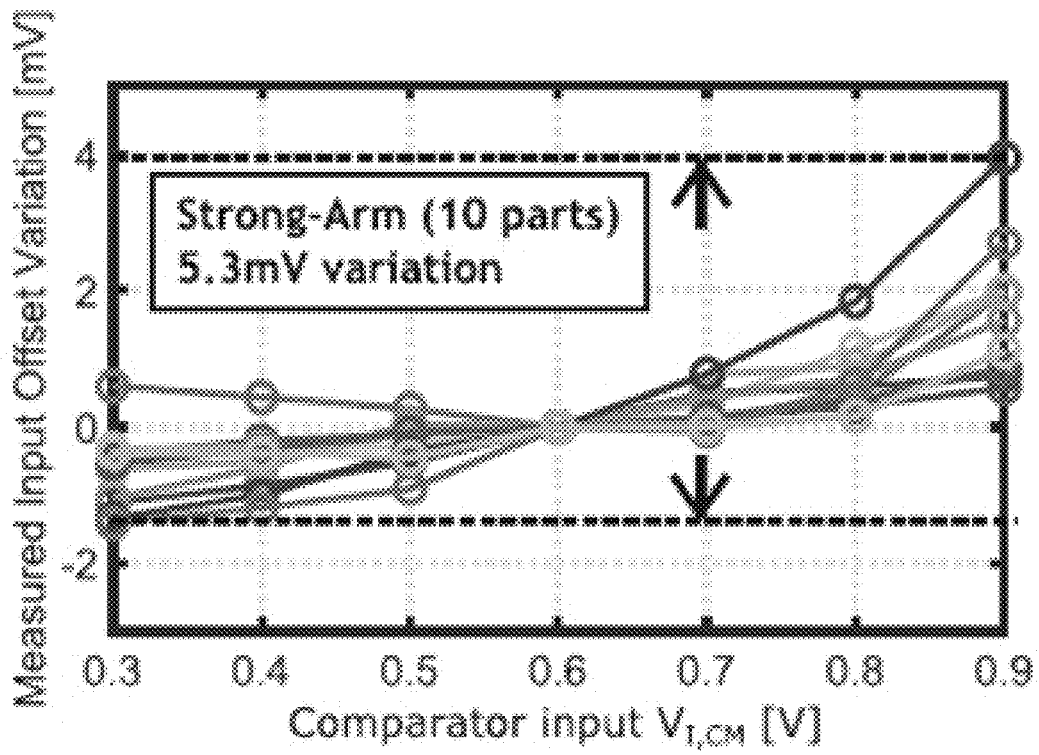
FIGS. 16A and 16B shows an input-referred offset measurement variation for an example SA latch and the exemplary floating inverter amplifier of FIG. 6, respectively, in accordance with an illustrative embodiment.
Figure 16B:
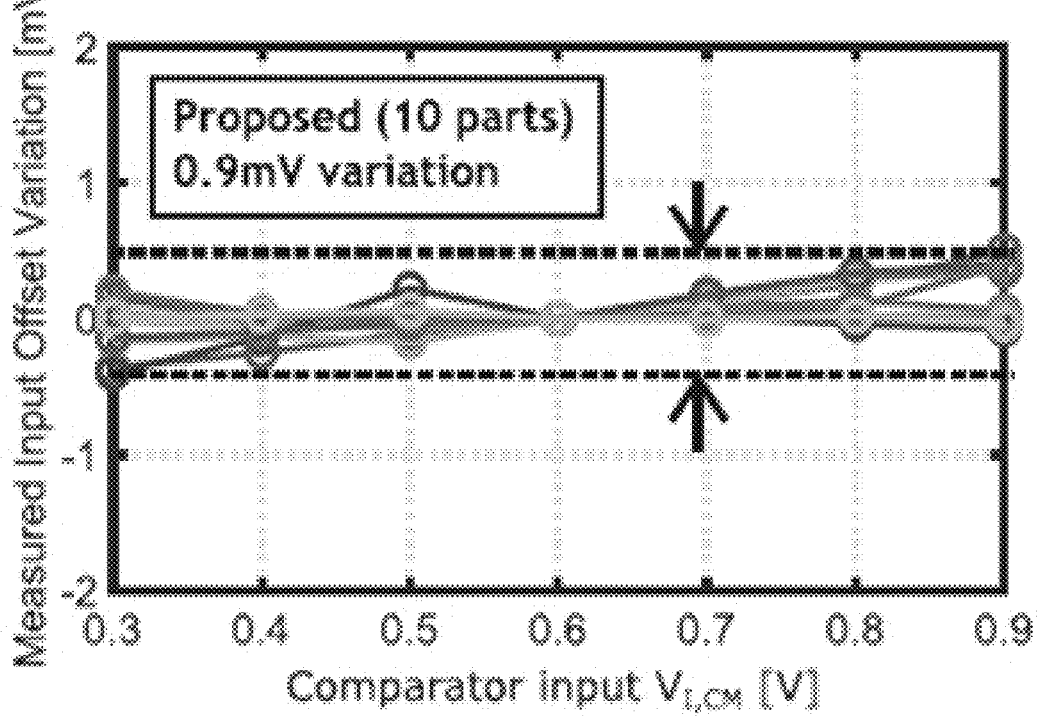

By contrast, the input common-mode-insensitive operation of the exemplary floating inverter amplifier 102 was observed to reduce the noise variation by four times. FIGS. 16A and 16B show an input-referred offset measurement variation for an example SA latch and the exemplary floating inverter amplifier of FIG. 6, respectively, in accordance with an illustrative embodiment. An input-referred offset measurement versus the input common-mode voltage was performed, where the comparator inputs were supplied by two external DACs. By fine-tuning the DAC outputs until the comparator achieves 50% output probability, the aggregated system offset including the DACs and comparators was calibrated. In this measurement, all parts were calibrated at 0.6-V input common-mode voltage. The SA latch exhibited a 5.3-mV variation with ten parts measured, while the exemplary floating inverter amplifier 102 was observed to reduce the variation by greater than five times to 0.9 mV.

Figure 17:
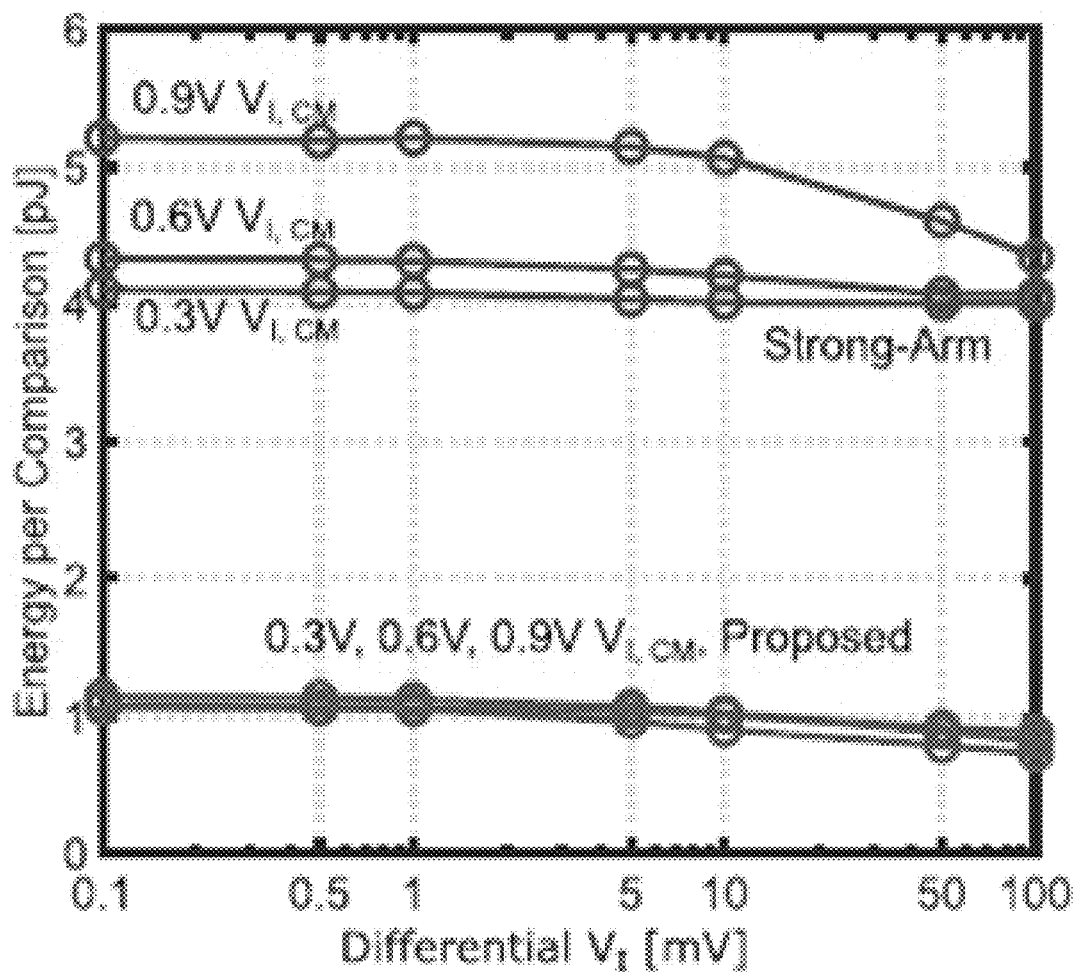
FIG. 17 shows the energy consumption versus input differential voltage for the exemplary floating inverter amplifier of FIG. 6 in accordance with an illustrative embodiment.

FIG. 17 shows the energy consumption versus input differential voltage, highlighting the reduction in overall energy consumption for various input common-mode voltages. The energy consumption per comparison for the exemplary comparator (e.g., of FIG. 1) is approximately 0.98 pJ per comparison, whereas it is 4.1 pJ per comparison for the SA latch with 1-mV differential input at VCM=0.6 V. With the increase in the input common-mode voltage, the current $I_D$ in the SA latch is raised, resulting in the increased energy consumption. Because of the input common-mode-insensitive operation, the exemplary comparator (e.g., of FIG. 1) consistently achieves greater than four-time energy reduction.

To achieve the ten-time smaller noise performance than prior design in [11.1] and [12.1], the device sizes are larger in the exemplary comparator, resulting in larger area consumption. Compared with a SA latch that achieves similar noise performance, the exemplary comparator 100a has a 30% area overhead due mainly to the floating reservoir capacitor $C_{RES}$. All these comparators are operated under 1.2-V supply voltage, which forms fair comparisons of energy efficiency. The exemplary comparator 100a with floating inverter amplifier can achieve greater than seven-time improvement over discussion the classic SA latch and greater than 2.5-time improvement over the second best [12.1]. To the best of our knowledge, it is the inventor's understanding that this design represent the most energy-efficient comparator reported to date. In addition, the comparator has a reduced sensitivity to input common-mode voltage and process corner variations.

Discussion. Comparators are used to bridge the physical and digital worlds, as they perform the core operation of an analog-to-digital converter (ADC). In various applications, such as ubiquitous sensing and biomedical implants, a low-power and low-noise ADC is critical. As the technology scales down, the ADC power efficiency is significantly improved. Successive-approximation-register (SAR) ADCs especially benefit from its mostly digital architecture and achieve extremely low energy consumption [1.1]-[4.1]. The comparator becomes one of the major power contributors since it is bounded by the thermal noise requirement. In addition to the power efficiency, another critical requirement raised for the comparator is input common-mode insensitivity. In the sensor-node applications, environmental interferences may cause a common-mode disturbance. In addition, advanced switching schemes in the SAR ADCs [5.1]-[7.1] also cause common-mode voltage variation. The performance of conventional dynamic comparators, including noise, offset, and speed, shows strong dependence on the input common-mode voltage, and thus, it limits the conversion resolution and degrades the system accuracy.

A comparator typically includes a pre-amplifier followed by a latch. To save energy, dynamic comparators replace the conventional static pre-amplifiers by the dynamic integrator-based ones, which remove the static current.

The strong-arm (SA) latch [8.1], [9.1], as shown in FIG. 2, is the first in this class of comparators and has been widely used over the years. With the embedded dynamic pre-amplifier followed by a regenerative latch, the SA latch provides good energy efficiency and achieves fast comparison speed, thus suiting well for the energy-constraint applications. In a low-noise design, large integration capacitors $C_X$ are required for good resolution. The complete discharge of CX consumes the fixed energy ($2 C_X V^2_{DD}$) and limits the comparator energy efficiency [10.1], [11.1].

Emerging efforts have been made to improve the power efficiency of dynamic comparators. To prevent the full discharge of the integration capacitors, dynamically biased (DB) integration is proposed in [12.1]. It has been reported that by providing a degeneration capacitor, VGS of the input pair can be decreased, and eventually the input pair is cut off. It can prevent the full discharging the load and boosts the $g_m/I_D$ during the integration phase, thus resulting in a three-time energy efficiency improvement.

A cascade-input comparator was reported in [1.1]. It boosts integration gain by stacking the input pairs, and thus improved the energy efficiency by two times. Another way to improve the energy efficiency was explored in [13.1], where the bi-directional integration realizes current reuse. However, the extra circuit cost limits the efficiency improvement to 1.5 times compared with a SA latch. A gain-boosted comparator was proposed in [4.1], where its dynamic integrator includes a CMOS input pair followed by a pMOS common-gate stage. In addition to current reuse, it further improves energy efficiency by increasing the dynamic integrator gain. Yet, the efficiency is still limited by extra logic circuits. In addition to relatively limited efficiency boost, conventional dynamic comparators suffer from input common-mode voltage sensitivity. Since the tail transistor (Mb) works in the linear region, the integration current is heavily dependent on the input common-mode voltage, and thus, it results in variations in the comparator performance (e.g., offset, noise, and speed).

Further discussion about the exemplary floating inverter amplifier 102 and exemplary comparator 100a are provided Appendix A and B, which are each attached herein and incorporated by reference in its entirety.

EXAMPLE #2—Energy Efficient Data Converter with Exemplary Floating Inverter Amplifier Noise-Shaping Successive-Approximation-Register Analog-to-Digital Converter with Floating Inverter Amplifier In another aspect, a noise-shaping successive-approximation-register analog-to-digital converter (NS-SAR ADC) 100b (e.g., a second-order NS-SAR ADC) is disclosed with a closed-loop dynamic amplifier 1802 comprising a switched-capacitor core amplifier 102. The dynamic amplifier 1802 combines the merits of the dynamic circuit with the closed-loop operation to realize robustness, high accuracy, and high energy-efficiency simultaneously. By embedding the dynamic amplifier 1802 in a loop filter, a high-performance, fully-dynamic NS-SAR ADC may be implemented without any need for gain calibration. The exemplary dynamic amplifier 1802 can be used not only in the NS-SAR ADCs, but also for other circuits that demand accurate and low-power amplifiers.

Figure 18:
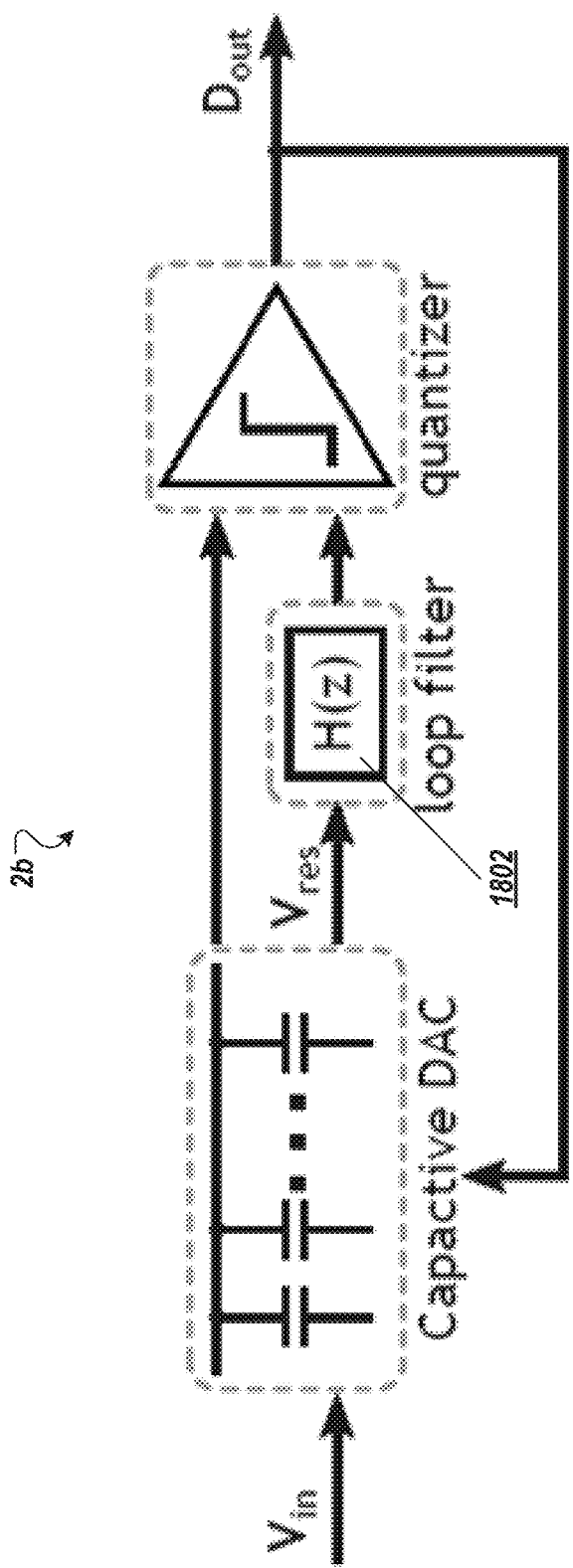
FIG. 18 block diagram of an exemplary noise-shaping successive-approximation-register ADC that can be configured with a closed-loop dynamic amplifier comprising a switched-capacitor core amplifier (having the same topology as the floating inverter amplifier) in accordance with an illustrative embodiment.

FIG. 18 block diagram of NS-SAR ADC 100b that can be configured with a closed-loop dynamic amplifier 1802 comprising a floating inverter amplifier 102 configured as a switched-capacitor core amplifier 102a (shown as part of a loop filter 1804) in accordance with an illustrative embodiment.

As shown in FIG. 18, in contrast to a conventional SAR ADC, a loop filter 1804 is placed in front of the comparator to process the conversion residue $V_{res}$. Similar to that in ADC, the loop filter 1804 maintains the residue state and subtracts it from the next conversion cycle to realize noise shaping. As the core functional block in the NS-SAR ADC, the loop filter 1804 may defines the overall performance or a substantial portion of it.

To realize a high-resolution and energy-efficient NS-SAR ADC, diverse architectures have been explored in the loop filter design. References [4.2]-[6.2] realize noise shaping by adopting the conventional closed-loop OTA-based loop filter.

With large DC gain, NS-SAR ADC can achieve sharp noise transfer function (NTF), which ensures high resolution. Since the closed-loop gain is defined by the capacitor ratios, it is robust against process, voltage, and temperature (PVT) variations. However, it can be power hungry due to the static current. Fully passive switched-capacitor (SC) filter is employed in [7.2]-[13.2]. It does not consume any static current, which maintains SAR ADC's fully dynamic operation and can be easily duty-cycled. Despite its low power consumption, the lossy filter may result in a less aggressive NTF, leading to the ADC resolution degradation. In addition, because the gain of a passive filter is low, the suppression to the comparator noise may be weak.

To better balance the noise performance and the power consumption, an open-loop dynamic amplifier has been placed before the passive filter to reduce the noise and power

[14.2]-[16.2].However, its gain varied with PVT. To ensure the ADC stability, the NTF needed to be mild, which limits the NS performance [14.2], [15.2]; or the background calibration has to be used, which can increase the design complexity and require a large number of samples to converge [16.2]. In addition, without complete settling, the gain of an open-loop dynamic amplifier is sensitive to timing error, e.g., clock jitter.

As discussed herein, a second-order NS-SAR ADC is provided that is configured to perform residue integration using a closed-loop dynamic amplifier (e.g., 1802). This amplifier combines the merits of dynamic circuit and closed-loop operation. Because the closed-loop dynamic amplifier 1802 employs a dynamic amplifier instead of an OTA, it may be configured with lower noise and eliminate static current. Moreover, because the closed-loop dynamic amplifier 1802 is configured to operate in closed-loop, the transfer function can be established capacitor ratios, and thus, can be made highly accurate. In addition, it can be made insensitive to PVT variations, free from gain calibration, immune to clock jitter, and can realize aggressive NTF.

Conventional dynamic amplifiers that have low open-loop gain and varying output common-mode voltage may not be suitable for closed-loop operation. The exemplary dynamic amplifier 1802, in some embodiments, includes a two-stage dynamic amplifier that is configured sufficient gain and intrinsically stabilized output common-mode voltage. In addition, the exemplary dynamic amplifier 1802 includes a dynamically-scaled bandwidth which can be used to provide a better trade-off among speed, power, and noise. A PVT-robust second-order NS-SAR ADC equipped with the exemplary had been fabricated in 40-nm CMOS. It was observed to realize an 83.8-dB SNDR over 625-kHz BW, leading to 181.5-dB Schreier FoM.

As part of the loop integrator, the exemplary dynamic amplifier 1802 should have sufficient gain, low power consumption, and PVT-robust performance to realize a high-resolution and energy-efficient NS-SAR ADC. The exemplary dynamic amplifier 1802 is thus configured as a low-power dynamic amplifier for use in a robust closed-loop operation.

Figure 19A:
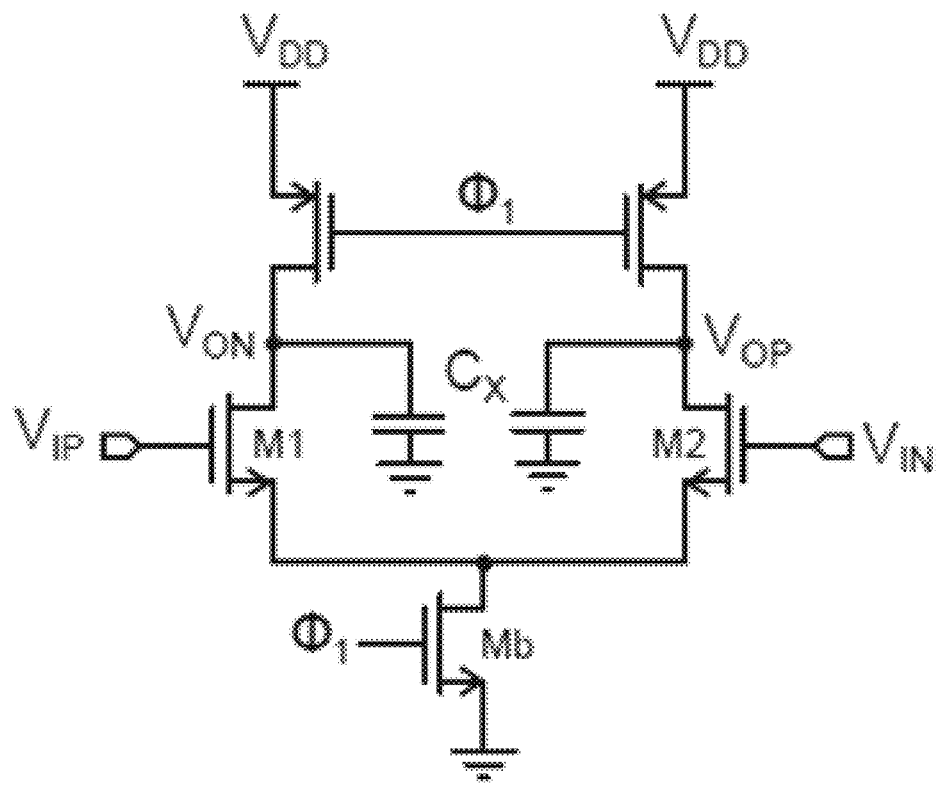
FIG. 19A shows a schematic of a conventional dynamic amplifier.
Figure 19B:
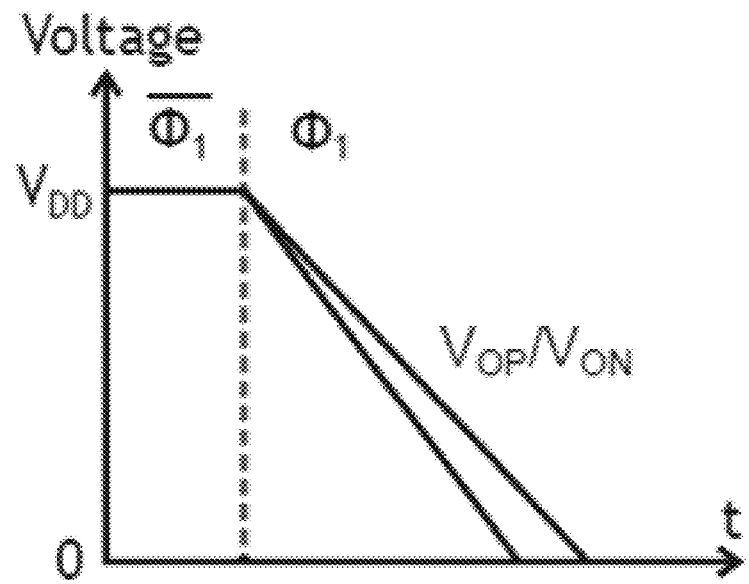
FIG. 19B shows a corresponding set of operation for the dynamic amplifier of FIG. 19A.

FIG. 19A shows a schematic of a conventional dynamic amplifier [19.2],[20.2]. FIG. 19B shows a corresponding set of operation for the dynamic amplifier of FIG. 19A.

As shown in FIG. 19B, the operation of the dynamic amplifier can be divided into reset and amplification phases. During the reset phase ($\Phi=0$, also referred to herein as $\Phi_0$ or $\overline{\Phi_1}$), the output nodes $V_{OP}=V_{ON}$ are pre-charged to $V_{DD}$. Once the amplification phase starts ($\Phi=1$, also referred to herein as $\Phi_1$), the outputs are discharged at different speeds proportional to input voltages. As a result, the dynamic amplification can be realized through this discharge, which is fully-dynamic and highly energy-efficient. However, conventional dynamic amplifiers suffer from a few limitations. First, the realized gain is usually low. To this end, once the output drops to ground, the amplification stops. The amplification gain $A_{amp}$ also often depends on the $g_m=I_D$ of the input transistor as well as the output common-mode drop, which is often $V_{DD}$ in most scenarios [21.2] as shown in Equation 26.

$$A_{amp} \leq \frac{g_m}{I_D} \cdot V_{DD} \tag{26}$$

In addition, in practice, the practical gain is often limited to 5 as reported in [22.2], resulting in an inaccurate closed-loop behavior. In addition, the current source device $M_b$ often works in the linear region. The operating point of the amplifier heavily relies on the process corner and input common-mode voltage. Hence, the amplifier performance is highly sensitive to those variations, thus preventing its usage in the PVT-robust systems. In addition, the output $V_{OP}=V_{ON}$ often drop from $V_{DD}$ to GND. This unstable output common-mode voltage often significantly increases the system integration effort.

Prior attempts have been made to embed a dynamic amplifier into closed-loop operation as reported in [22.2]. Despite the cascaded two stages as well as a deliberately introduced positive feedback path being implemented in such study, the realized open-loop gain was observed to be below 15. This may be due to the limited output common-mode voltage drop. In addition, calibration appeared to be needed to address any PVT and input common-mode induced performance variation. The output common-mode voltage also appeared to require fine adjustments for the system integration.

Figure 20A:
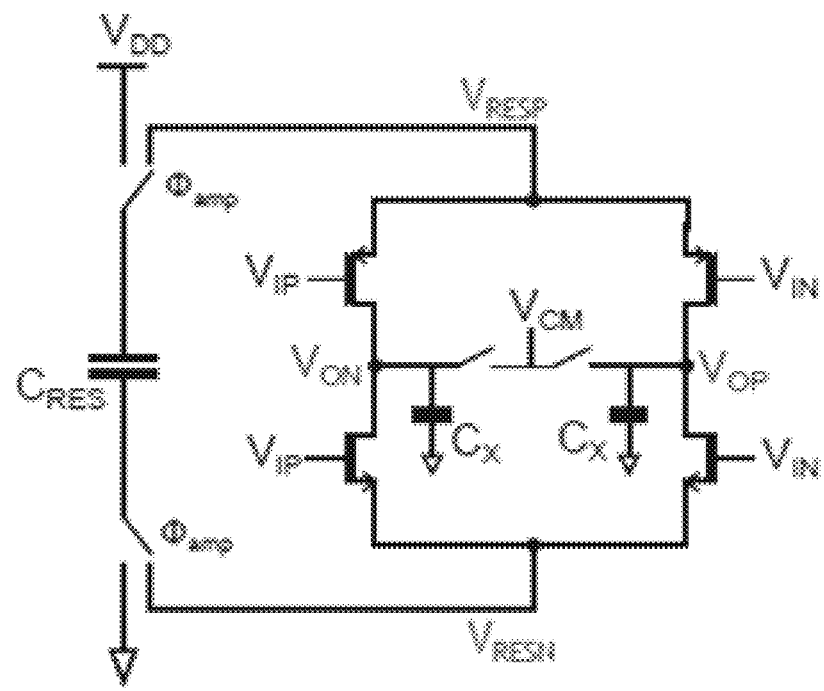
FIG. 20A shows a schematic a switched-capacitor core amplifier configured for use in a loop filter of a SAR ADC in accordance with an illustrative embodiment.
Figure 20B:
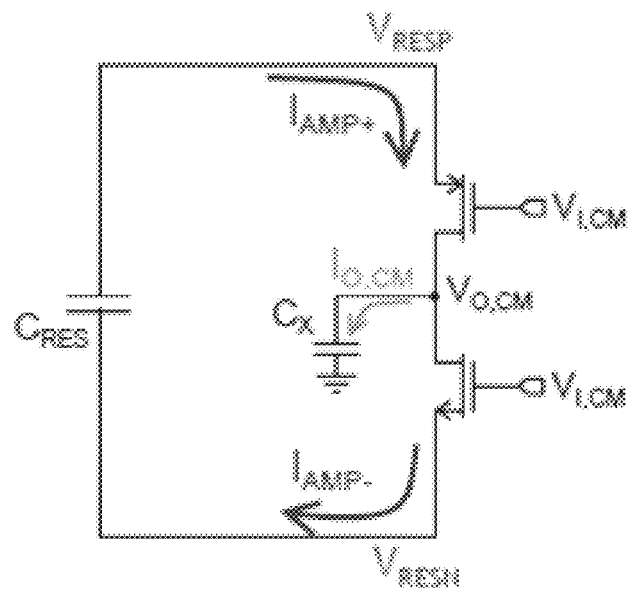
FIG. 20B shows a common-mode equivalent of the switched-capacitor core amplifier of FIG. 20B in accordance with an illustrative embodiment.
Figure 20C:
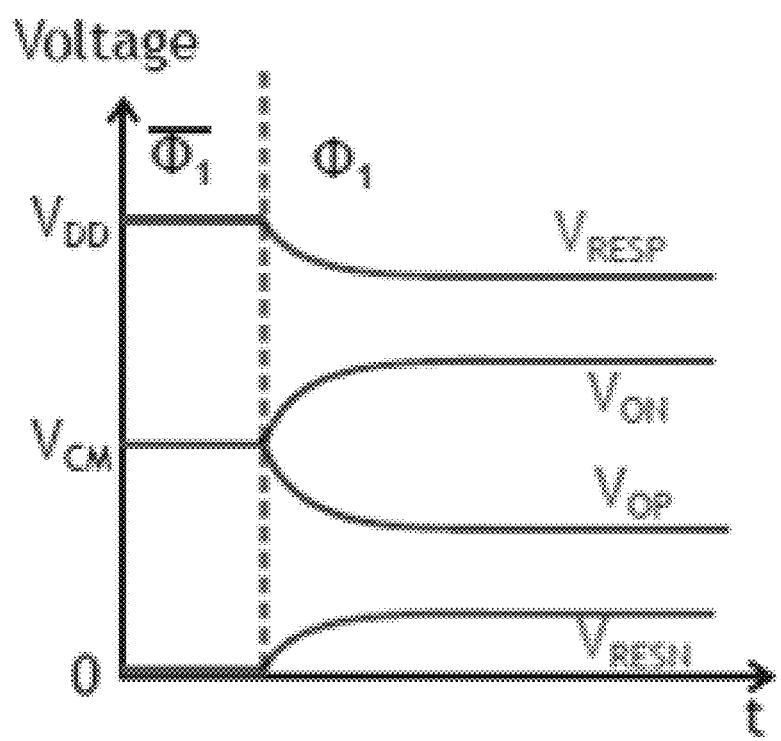
FIG. 20C shows example operations of the switched-capacitor core amplifier in a NS-SAR ADC.

Floating Inverter Amplifier Core. FIG. 20A shows a schematic for a floating inverter amplifier 102 configured as a switched-capacitor core amplifier 102a is configured for use in a loop filter 1804 of a SAR ADC (e.g., 100b). FIG. 20B shows a common-mode equivalent of the switched-capacitor core amplifier 102a of FIG. 20B. The switched-capacitor core amplifier 102a of FIG. 20A is similar to the floating inverter amplifier 102 of FIG. 6. FIG. 20C shows example operations of the switched-capacitor core amplifier 102a in a NS-SAR ADC. As shown in FIG. 20A, the switched-capacitor core amplifier 102a also includes a pair of inverters that coupled to a floating reservoir capacitor. During the reset phase of the NS-SAR ADC, the floating reservoir capacitor $C_{RES}$ is configured to pre-charge to $V_{DD}$ and GND. Once the amplification phase starts, the differential inverters are coupled to the floating reservoir capacitors $C_{RES}$ to amplify an input signal to the floating inverter amplifier.

As discussed above, the floating inverter amplifier 102 of FIG. 6, as well as the switched-capacitor core amplifier 102a of FIG. 20A, is configured to provide high energy-efficiency by current reuse (e.g., 2× energy efficiency) to the CMOS input pair. The switched-capacitor core amplifier 102a of FIG. 20A can also provide an intrinsically constant output common-mode voltage. As shown in the common-mode equivalent (FIG. 20B) because the input and output currents of floating reservoir capacitor $C_{RES}$ must be equal ($I_{AMP+}=I_{AMP-}$), the common-mode current flowing into the integration capacitor $I_{O,CM}$ may be forced to be zero. Therefore, a constant output common-mode voltage can be achieved without a dedicated common-mode feedback or the fine adjustment. In addition, the switched-capacitor core amplifier 102a can provide a robust performance against PVT and input common-mode variations. Since the currents flowing through PMOS and NMOS are forced to be the same, the strengths of input transistors are equalized, which provides a robust performance. In addition, the floating inverter amplifier 102b may be used to provide high gain. With a constant output common-mode voltage, the amplification is no longer limited by common-mode drop as in a conventional or other design, so higher gain can be employed. These properties also make switched-capacitor core amplifier 102a very suitable for closed-loop operation among other applications as discussed herein.

Figure 21A:
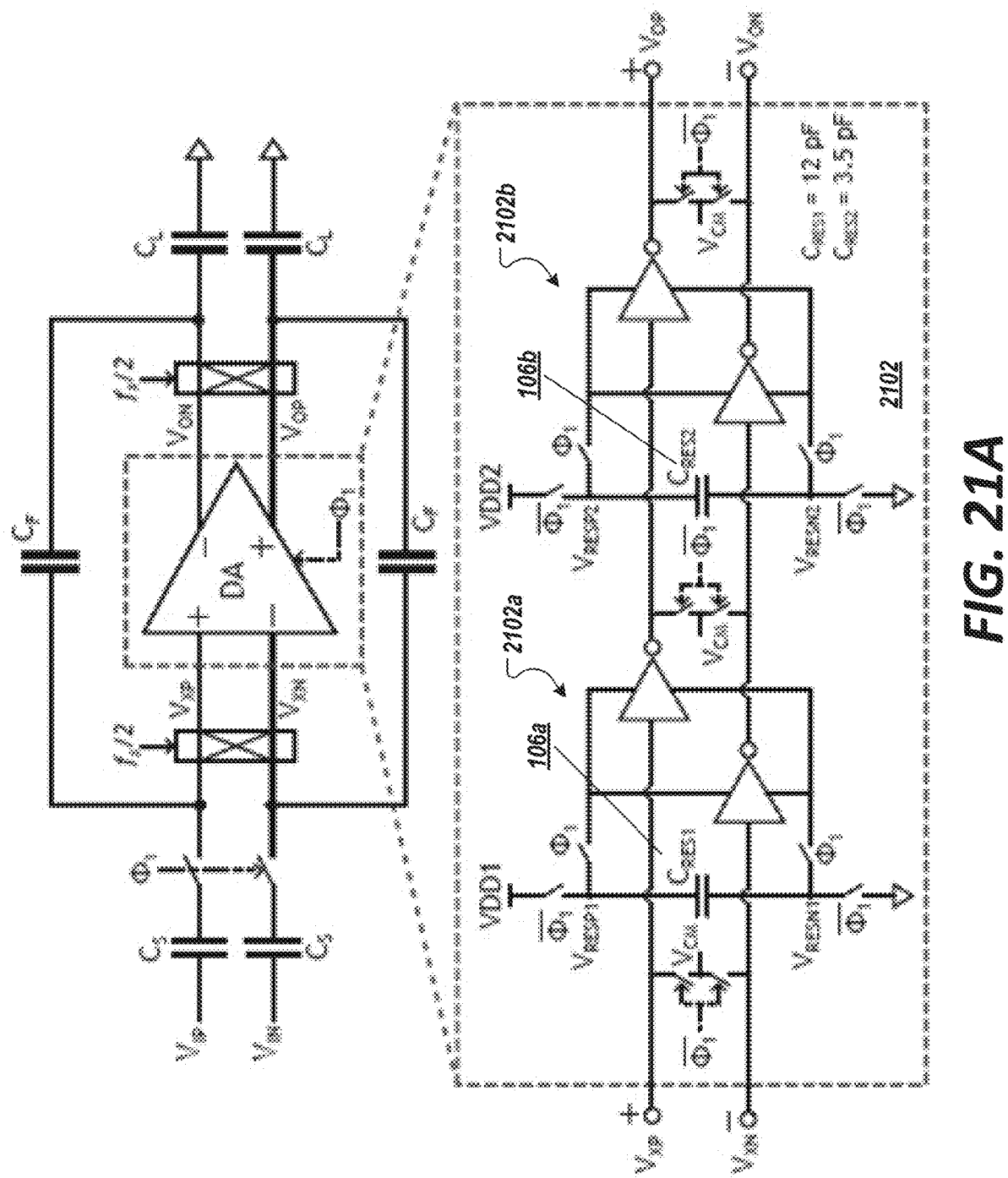
FIG. 21A shows a schematic of a closed-loop dynamic amplifier configured with a floating inverter amplifier in accordance with an illustrative embodiment.
Figure 21B:
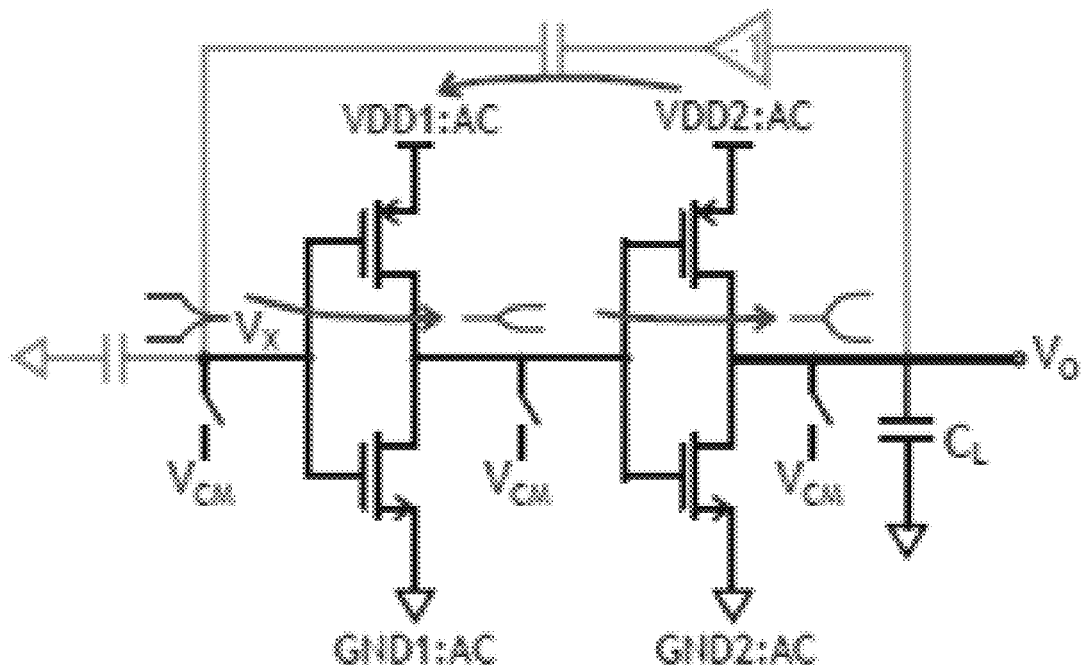
FIG. 21B shows an AC model of the exemplary close-loop dynamic amplifier of FIG. 21A in accordance with an illustrative embodiment.
Figure 21C:
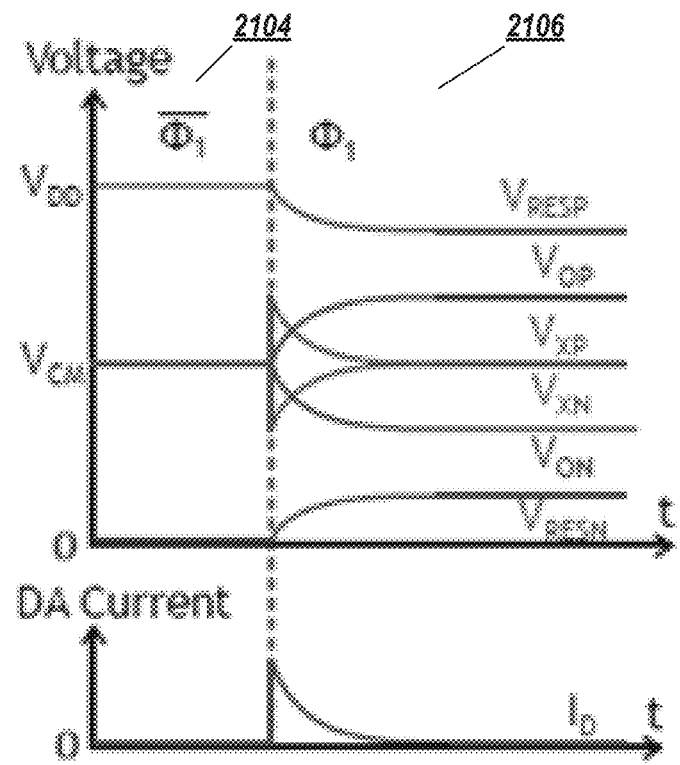
FIG. 21C shows an example operation of the exemplary closed-loop dynamic amplifier of FIG. 21A in accordance with an illustrative embodiment.

Close-Loop Dynamic Amplifier with Floating Inverter Amplifier. FIG. 21A shows a schematic of a closed-loop dynamic amplifier configured with a floating inverter amplifier in accordance with an illustrative embodiment. FIG. 21B shows an AC model of the exemplary close-loop dynamic amplifier of FIG. 21A in accordance with an illustrative embodiment. FIG. 21C shows an example operation of the exemplary closed-loop dynamic amplifier 1802 of FIG. 21A in accordance with an illustrative embodiment.

In FIG. 21A, a two-stage floating-inverter amplifier 2102 (shown as 2102a and 2102b) is shown to provide accurate closed-loop operation. During the reset phase (Φ=0) (2104), the two floating reservoir capacitors $C_{RES1}$ and $C_{RES2}$ (shown as 106a and 106b) are selected as inputs to the floating inverter amplifier via switches (shown associated with signals $\Phi_1$ and $\overline{\Phi_1}$) and are pre-charged to the supply voltages. The inverters are powered off with both inputs and outputs reset to $V_{CM}$. During the dynamic amplification phase (Φ=1) (2106), the two amplifiers (2102a, 2102b) are turned on by respectively connecting their respective supply rails to the floating reservoir capacitors $C_{RES1}$ and $C_{RES2}$. Because of the constant output common-mode voltage, the two amplifier stages (2102a, 2102b) are enabled simultaneously, realizing the closed-loop amplification, as shown in the AC model in FIG. 21B. This operation is functionally similar to that of the conventional closed-loop OTA. With the presence of differential-mode voltages at the amplifier input, differential-mode output currents are produced to decrease the input voltage via CF feedback. As a result, $V_X$ drops, and $V_O$ builds up via charge transfer. The overall transfer function can be mainly set by the capacitor ratio.

As can be seen in FIG. 20C, during the amplification operation $\Phi_1$, the inverter-based amplifier supply voltages can decrease with time due to the discharges of the floating reservoir capacitors $C_{RES1}$ and $C_{RES2}$, resulting in the decrease of the amplifier current. Once the reservoir voltage $V_{RES}$ drops below the sum of threshold voltages $V_{THN}+V_{THP}$, the amplifier current approaches zero. Because of this self-quenched mechanism, the exemplary closed-loop dynamic amplifier may have a settling behavior and is suitable for duty cycling, thus, is applicable for use in a fully-dynamic design.

Because of the intrinsically high gain provided by the floating inverter amplifier 102b, the close-loop dynamic amplifier obtains 18-dB and 15.5-dB gains from the first and second stages, respectively. The 33-dB total DC gain achieved across the output swing of the amplifier is sufficient for the exemplary NS-SAR residue integration due to the low oversampling ratio (OSR) of 8. Compared to the prior attempt of closed-loop dynamic amplifier in [22.2], the exemplary floating inverter amplifier improves the open-loop gain by 12 dB, and does not require any output common-mode adjustment.

In an example prototype design, a 0.8-V supply is adopted for first stage FIA to further boost the energy efficiency, while 1.1 V is used for the second stage to ensure sufficient drivability. To suppress the amplifier's flicker noise, the prototype is configured to chop at $f_s/2$ [24.2].

Bandwidth and Stability Analysis. Stability analysis is performed on the two-stage topology. There are two poles located at both floating inverter amplifier outputs. The pole frequencies are $p=1/(R_o C_o)$, where $R_o$ is the total output impedance that can be approximated as $1/(g_{ds,p}+g_{ds,n})$, and the $C_o$ is the total load capacitance. Because of the large load capacitor $C_L$ at the closed-loop amplifier output, the second stage pole $p_2$ is the intrinsically dominant one, and thus, it may not need Miller compensation.

In the conventional OTA design, there may be a direct trade-off between the settling speed and power consumption. For example, to achieve a fast-settling speed, a constant wide unity-gain bandwidth (UGB) may be required. And, to ensure a good phase margin in a two-pole system, the non-dominant pole frequency may need to be at least 2 times higher than UGB, resulting in considerable power consumption.

The exemplary dynamic amplifier 1802 can address this trade-off without consuming more power by dynamically adjusting bandwidth and stability. Since the currents of stages of the floating inverter amplifier can decrease due to the discharge of floating reservoir capacitors, both $R_{o1}$ and $R_{o2}$ can be kept increasing to reduce pole frequencies. In one example, a smaller floating reservoir capacitor can be used for the second stage (e.g., $C_{RES2}$=3.5 pF). To this end, the current in the second stage can decrease at a faster speed. With a quickly increased $R_{o2}$, the dominant pole p2 may shift inward faster, thus improving the phase margin. This dynamically-scaled BW and stability may share similar concepts with the ring amplifiers reported in [25.2]-[29.2].

Figure 22A:
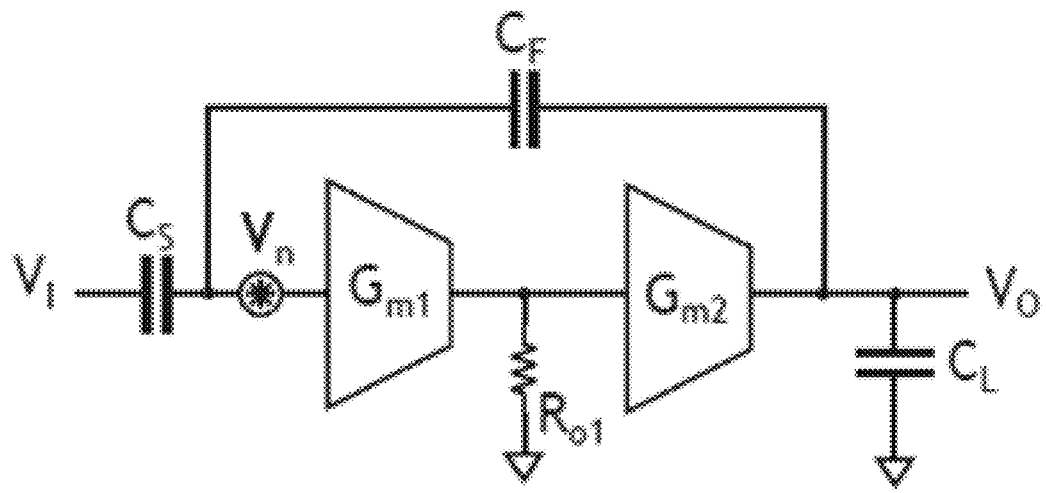
FIG. 22A shows simulated loop frequency response of the dynamic amplifier 1802.
Figure 22B:
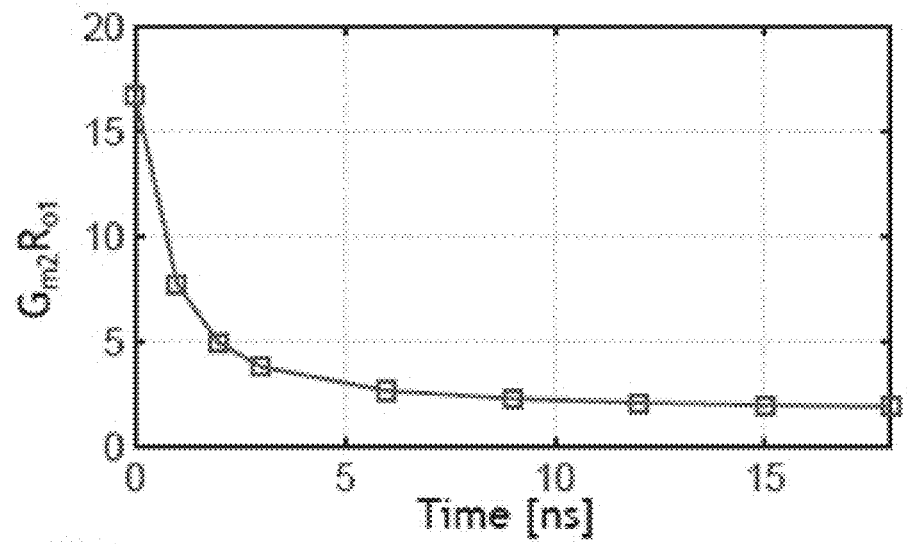
FIG. 22B shows the UGB and PM versus time in accordance with an illustrative embodiment.
Figure 22B:
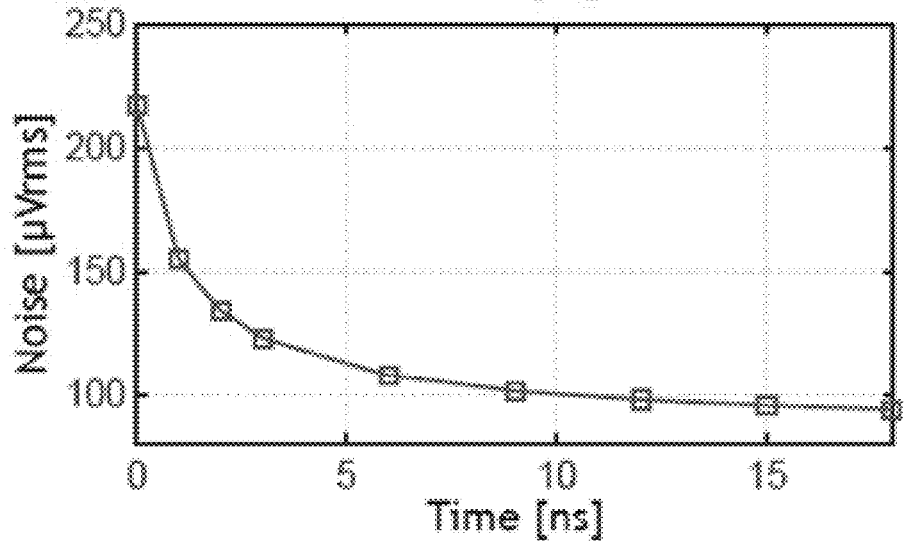

FIG. 22A shows simulated loop frequency response of the dynamic amplifier 1802. FIG. 22B shows the UGB and PM versus time.

As shown in FIG. 22B, at the beginning of the amplification operation, a large current may provide an UGB close to 500 MHz for a fast-initial settling. Because of the discharge of the floating reservoir capacitors (106a, 106b), the non-dominant pole p1 may shift inward by 2 times, while the dominant pole p2 shifts inward by 8 times over the settling process. This can improve the phase margin from 35 initially to nearly 80 at the end, which ensures stability. Unlike a conventional OTA that may require a constant sufficient bandwidth (BW) to meet the settling requirement, the exemplary dynamic amplifier 1802 can consume large current initially to provide a wide BW for the fast settling and dynamically reduces the current to ensure stability towards the end. This dynamically-scaled operation can thus relax the BW and power trade-off, thus improving the energy efficiency.

Noise Analysis. Another design consideration is the noise performance. FIG. 22A shows the simplified noise model of closed-loop two-stage amplifier, including a $G_{m1}/R_{o1}$ first stage and a $G_{m2}$ second stage. The total output equivalent resistance is provided in Equation 27.

$$R_T = \frac{1}{\beta \cdot G_{m,total}}$$

(27)

In Equation 27, β is a feedback factor $\beta=C_F/(C_F+C_S)$ and $G_{m,total}=G_{m1}R_{o1}G_{ms}$. The total equivalent loading capacitance can be calculated in Equation 28.

$$C_T = C_L + (1-\beta)C_F \quad (28)$$

In a proper design, the switch resistance would much smaller than $R_T$, and thus, the noise of the input and feedback switch resistances are ignored in FIG. 22A. The overall noise is dominated by the two-stage amplifier, including two $G_m$ stages $v_{n,Gm1}(f)$ and $v_{n,Gm2}(f)$. With the dominant pole located at the second-stage output, the total input-referred noise power spectral density (PSD) can be approximated as shown in Equation 29.

$$\frac{\overline{v_n^2(f)}}{\Delta f} \approx \frac{\overline{v_{n,Gm1}^2(f)}}{\Delta f} + \frac{\overline{v_{n,Gm2}^2(f)}}{\Delta f \cdot (G_{m1}R_{o1})^2} = 4\gamma kT \cdot G_{m1} + \frac{4\gamma kT \cdot G_{m2}}{\Delta f \cdot (G_{m1}R_{o1})^2} \quad (29)$$

In Equation 29, the total noise is dominated by $v_{n,Gm1}(f)$ since the noise contributing from $v_{n,Gm2}(f)$ is attenuated by the first stage gain $(G_{m1}/R_{o1} \gg 1)$. By integrating the noise PSD from 0 to ∞ in the frequency domain, the total sampled noise can be calculated as provided in Equation 30.

$$\overline{v_{n,o}^2} \approx \int_0^\infty \frac{\overline{v_n^2(f)}}{\Delta f} \cdot (G_{m,total})^2 \cdot \left|\frac{R_T}{1+jwR_TC_T}\right| df \approx \frac{kT}{\beta C_T} \cdot G_{m2}R_{o1} \quad (30)$$

The noise scaling effect γ is approximated as 1 in the derivation of Equation 30. The integrated noise can be independent of the value of $G_{m1}$ because PSD is proportional to $G_{m1}$ while the noise bandwidth NBW=1=(4$R_TC_T$) is inversely proportional to that [29.2]. As a result, the noise of the closed-loop amplifier is proportional to $G_{m2}R_{o1}$. In a conventional closed-loop OTA design, a constant sufficient BW is needed to realize the desired settling behavior, which requires a large $G_{m,total}$. This can translate to the need for a large $G_{m2}R_{o1}$ product, which may limit the sampled noise performance.

In contrast, the exemplary dynamic amplifier 1802 have a decreasing BW during the settling, which provides an attractive feature that also dynamically narrows the noise bandwidth. With the second stage current reducing at a faster speed for stability, $G_{m2}R_{o1}$ product can keep decreasing.

FIG. 22B shows simulated $G_{m2}R_{o1}$ product and output noise versus time. As shown in FIG. 22B, the simulated $G_{m2}R_{o1}$ product can be decreased by over 8 times over the settling process, leading to a more than 2 times rms noise reduction.

PVT-Robustness. Because of the robust behavior inherited from floating inverter amplifier and the sufficient DC gain contributed by the two-stage architecture, the closed-loop amplification gain ACL can be defined by the capacitor ratios. In the loop integrator, the feedback capacitor $C_F$ can be equal to $C_S$, which can give the ideal ACL of 1. Because of the 33-dB open-loop gain, the realized nominal ACL is approximately 0.96.

Figure 23:
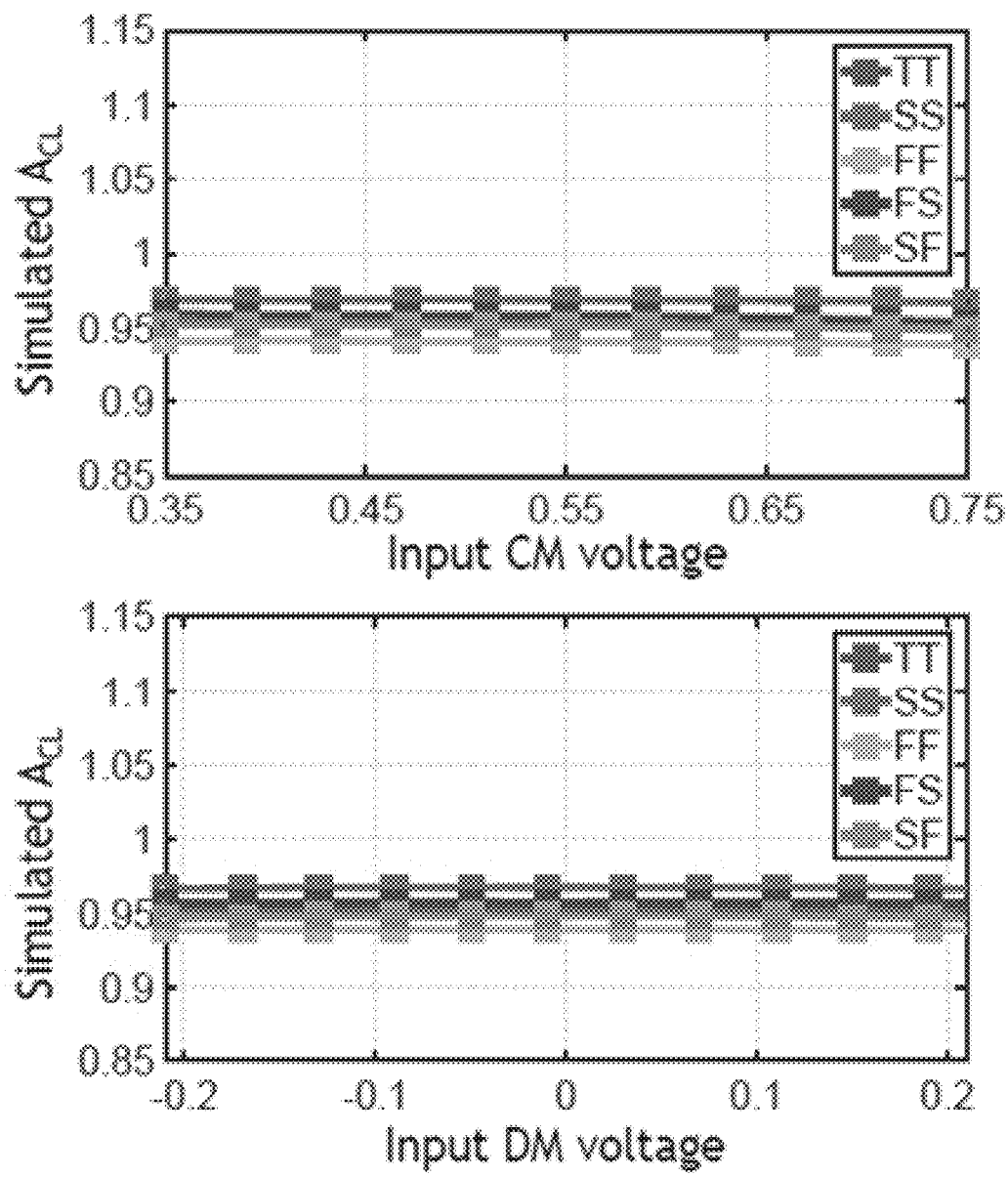
FIG. 23 shows simulated closed-loop gain against process corners and input voltages in accordance with an illustrative embodiment.

FIG. 23 shows simulated closed-loop gain against process corners and input voltages. As shown in FIG. 23, the simulated closed-loop gain stays almost constant over 200 mV differential-mode and common-mode input changes. There exists a 2% change across the process corners, which has a negligible impact on overall NS-SAR ADC performance due to the low OSR of 8. Hence, the amplifier guarantees a robust NS-SAR residue integration with no gain calibration required.

Figure 24:
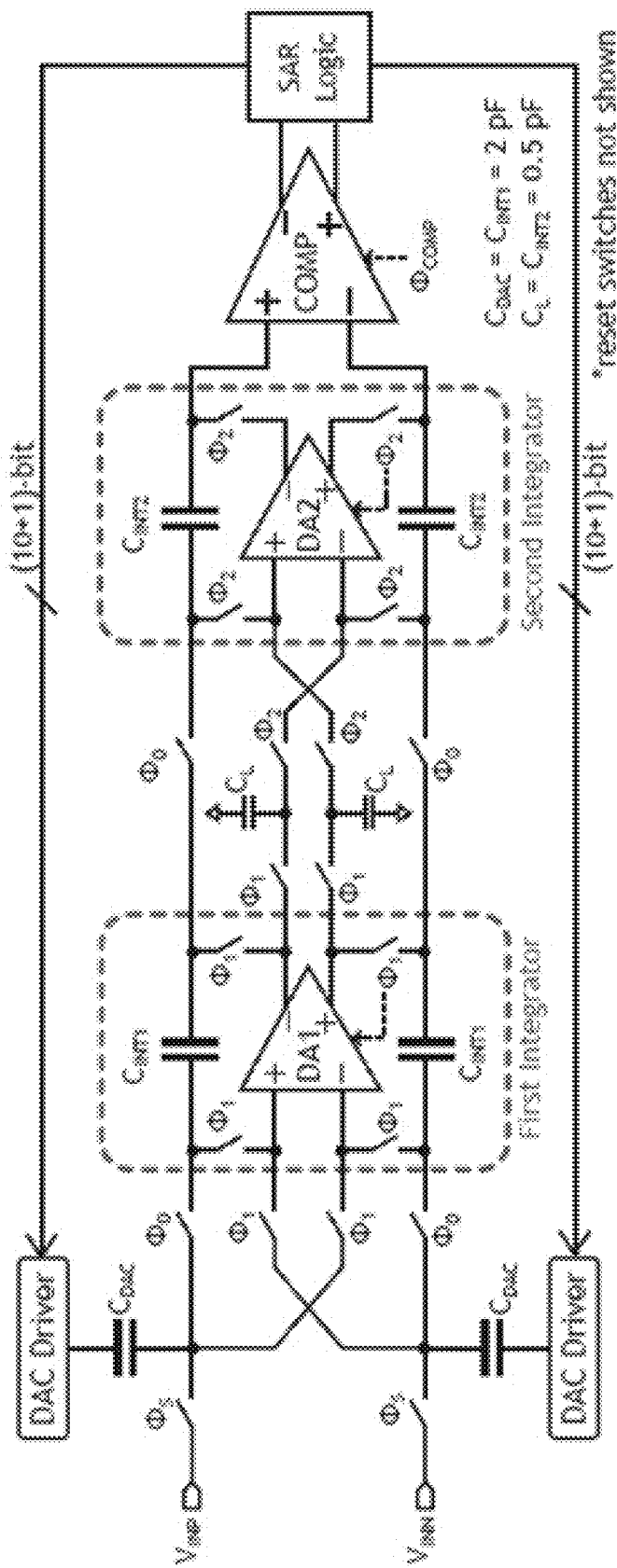
FIG. 24 shows a top-level schematic of the exemplary NS-SAR ADC in accordance with an illustrative embodiment.
Figure 25:
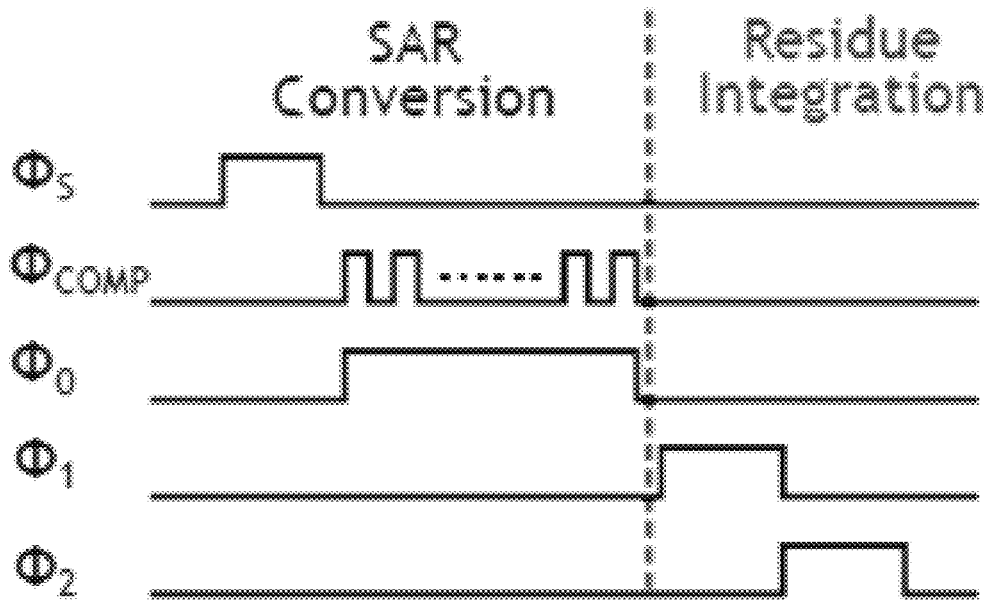
FIG. 25 shows an example timing diagram of the exemplary NS-SAR ADC of FIG. 24 in accordance with an illustrative embodiment.

Example Circuit Implementation. FIG. 24 shows a top-level schematic of the exemplary NS-SAR ADC 100b in accordance with an illustrative embodiment. FIG. 25 shows an example timing diagram of the exemplary NS-SAR ADC of FIG. 24 in accordance with an illustrative embodiment.

In FIG. 24, the NS-SAR ADC 100b includes a 10-bit SAR quantizer and two integrators each equipped with the exemplary closed-loop dynamic amplifier 1802. The SAR core includes a 10-bit CDAC with a 1-bit redundancy. The single-ended DAC capacitance is configured to be 2 pF to ensure a good kT/C-limited performance. To achieve the required conversion linearity, the capacitor mismatch may be mitigated through a one-time foreground calibration [30.2].

In FIGS. 24 and 25, in the sampling phase $\Phi_S$, $V_{IN}$ is top-plate sampled on the CDAC. In the SAR conversion phase $\Phi_Q$, the SAR converts the loop filter output to the digital data $D_O$. During the first residue integration phase $\Phi_1$, the SAR residue stored on CDAC is integrated on $C_{INT1}$, resulting in $V_{INT1}$ which is also sampled on $C_L$ for the second integration phase. During the second residue integration phase $\Phi_2$, the sampled $V_{INT1}$ on $C_L$ is integrated on $C_{INT2}$ to produce $V_{INT2}$. As an example, a conversion cycle may take 100 ns, including 16 ns for the sampling phase, 20 ns for the first integration phase, 16 ns for the second integration phase, and the rest for the SAR conversion.

In an example prototype design, the first stage integration capacitor $C_{INT1}$ may be chosen to be 2 pF to match $C_{DAC}$. The exemplary two-stage FIA-based closed-loop dynamic amplifier 1802 may be employed to perform the first-stage residue integration. Due to the relaxed noise requirement of the second-stage integrator, smaller capacitors, e.g., 0.5 pF, may be used for $C_L$ and $C_{INT2}$ to reduce power and area cost. For simplicity, the second-stage integrator is shown to use a single-stage closed-loop FIA. Because of the lower drivability requirement, a longer channel length (80 nm) may be adopted to achieve a 23-dB single-stage open-loop DC gain.

To realize the noise shaping, the integrator and DAC outputs may be combined for the quantization during SAR conversion phase. A conventional cascade of integrators with feed-forward (CIFF) NS-SAR ADC requires a multi-path comparator to perform the analog signal summation as in [4.2], [7.2], [14.2].

Figure 26A:
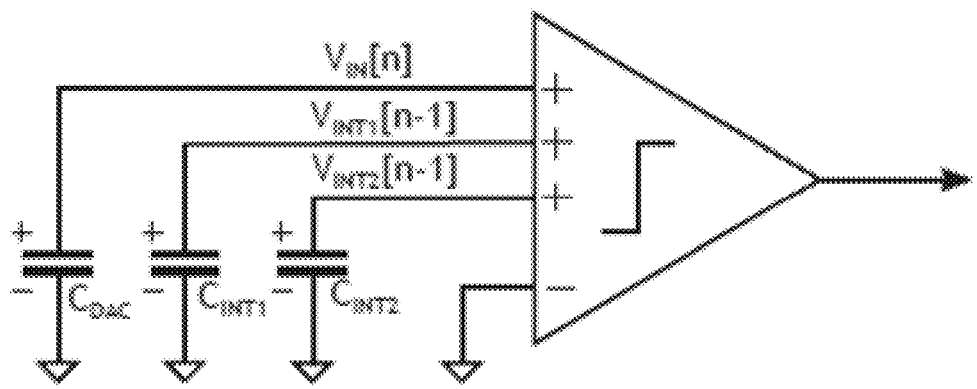
FIG. 26A shows a conventional analog adder and quantizer.
Figure 26B:
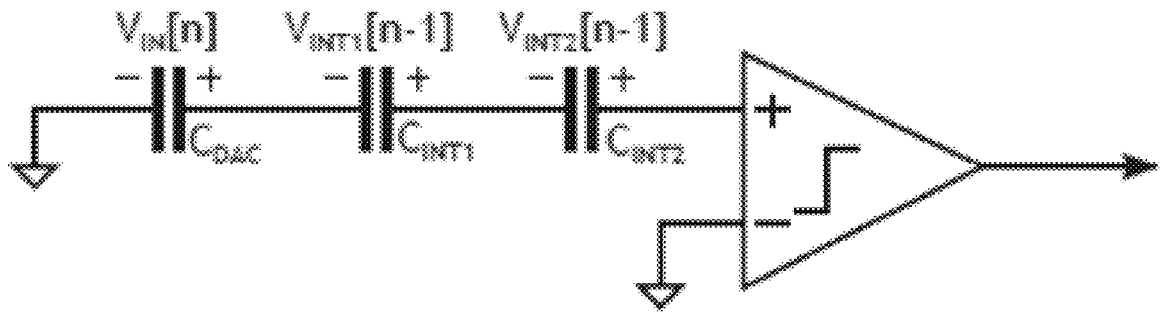
FIG. 26B shows an example analog adder and quantizer that can be implemented in the exemplary NS-SAR ADC of FIG. 18 in accordance with an illustrative embodiment.

FIG. 26A shows a conventional analog adder and quantizer. FIG. 26B shows an example analog adder and quantizer that can be implemented in the NS-SAR ADC 100b. As shown in FIG. 26A, for the second-order noise shaping in a conventional adder and quantizer, an equal-weight 3-path comparator may be necessary. These two extra input transistor pairs not only increase the power consumption by 3 times, in some embodiments, but can also introduce three-fold increase in noise power. Estimated by simple analog scaling, to reach the same noise performance as a regular single-path comparator, the equal-weight 3-path comparator needs to consume 9 times power.

To reduce the power and noise overhead, a passive analog summation is employed by stacking capacitors similar to that reported in [8.2]. During the residue integration phases, the integrator outputs are stored on $C_{INT1}$ and $C_{INT2}$. The integrators are placed in series with $C_{DAC}$ during the conversion phase, thereby achieving the passive voltage summation. This can obviate the need for a multi-path comparator, which can substantially reduce both comparator noise and power use in the NS-SAR ADC 100b. The integration capacitors $C_{INT1}$ and $C_{INT2}$, in some embodiments, are implemented as metal-on-metal (MoM) capacitors. The post-layout-extracted parasitics including comparator input pairs can be only 4% compared to integration capacitors, which cause negligible signal attenuation.

Figure 27:
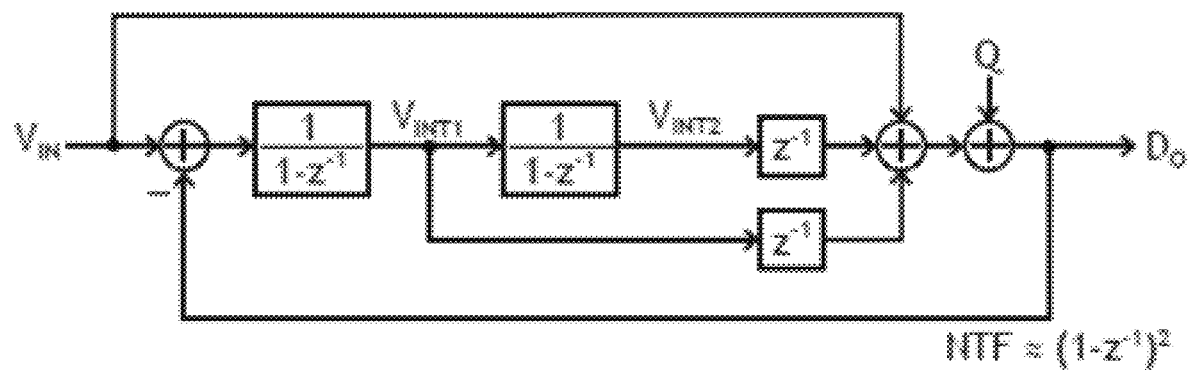
FIG. 27 shows an equivalent model showing the signal flow chart of the exemplary NS-SAR ADC of FIG. 18 in accordance with an illustrative embodiment.

FIG. 27 shows an equivalent model showing the signal flow chart of the exemplary NS-SAR ADC 100b in accordance with an illustrative embodiment. The exemplary device can be configured as a second-order CIFF NS-SAR ADC. With the sufficient DC gain provided by the closed-loop dynamic amplifiers, a desired NTF≈$(1-z^{-1})^2$ can be realized.

Table 2 shows an example noise budget for the exemplary NS-SAR ADC 100b.

TABLE 2

|  | RMS Voltage | Percentage |
| --- | --- | --- |
| Sampling | 22 μVrms | 41% |
| Quantization | 16 μVrms | 21% |
| $1^{st}$-integrator | 18 μVrms | 25% |
| $2^{nd}$-integrator | 11 μVrms | 9% |
| Comparator | 7 μVrms | 4% |

The simulated in-band input-referred noise breakdown is presented in Table 2. The differential input sampling noise ($2kT/C_{DAC}$) contributes 41% of the total noise. The noise contributions of two integrators and the comparator are 25%, 9%, and 4%, respectively.

Figure 28:
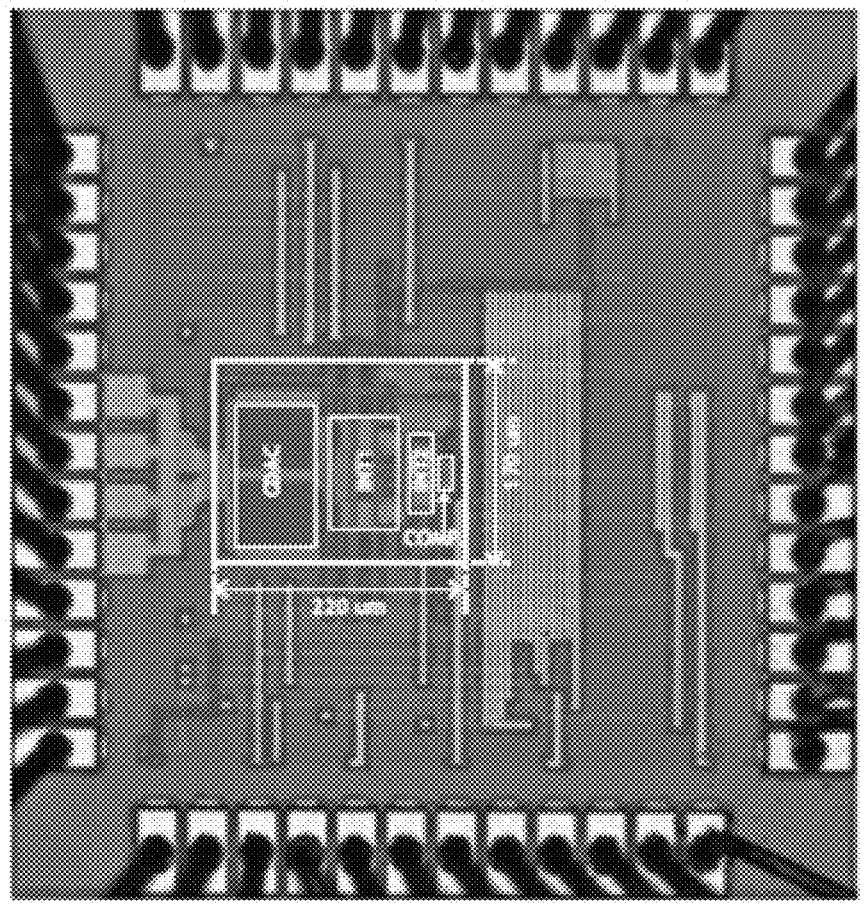
FIG. 28 shows a chip micrograph of a fabricated exemplary NS-SAR ADC of FIG. 18 in accordance with an illustrative embodiment.

Experimental Results and Additional Examples. FIG. 28 shows a chip micrograph of a fabricated exemplary NS-SAR ADC 100b in accordance with an illustrative embodiment. In FIG. 28, the NS-SAR ADC 100b is fabricated in 40-nm CMOS. The design occupies an active area of 0.037 mm² and consumes 107 μW when sampling at 10 MHz, in which 15 μW, 11 μW, 41 μW, and 40 μW are dissipated by the reference, the comparator, the analog circuits, and digital logics, respectively.

Figure 29A:
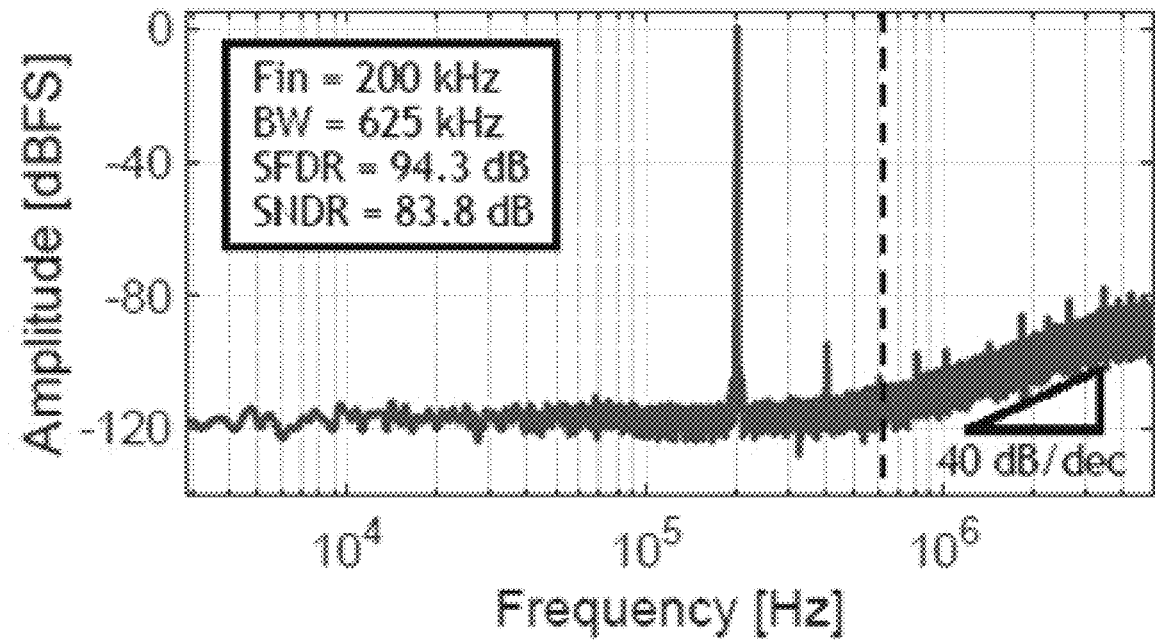
FIG. 29A shows a measured single-tone spectrum plot of the NS-SAR ADC of FIG. 18 in accordance with an illustrative embodiment.
Figure 29B:
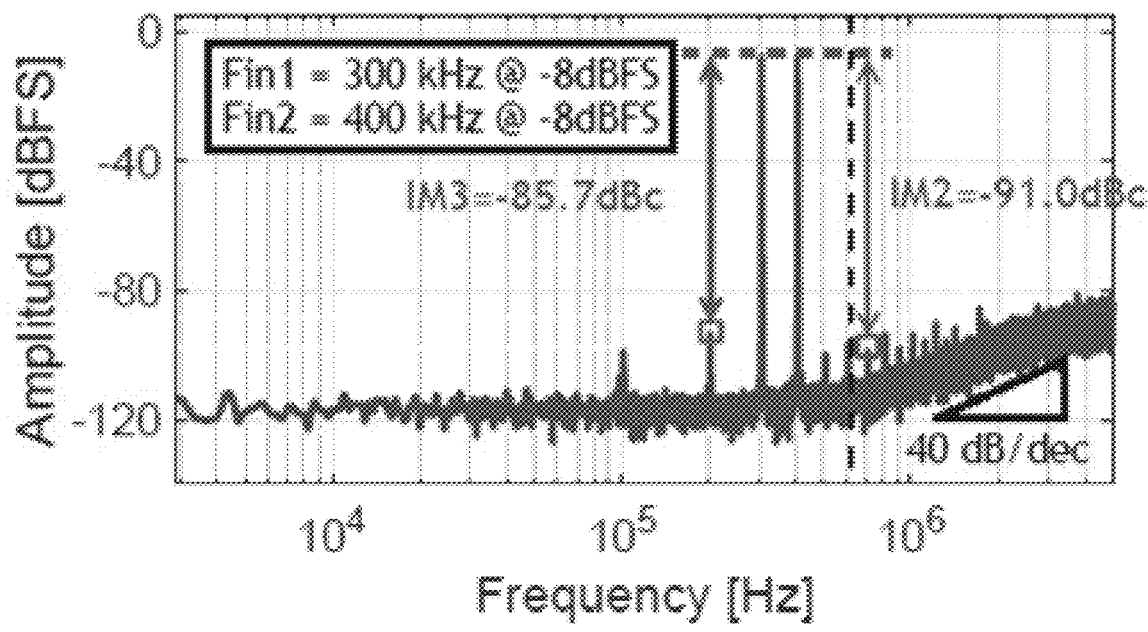
FIG. 29B shows a measured two-tone spectrum plot of the NS-SAR ADC of FIG. 18 in accordance with an illustrative embodiment.
Figure 30:
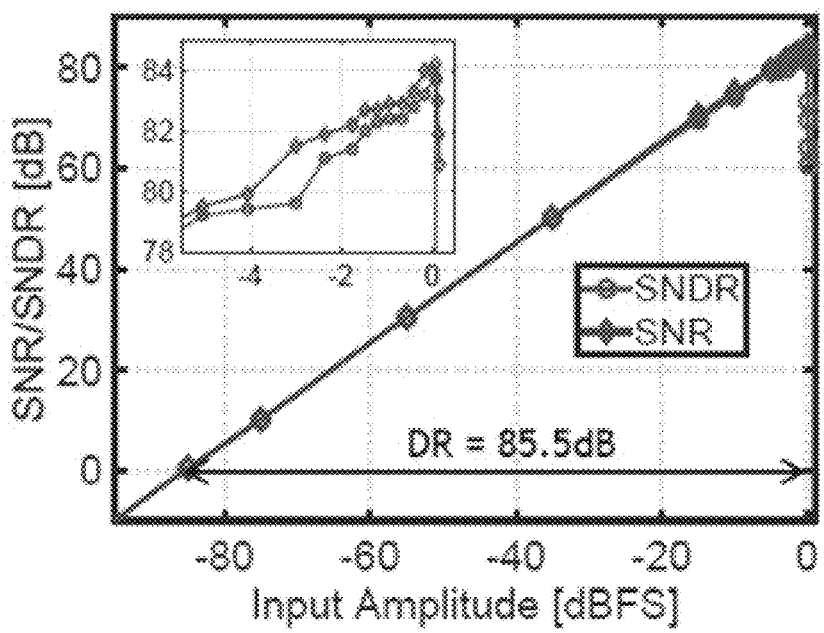
FIG. 30 shows the measured SNR and SNDR versus input amplitude of the NS-SAR ADC of FIG. 18 in accordance with an illustrative embodiment.

FIG. 29A shows a measured single-tone spectrum plot. FIG. 29B shows a measured two-tone spectrum plot. In FIG. 29A, with the capacitor mismatch calibrated in the foreground, the measured SNDR and SFDR are 83.8 dB and 94.3 dB, respectively. The flicker noise of the first integrator is chopped at fs/2, as shown in FIG. 21A. As a result, the flicker noise has been greatly suppressed and the in-band noise is dominated by thermal noise. In FIG. 29B, the measured spectrum with two input tones is shown at −8 dBFs at 300 and 400 kHz. The observed worst-case second-order and third-order inter-modulation distortions (IMDs) are −91 dBc and −85.7 dBc, respectively. FIG. 30 shows the measured SNR and SNDR versus input amplitude. The prototype ADC achieves a dynamic range of 85.8 dB.

Figure 31:
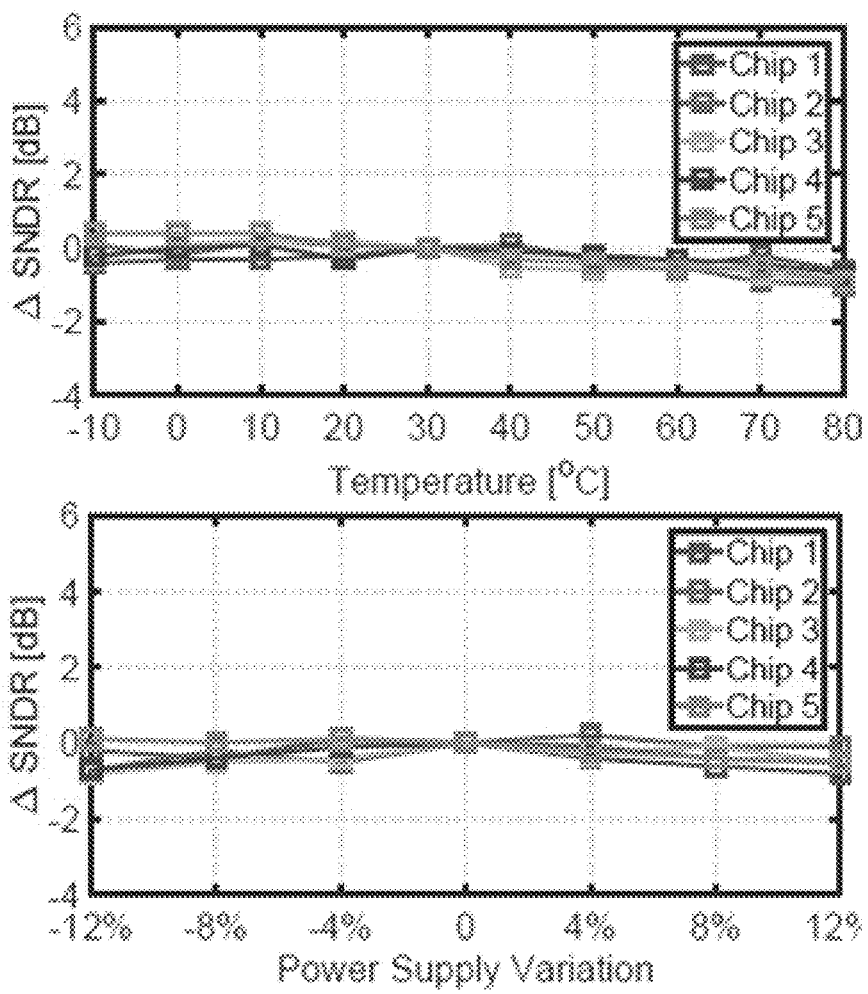
FIG. 31 shows measured SNDR variation versus temperature and power supply variations of the exemplary NS-SAR ADC of FIG. 18 in accordance with an illustrative embodiment.

To verify the robustness of the exemplary NS-SAR ADC (e.g., 100b) performance, 5 samples were measured across a wide range of the temperatures and power supplies. FIG. 31 shows measured SNDR variation versus temperature and power supply variations of the exemplary NS-SAR ADC in accordance with an illustrative embodiment. As shown in FIG. 31, with the temperature varying from −10 C to 80 C (as measured), only 1.5-dB SNDR variation was observed for each sample. With a 12% power supply variation, the maximum SNDR variation was observed to be only 1 dB for each sample. The data firmly confirms the robustness of the exemplary closed-loop dynamic amplifier 1802.

Table 3 provides a summary of the performance of the exemplary NS-SAR ADC as compared to state of art like devices.

TABLE 3

|  | ISSCC 12 Fredenburg | ISSCC 16 Shu | ISSCC 17 Liu | CICC 17 Miyahara | ISSCC 18 Li | ISSCC 19 Lin | JSSC 19 Zhuang | This work |
| --- | --- | --- | --- | --- | --- | --- | --- | --- |
| Process [nm] | 65 | 55 | 28 | 65 | 40 | 14 | 40 | 40 |
| Residue Processing | Closed-L. OTA | Closed-L. DTA | Open-L. DA | Open-L. DA | Open-L. DA | Passive | Passive | Closed-L. DA |
| Sharp NTF | ✓ | ✓ | X | X | ✓ | X | X | ✓ |
| Fully Dynamic | X | X | ✓ | ✓ | ✓ | ✓ | ✓ | ✓ |
| PVT Robust | ✓ | ✓ | X | X | ✓ | ✓ | ✓ | ✓ |
| Gain Cal. Free | ✓ | ✓ | ✓ | X | X | ✓ | ✓ | ✓ |
| Area [mm²] | 0.0462 | 0.072 | 0.0049 | 0.08 | 0.024 | 0.0021 | 0.04 | 0.037 |
| Power [u/W] | 806 | 15.7 | 460 | 257.8 | 84 | 1250 | 143 | 107 |
| Fs [MS/s] | 90 | 1 | 132 | 10 | 10 | 320 | 8.4 | 10 |
| OSR | 4 | 125 | 13.2 | 20 | 8 | 4 | 16 | 8 |
| NS Order | 1 | 1 | 1 | 3 | 2 | 1 | 2 | 2 |
| BW [MHz] | 11 | 0.004 | 5 | 0.25 | 0.625 | 40 | 0.262 | 0.625 |
| SNDR | 62 | 96.1 | 80 | 83.4 | 79 | 66.6 | 78.4 | 83.8 |
| FoMw³ [fJ/conv.-step] | 35.8 | 37.6 | 5.8 | 42.6 | 9.4 | 8.9 | 41 | 6.8 |
| FoMs² [dB] | 163.3 | 180.0 | 180.1 | 173.3 | 177.7 | 171.7 | 171 | 181.5 |

$^1$FoM$_W$ = Power/($2^{ENOB}$ • 2 • BW)
$^2$FoM$_S$ = SNDR + 10 • $\log_{10}$(BW/Power)

In Table 3, by performing the residue integration with the exemplary closed-loop dynamic amplifier 1802, the exemplary NS-SAR-ADC 100b is arguably the first fully-dynamic NS-SAR that realizes sharp NTF while not requiring any gain calibration. It offers high resolution, high energy efficiency, and performance robustness simultaneously. As shown in Table 3, as compared to other state-of-the-art NS-SAR ADCs, the exemplary NS-SAR-ADC 100b achieves the best energy efficiency, realizing a Schreier figure-of-merit (FoM) of 181.5 dB and a Walden FoM of 6.8 fJ/conversion step.

Discussion. The advancements in communication technology, sensors, computing, and healthcare are fostering an unprecedented scale of internet-of-things (IoT) in the coming years. This rapid development brings stringent requirements of both high resolution and low power to the analog-to-digital converters (ADCs) for digitizing high dynamic-range (DR) sensor outputs with a tight power budget. Successive approximation register (SAR) ADCs have been shown to achieve superior power efficiencies due to their simple building blocks that are digital and scaling friendly in nature [1.2]-[3.2]. However, it is challenging for SAR to achieve high resolution limited by comparator noise and excessive digital-to-analog converter (DAC) power/area. A widely used architecture for high-resolution applications is the ADC. Taking advantage of oversampling and noise shaping (NS), it can reach high resolution with a low-resolution quantizer and DAC. Nevertheless, ADC usually requires high-performance operational transconductance amplifier (OTA)-based active integrators, which are power hungry and scaling unfriendly.

Recently, the emerging ADC architecture, NS-SAR, hybridizes the SAR operation with the conversion to combine their merits and offer both high energy efficiency and high resolution [4.2]-[17.2].

The exemplary second-order NS-SAR ADC 100b employs closed-loop dynamic amplifier 1802 to perform residue integration in which the dynamic amplifier combines the merits of dynamic circuit and closed-loop operation. Because it uses a dynamic amplifier instead of an OTA, it has lower noise and eliminates static current. Moreover, because it operates in closed-loop, the transfer function is set by capacitor ratios, and thus, is highly accurate. It is insensitive to PVT variations, free from gain calibration, immune to clock jitter, and can realize aggressive NTF. In addition, the exemplary dynamic amplifier 1802 features a dynamically-scaled bandwidth, which provides a better tradeoff among speed, power, and noise.

Further discussion about the exemplary floating inverter amplifier 102 and exemplary noise-shaping successive-approximation-register analog-to-digital converter 100b are provided Appendix C and D, which are each attached herein and incorporated by reference in its entirety.

Conclusion. Indeed, the core dynamic amplifier and floating inverter amplifier can be applied to a host of different circuits. As discussed, in the signal path applications, it can be used to sense the input and amplifies it for further processing. When used in a feedback path, it may be used to sense the error and amplifies it for the loop to correct it, e.g., in the loop filter of a data converter. Examples include as a pre-amplifier in a comparator or as a switched-capacitor core amplifier. As a switched-capacitor integrator, it may be used for noise-shaping ADC design. The switched-capacitor based amplifier/integrator can be used in the loop filter of data converters, including Delta-Sigma modulator, pipeline ADC, etc. In addition, the floating inverter amplifier may be applied to other physical data conversion processes, e.g., capacitance-to-digital converter, temperature sensor, etc. In addition, it can replace most of the conventional switch-capacitor based amplifiers used in analog building devices such as DC-DC converter, low dropout regulator, and the like.

EXAMPLE #3—High-Speed High-Gain Data Converter

Event-Driven Pipelined ADC with Multi-Stage Cascoded Floating Inverter

FIGS. 32-38 provides the exemplary floating inverter amplifier configured within a multi-stage event-driven pipelined ADC. The floating inverter amplifier can be used to provide, in this example, i) high gain in a multi-stage topology structure with dynamic cascode mechanism that does not need any additional bias voltage (providing for a more efficient and eloquent design) and ii) high-speed using a 2-step fast-settling operation.

Figure 32A:
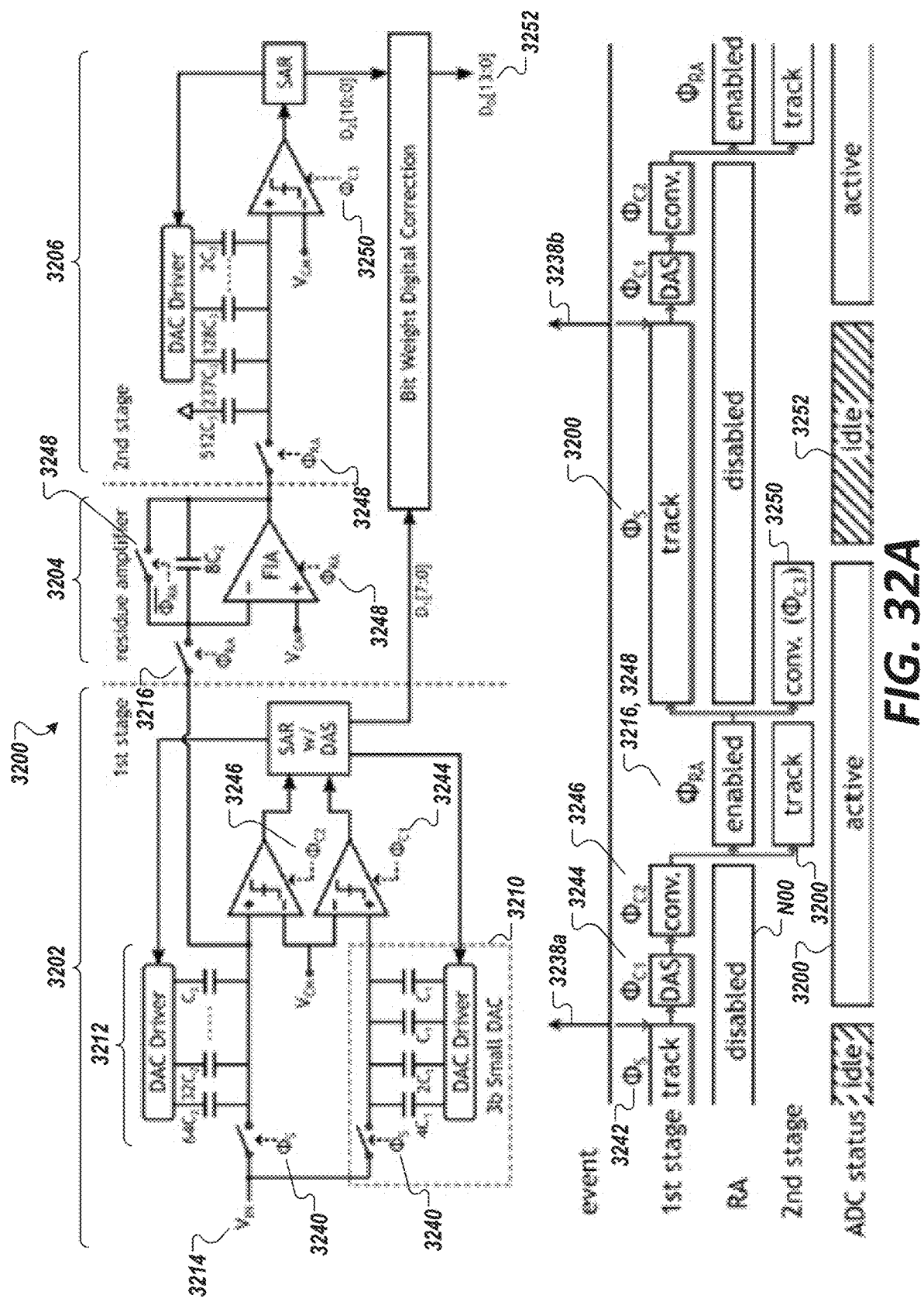
FIGS. 32A, 32B, and 32C illustrate an exemplary floating inverter amplifier configured within a multi-stage event-driven pipelined ADC in accordance with an illustrative embodiment.

Specifically, FIG. 32A shows a 14b-pipelined ADC (3200) with a 7b 1st-stage SAR (3202), a residue amplifier (3204), and a 9b 2nd-stage SAR (3206). In the sampling phase (ΦS) (3208), both a small DAC (80 fF) (3210) and the main DAC (4 pF) (3212) sample a voltage-input $V_{IN}$ (3214). With a detect-and-skip (DAS) scheme [1.3], 3 MSBs are resolved by the small DAC (3210) and used to configure the main DAC (3212) at once, saving switching energy (in this example, up to 52% energy reduction). The pipelined SAR ADC (3200) can provide a consistent 75.7 dB-SNDR operation that employs linearly scaled power across 100× sampling rate adjustment from 0.4 MS/s to 40 MS/s. The FIA can provide an 82 dB gain, realized by a 3-stage topology and a special dynamic cascode structure that does not need any additional bias voltage. Moreover, a 2-step operation is devised in the 3rd-stage to achieve both fast settling and good stability. The ADC is fully dynamic, and its internal timing controls are all asynchronously produced, making it well suited for event-driven applications. It can consume only 821 uW at 40 MS/s, leading to Walden and Schreier FoMs of 4.1 fJ/conv-step and 179.6 dB, respectively.

The pipelined ADC (3200) has 2b redundancy and 32× interstage gain, each of which may be adjusted for an application of interest. The FIA-based residue amplifier (3204) realizes a 16× gain (when $\Phi_{RA}$ 3216 is enabled), while the remaining 2× gain is obtained via the 512 fF reference scaling capacitor located in parallel with the 2nd-stage DAC (3206). The 2nd-stage DAC (3206) adopts a sub-radix-2 design to tolerate incomplete settling errors. The timing controls of those circuit blocks are preferably all event-driven and asynchronously produced in some embodiments. Hence, the ADC internal operation is independent of the sampling clock (or external event rate), which ensures a consistent SNDR and linearly scaled power consumption over a wide range of sampling rate. In other embodiments, the timing controls of those circuit blocks may be configured for synchronous operation (e.g., dependent on a clock).

Figure 32B:
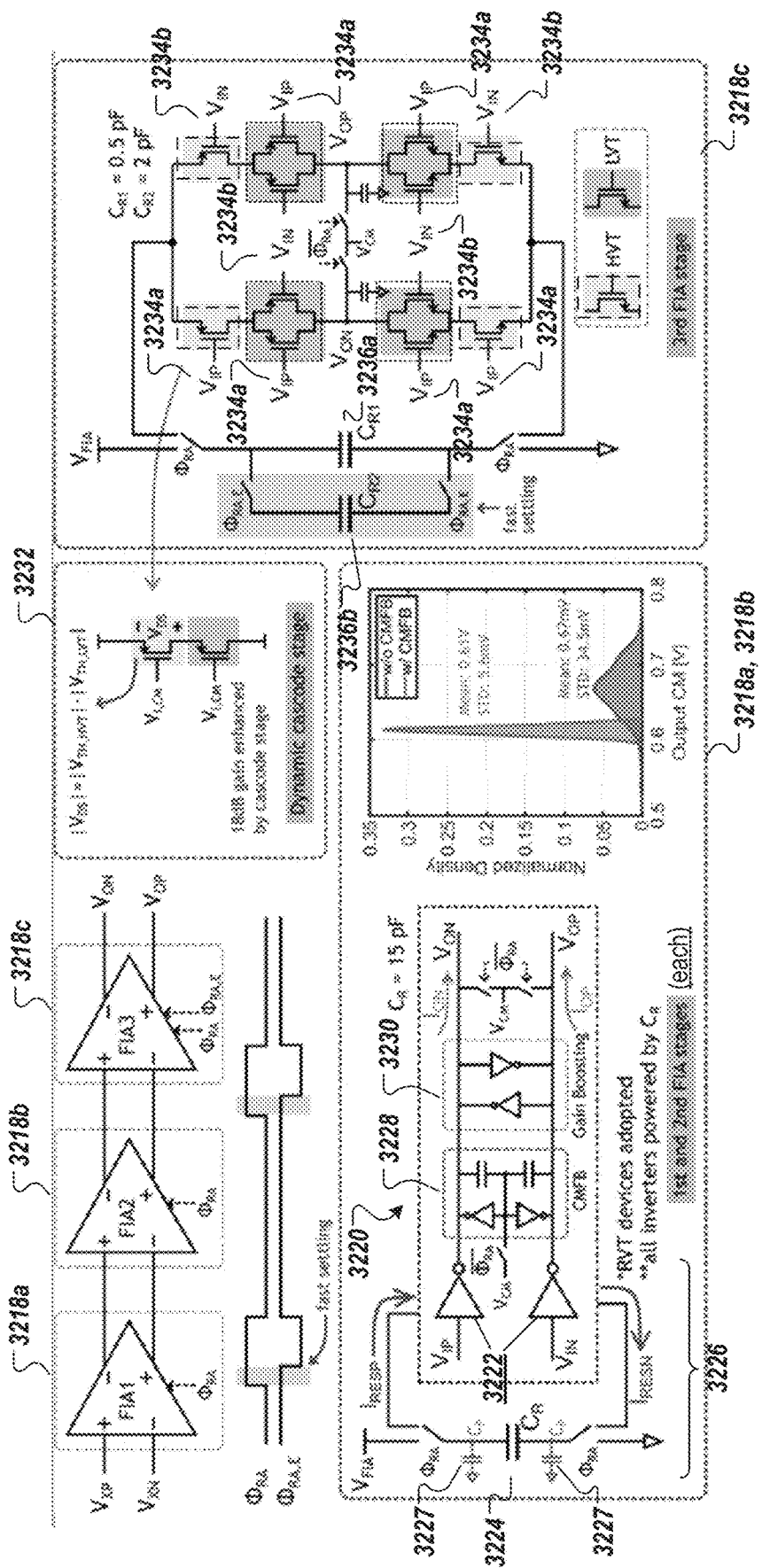

The exemplary FIA of FIG. 32A has 3 stages, shown in FIG. 332B, as stages 3218a, 3218b, and 3218c. The first 2 stages (3128a and 3128b), as shown in FIG. 32B share the circuit configuration (3220). An inverter pair 3222 powered by the reservoir capacitor $C_R$ (3224) forms the main gain stage (3226) [5.3]. Ideally, $C_R$ (3224) provides a floating voltage domain, where currents flowing in and out of the capacitor are identical (i.e., $I_{RESP}=I_{RESN}$). In that circumstance, there is no common-mode (CM) current flowing to the output (i.e., $I_{OP}+I_{ON}=0$), leading to a constant output CM. However, the parasitic $C_P$ (3227) can provide another current path and can causes an output CM shift [6.3], which can degrade the input range of the $2^{nd}$-stage SAR (3206). A small common-mode feedback (CMFB) circuit 3228 is employed, which can reduce the output CM variation (in the example, by 6×). A minimum-size cross-coupled inverter pair 3230 is included at the output to boost the differential-mode (DM) gain by an extra 4 dB. As a result, 22 dB gain is realized for both 1st and $2^{nd}$-FIA stages (3218a, 3218b).

To further boost the DM gain, the $3^{rd}$-stage (3218c) includes a dynamic cascode structure 3232 (shown as 3232a and 3232b). In alternative embodiment, the cascode transistors may be configured with a bias circuit that can consume static currents to generate the extra bias voltages.

As shown in FIG. 32B, the cascode transistors 3232 include a pair of low-$V_{th}$ (LVT) transistors with gates connecting to the $3^{rd}$-stage inputs $V_{IP/IN}$ (shown as 3234a and 3234b, respectively), thus equivalently being biased by the CM voltage. With the input transistor implemented by a high-Vth (HVT) device, its $V_{DS}$ is set by the Vth difference between HVT/LVT transistors (which is ~200 mV in 40 nm CMOS and sufficient to ensure saturation region operation). Specifically, the four HVT transistors include a transistor pair that each receives the $V_{IP}$ (3234a) and $V_{IN}$ (3234b) (similar to the floating invertor amplifier configuration shown in FIG. 1). The four HVT transistors are additionally connected to 2 VLT transistor pairs, which also receives the $V_{IP}$ (3234a) and $V_{IN}$ (3234b). The inclusion of the 2 VLT transistor pairs can provide the 3rd stage with a gain of 38 dB gain.

As shown in FIG. 32B, the $3^{rd}$-stage 3118c is powered by at least one reservoir capacitor (similar to the floating invertor amplifier configuration shown in FIG. 1) and includes a second reservoir capacitor to provide 2 reservoir capacitors ($C_{R1}$ and $C_{R2}$) (shown as 3236a and 3236b, respectively). The reservoir capacitors ($C_{R1}$ and $C_{R2}$) are coupled to corresponding set of switches $\Phi_{RA,E}$ and $\Phi_{RA}$ in which the switch $\Phi_{RA,E}$ (and thus $C_{R2}$) is first connected for initial fast settling, and then switches $\Phi_{RA,E}$ is enabled to allow a smaller $C_{R1}$ capacitor to power the cascade transistors for quick quenching and good stability.

Figure 32C:
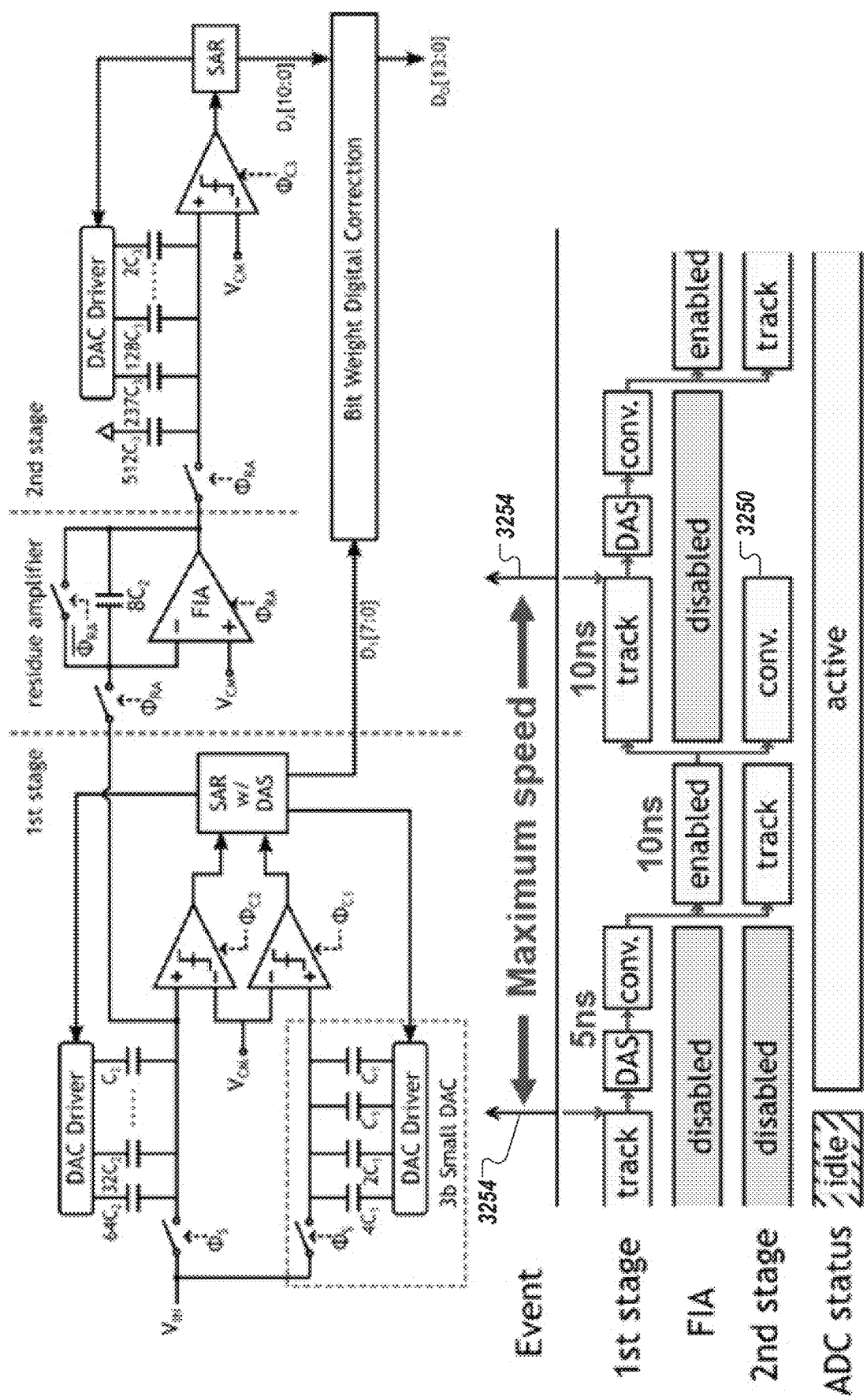

FIG. 32A shows an example operation for the pipelined ADC (3200) in which the ADC is configured for asynchronous or synchronous event driven operation. For asynchronous operation, the event is driven by an external trigger (e.g., from a processor, a control signal, etc.). For synchronous operation, the event is driven by an internal or external clock. FIG. 32C shows a second example operation for the pipelined ADC (3200) in which the ADC is configured for maximum speed operation.

In FIG. 32A, events (shown as 3238a and 3238b) are used to trigger the operation of the ADC. A sampling switch 3240 in the first stage 3202 is maintained in the sampling operation $\Phi_S$ (3242) prior to the event 3238a. The event 32328a then triggers the operation of the first conversion switch 3244 (shown as $\Phi_{C1}$ 3244) to perform the conversion with the small DAC 3210 and then the operation of the second conversion switch 3246 (shown as $\Phi_{C2}$ 3246) with the DAC driver 3212. At the end of the conversion 3246, the residual amplifier stage 3204 is enabled by residue amplifier switch 3248 (shown as $\Phi_{RA}$ 3248 and 3216). The residual amplifier stage 3204 provides a gain, as discussed above comprising the 3-stage topology and dynamic cascode structure that does not need any additional bias voltage, to the $2^{nd}$ stage ADC 3206 prior to the conversion operation by the $2^{nd}$ stage ADC 3206. The second stage ADC 3206 then performs the conversion operation $\Phi_{C3}$ 3250 to produce the output 3252. The ADC then lay idle 3252 until the next event 3238b is received.

In FIG. 32C, the ADC is configured for maximum speed operation. An event (e.g., clock) is triggered after each of the conversion $\Phi_{C3}$ 3250 is complete.

Figure 33:
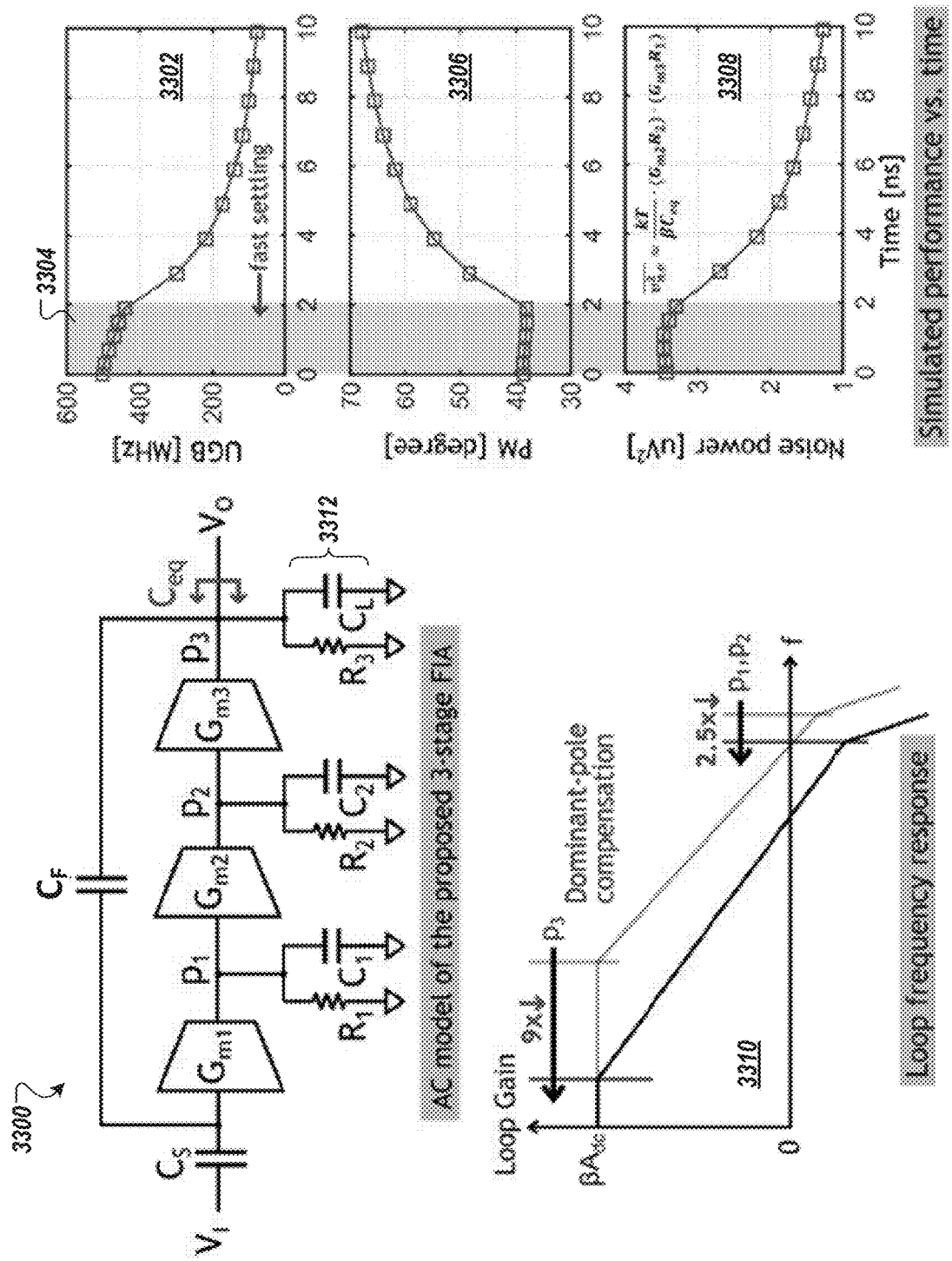
FIG. 33 shows an example FIA loop response and simulated performance of the ADC of FIG. 32B.

FIG. 33 shows an example FIA loop response and simulated performance of the ADC of FIG. 32B. In FIG. 33, a simplified model 3300 of the three-stage FIA (3218a, 3218b, 3128c) comprising 3 poles (shown as "$p_1$", "$p_2$", "$p_3$") in the amplifier (shown as providing $G_{m1}$, $G_{m2}$, $G_{m3}$) locating at each stage output. Owing to large $C_L$ and $R_3$ (3312), the 3rd stage pole $p_3$ is intrinsically dominant. With the discharge of the reservoir capacitors (3236a and 3236b when $\Phi_{RA}$ is enabled to connect the capacitors to the $3^{rd}$ FIA stage), both the FIA supply voltages and currents decrease, leading to reduced pole frequencies and UGB (see plot 3302), but the DC gain remains almost unchanged as transistor intrinsic gains are insensitive to current reduction.

Simulation results show that initially with both $CR_1$ (3236a) and $CR_2$ (3236b) connected, a large UGB ensures fast settling (3304). After $C_{R2}$ (3236b) is disconnected, the UGB quickly drops. Also, $p_3$ reduces faster than $p_1$ and $p_2$, leading to improved phase margin (PM) (see 3306) for stability. In addition to achieving wide UGB and high stability at the beginning and the end of the settling process, this FIA has also reduced output noise (see 3308). With the dominant-pole compensation (see 3310), its integrated output noise power (see 3308) is proportional to the $R_1 G_{m3}$ product. Owing to the fast quenching of the 3rd stage, $Gm_3$ deceases at a faster rate compared to the increase of $R_1$, leading to a noise power reduction of 2.5x.

Table 4 shows performance of the ADC (3200) as compared to other ADCs [1, 2, 3, 4, 7].

TABLE 4

|  | VLSI-18 Song | JSSC-15 Lim | ISSCC-19 ElShater | ISSCC-20 Hung | ISSCC-19 Hershberg | This work |
|---|---|---|---|---|---|---|
| Architecture | NS Pipeline SAR | Pipeline SAR | Pipeline SAR | Pipeline SAR | Pipeline SAR | Pipeline SAR |
| Process [nm] | 65 | 65 | 180 | 28 | 16 | 40 |
| Fs [MS/s] | 200 | 50 | 15 | 100 | 6-600 | 0.4-40 |
| Sampling Frequency Scalability | N/A | N/A | N/A | N/A | 100x | 100x |
| Residue Amplifier | High-gain OTA | Ring Amp | Ring Amp | Ring Amp | Ring Amp | FIA |
| Stabilization Technique | N/A | Dead zone | Dead zone | Dead zone | Dead zone | Self-quenching |
| Highest BW [MHz] | 12.5 | 25 | 7.5 | 50 | 300 | 20 |
| Reference [V] | 1.2 | 1.2 | 3.3 | 1.1 | 0.85 | 1.2 |
| Area [mm$^2$] | 0.014 | 0.054 | 1.82 | 0.018 | 0.037 | 0.056 |
| ADC Power [mW] | 4.5 | 1 | 9.82 | 0.7 | 6 | 0.82 |
| SFDR [dB] | 90.7 | 84.6 | 100.7 | 85.1 | 78.3 | 81.4 |
| SNDR [dB] | 77.1 | 70.9 | 90.8 | 71.7 | 60.2 | 75.7 |
| ENOB | 12.5 | 11.5 | 14.8 | 11.6 | 9.7 | 12.3 |
| FoMw$^1$ [fJ/conv-step] | 30.8 | 6.9 | 23.1 | 2.2 | 12 | 4.1 |
| FoMs$^2$ [dB] | 171.5 | 174.9 | 179.6 | 180.2 | 167.2 | 179.6 |

Figure 36:
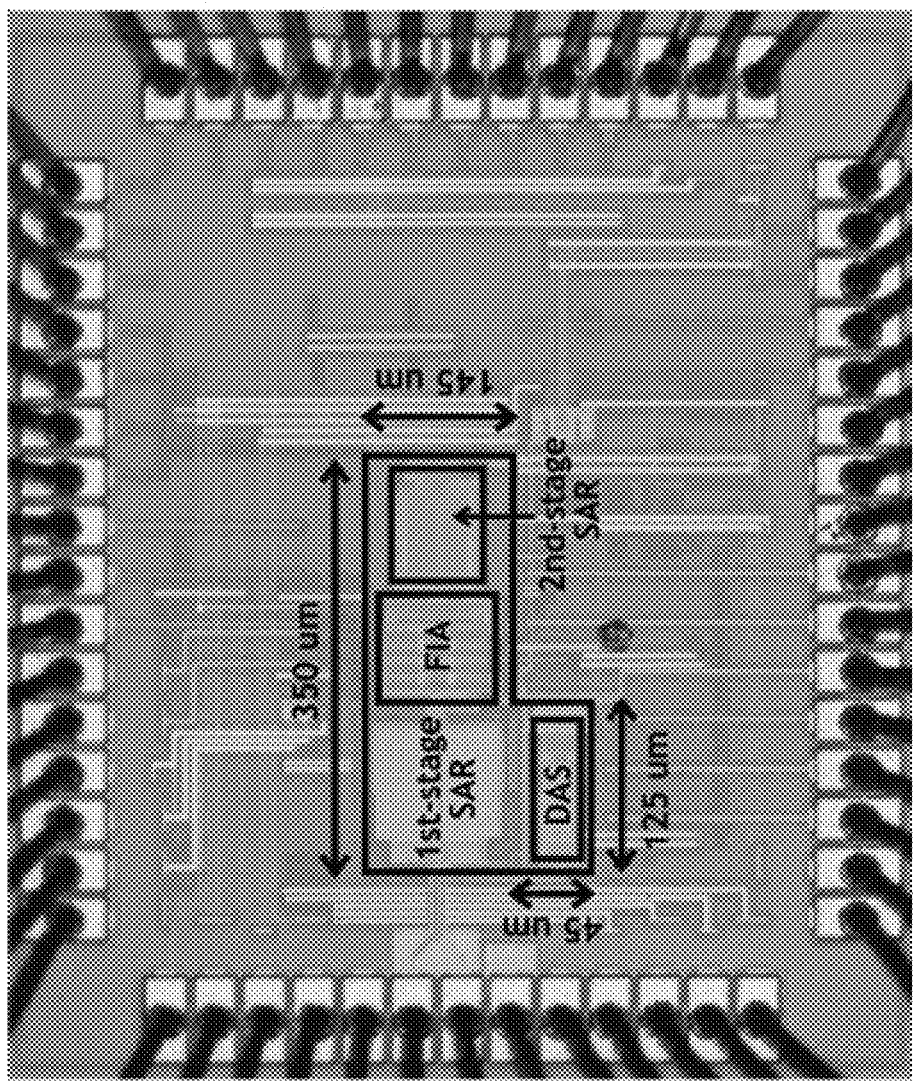
FIG. 36 shows an example prototype ADC core in 40 nm CMOS.

FIG. 36 shows an example prototype ADC core in 40 nm CMOS. The prototype occupies 0.056 mm$^2$ and is observed to consumes 821 uW at 40 MS/s (FIA 288 uW; reference 191 uW; S/H and comparator 186 uW; digital logics 156 uW). Foreground calibration is used to address capacitor mismatches. The measured SNDR/SFDR with near Nyquist input are 75.7 dB/81.4 dB (Table 4). The SNR/SNDR vs. input amplitude shows a DR of 79.5 dB.

Figure 34:
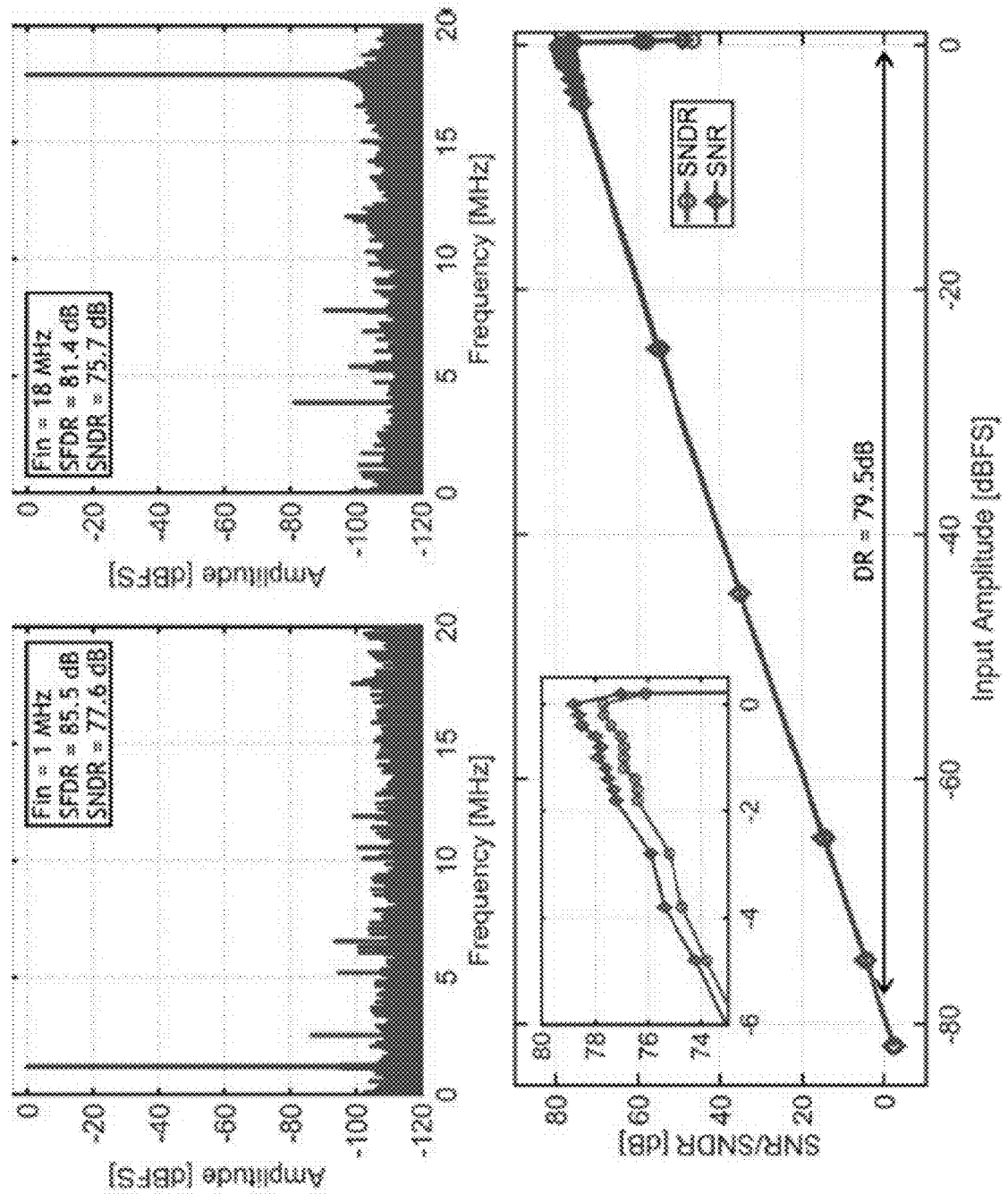
FIGS. 34-35 shows performance of a fabricated sample of the ADC of FIGS. 32A-32C.
Figure 35:
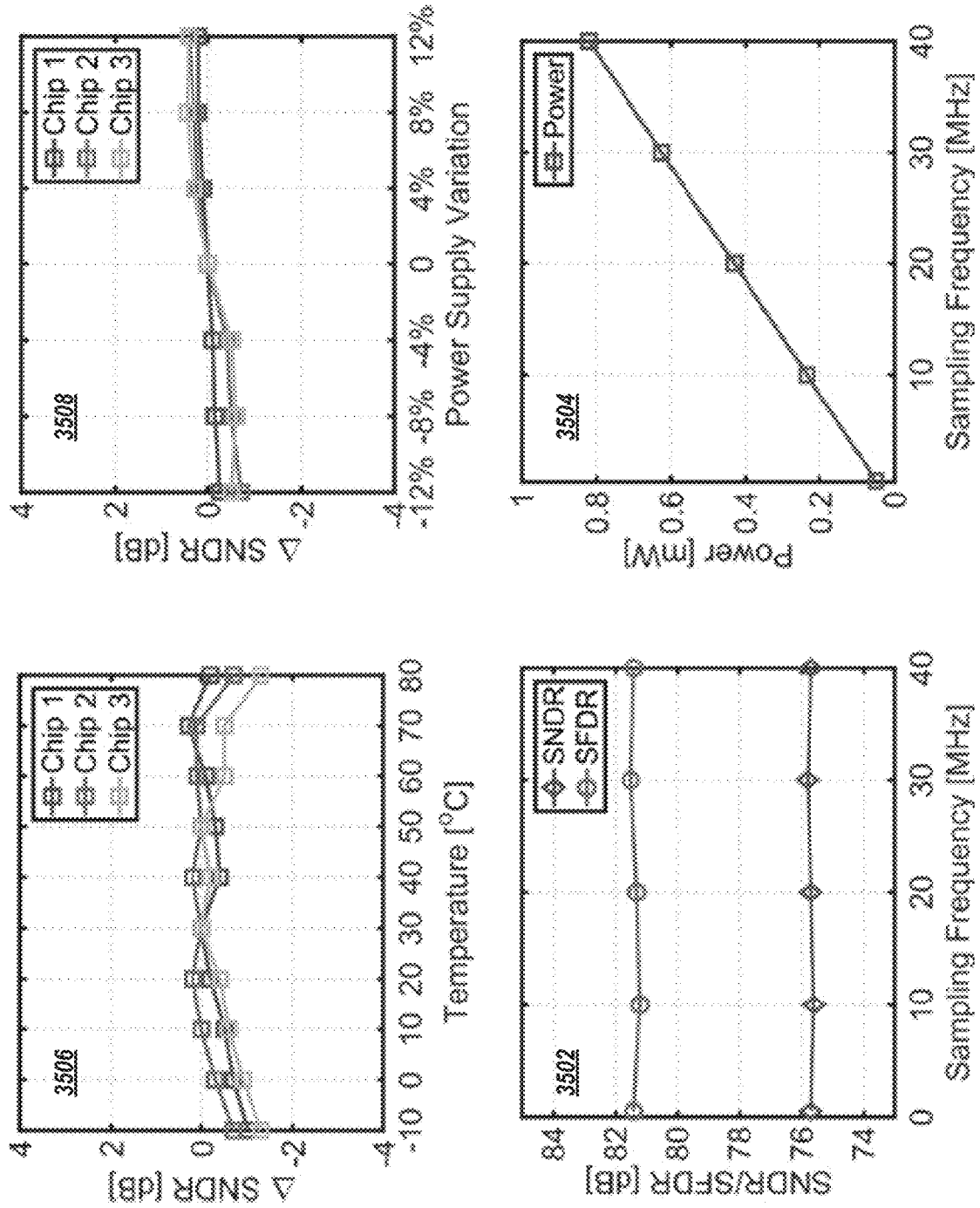

FIGS. 34-35 shows performance of a fabricated sample of the ADC (3200) of FIGS. 32A-32C. In FIG. 34, for an input signal having a frequency $F_{in}$ of 1 MHz, the ADC has a measured SFDR of 85.5 dB and a SNDR of 77.6 dB. At $F_{in}$ of 18 Mhz, the ADC has a measured SFDR of 81.4 dB and a SNDR of 75.7 dB. The ADC is also observed to have a measured dynamic range (DR) of 79.5 dB.

FIG. 35 shows performance variations versus temperature, power supply, and sampling frequency sweep. Across 3 samples, the SNDR variation is within 2dB across −10~80° C. (range set by the test instrument), and within 1 dB across ±12% supply variation. The SNDR/SFDR are consistent over 0.4-to-40 MS/s, while the power consumption scales linearity. Table 4 summarizes the performance of the ADC (3200) work and compares it with prior publications. As shown in Table 4, the exemplary fully-dynamic 3-stage cascoded FIA achieves the best reported Walden FoM among ADCs over 12-ENOB resolution and attains a consistent performance and scalable power over 100× sampling rate adjustment. Additional experimental results of the ADC (3200) may be found at Tang, X., Yang, X., Liu, J., Shi, W., Pan, D. Z. and Sun, N., "A 0.4-to-40 MS/s 75.7 dB-SNDR Fully Dynamic Event-Driven Pipelined ADC with 3-Stage Cascoded Floating Inverter Amplifier," In 2021 IEEE International Solid-State Circuits Conference (ISSCC) (Vol. 64, pp. 376-378), IEEE, February 2021, which is incorporated by reference herein in its entirety.

Indeed, the exemplary FIA is suitable for not only pipelined ADCs, but also other applications that demand high-gain, low-power, and low-noise amplifiers.

Discussion. Many applications, such as multi-standard wireless and event-driven IoT devices, demand high-resolution ADCs with scalable sampling rate and power consumption. Conventional pipelined ADC can achieve high resolution, but its power does not scale well with the sampling rate due to the use of closed-loop static OTA for residue amplification. While the OTA can be turned off to save power, it requires considerable time for the bias circuit and CMFB loop to settle when waking up, leading to wasted power and reduced peak operation frequency. Using an open-loop dynamic amplifier can make power scale linearly with frequency, but its gain varies with PVT and often requires background calibration, which converges slowly and is incompatible with event-driven applications. Ring-amp is a promising solution as it features closed-loop operation, easy duty-cycling, and decaying power over time [1.3]-[4.3]. However, its stability depends on the dead zone size, which typically requires trimming across PVT variations. Besides, the $1^{st}$ stage has a constant operating point during amplification, which consumes considerable energy. A recent work proposed a 2-stage floating inverter amplifier (FIA) that is fully dynamic and works in closed-loop [5.3]. It guarantees stability and does not need dead zone control. Moreover, the power consumptions of all stages decay over time naturally. Nevertheless, its low open-loop gain of 33 dB is inadequate for a high-resolution pipeline ADC, and its fast-quenching 2nd stage reduces the amplifier speed, limiting the usage in high-speed designs.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

Throughout this application, various publications are referenced. The disclosures of these publications in their entireties are hereby incorporated by reference into this application in order to more fully describe the state of the art to which the methods and systems pertain.

Also, unless clearly stated otherwise, when any number or range is described herein, that number or range is approximate. When any range is described herein, unless clearly stated otherwise, that range includes all values therein and all sub ranges therein. Any information in any material (e.g., a United States/foreign patent, United States/foreign patent application, book, article, etc.) that has been incorporated by reference herein, is only incorporated by reference to the extent that no conflict exists between such information and the other statements and drawings set forth herein. In the event of such conflict, including a conflict that would render invalid any claim herein or seeking priority hereto, then any such conflicting information in such incorporated by reference material is specifically not incorporated by reference herein.

Although example embodiments of the present disclosure are explained in detail herein, it is to be understood that other embodiments are contemplated. Accordingly, it is not intended that the present disclosure be limited in its scope to the details of construction and arrangement of components set forth in the following description or illustrated in the drawings. The present disclosure is capable of other embodiments and of being practiced or carried out in various ways.

In summary, while the present invention has been described with respect to specific embodiments, many modifications, variations, alterations, substitutions, and equivalents will be apparent to those skilled in the art. The present invention is not to be limited in scope by the specific embodiment described herein. Indeed, various modifications of the present invention, in addition to those described herein, will be apparent to those of skill in the art from the foregoing description and accompanying drawings. Accordingly, the invention is to be considered as limited only by the spirit and scope of the disclosure, including all modifications and equivalents.

Still other embodiments will become readily apparent to those skilled in this art from reading the above-recited detailed description and drawings of certain exemplary embodiments. It should be understood that numerous variations, modifications, and additional embodiments are possible, and accordingly, all such variations, modifications, and embodiments are to be regarded as being within the spirit and scope of this application. For example, regardless of the content of any portion (e.g., title, field, background, summary, abstract, drawing figure, etc.) of this application, unless clearly specified to the contrary, there is no requirement for the inclusion in any claim herein or of any application claiming priority hereto of any particular described or illustrated activity or element, any particular sequence of such activities, or any particular interrelationship of such elements. Moreover, any activity can be repeated, any activity can be performed by multiple entities, and/or any element can be duplicated. Further, any activity or element can be excluded, the sequence of activities can vary, and/or the interrelationship of elements can vary.

Unless clearly specified to the contrary, there is no requirement for any particular described or illustrated activity or element, any particular sequence or such activities, any particular size, speed, material, dimension or frequency, or any particularly interrelationship of such elements. Accordingly, the descriptions and drawings are to be regarded as illustrative in nature, and not as restrictive. Moreover, when any number or range is described herein, unless clearly stated otherwise, that number or range is approximate. When any range is described herein, unless clearly stated otherwise, that range includes all values therein and all sub ranges therein. Any information in any material (e.g., a United States/foreign patent, United States/foreign patent application, book, article, etc.) that has been incorporated by reference herein, is only incorporated by reference to the extent that no conflict exists between such information and the other statements and drawings set forth herein. In the event of such conflict, including a conflict that would render invalid any claim herein or seeking priority hereto, then any such conflicting information in such incorporated by reference material is specifically not incorporated by reference herein.

The following patents, applications and publications as listed below and throughout this document are hereby incorporated by reference in their entirety herein.

Reference List #1

[1.1] S.-E. Hsieh and C.-C. Hsieh, "A 0.44-fJ/conversion-step 11-bit 600-kS/s SAR ADC with semi-resting DAC," IEEE J. Solid-State Circuits, vol. 53, no. 9, pp. 2595-2603, September 2018.

[2.1] H.-Y. Tai, Y.-S. Hu, H.-W. Chen, and H.-S. Chen, "A 0.85 fJ/conversion-step 10b 200 kS/s sub-ranging SAR ADC in 40 nm CMOS," in IEEE Int. Solid-State Circuits Conf. (ISSCC) Dig. Tech. Papers, February.. 2014, pp. 196-197.

[3.1] S.-E. Hsieh and C.-C. Hsieh, "A 0.4-V 13-bit 270-kS/s SAR-ISDM ADC with op-amp-less time-domain integrator," IEEE J. Solid-State Circuits, vol. 54, no. 6, pp. 1648-1656, June 2019.

[4.1] X. Tang, L. Chen, J. Song, and N. Sun, "A 1.5 fJ/conv-step 10b 100 kS/s SAR ADC with gain-boosted dynamic comparator," in Proc. IEEE Asian Solid-State Circuits Conf. (A-SSCC), November 2017, pp. 229-232.

[5.1] C.-C. Liu, S.-J. Chang, G.-Y. Huang, and Y.-Z. Lin, "A 10-bit 50-MS/s SAR ADC with a monotonic capacitor switching procedure," IEEE J. Solid-State Circuits, vol. 45, no. 4, pp. 731-740, April 2010.

[6.1] A. Sanyal and N. Sun, "SAR ADC architecture with 98% reduction in switching energy over conventional scheme," IET Electron. Lett., vol. 49, no. 4, pp. 248-250, February 2013.

[7.1] X. Tang, L. Chen, J. Song, and N. Sun, "A 10-b 750 µW 200 MS/s fully dynamic single-channel SAR ADC in 40 nm CMOS," in Proc. IEEE 42nd Eur. Solid-State Circuits Conf. ESSCIRC Conf., September 2016, pp. 413-416.

[8.1] T. Kobayashi, K. Nogami, T. Shirotori, Y. Fujimoto, and O. Watanabe, "A current-mode latch sense amplifier and a static power saving input buffer for low-power architecture," in IEEE Symp. VLSI Circuits Dig. Tech. Papers, June 1992, pp. 28-29.

[9.1] J. Montanaro et al., "A 160-MHz, 32-b, 0.5-W CMOS RISC microprocessor," IEEE J. Solid-State Circuits, vol. 31, no. 11, pp. 1703-1714, November 1996.

[10.1] M. van Elzakker, E. van Tuijl, P. Geraedts, D. Schinkel, E. A. M. Klumperink, and B. Nauta, "A 10-bit charge-redistribution ADC consuming 1.9 µW at 1 MS/s," IEEE J. Solid-State Circuits, vol. 45, no. 5, pp. 1007-1015, May 2010.

[11.1] D. Schinkel, E. Mensink, E. Klumperink, E. Van Tuijl, and B. Nauta, "A double-tail latch-type voltage sense amplifier with 18 ps setup+hold time," in IEEE Int. Solid-State Circuits Conf. (ISSCC) Dig. Tech. Papers, February 2007, pp. 314-605.

[12.1] H. S. Bindra, C. E. Lokin, D. Schinkel, A.-J. Annema, and B. Nauta, "A 1.2-V dynamic bias latch-type comparator in 65-nm CMOS with 0.4-mV input noise," IEEE J. Solid-State Circuits, vol. 53, no. 7, pp. 1902-1912, July 2018.

[13.1] M. Liu, K. Pelzers, R. van Dommele, A. van Roermund, and P. Harpe, "A 106 nW 10 b 80 kS/s SAR ADC with duty-cycled reference generation in 65 nm CMOS," IEEE J. Solid-State Circuits, vol. 51, no. 10, pp. 2435-2445, October 2016.

[14.1] X. Tang, B. Kasap, L. Shen, X. Yang, W. Shi, and N. Sun, "An energy-efficient comparator with dynamic floating inverter pre-amplifier," in Proc. IEEE Symp. VLSI Circuits (VLSI), June 2019, pp. C140-C141.

[15.1] P. Nuzzo, F. De Bernardinis, P. Terreni, and G. Van der Plas, "Noise analysis of regenerative comparators for reconfigurable ADC architectures," IEEE Trans. Circuits Syst. I, Reg. Papers, vol. 55, no. 6, pp. 1441-1454, July 2008.

[16.1] L. Chen, A. Sanyal, J. Ma, X. Tang, and N. Sun, "Comparator common-mode variation effects analysis and its application in SAR ADCs," in Proc. IEEE Int. Symp. Circuits Syst. (ISCAS), May 2016, pp. 2014-2017.

[17.1] B. Razavi, "The StrongARM latch [A circuit for all seasons]," IEEE Solid-State Circuits Mag., vol. 7, no. 2, pp. 12-17, Spring 2015.

[18.1] T. Sepke, P. Holloway, C. G. Sodini, and H.-S. Lee, "Noise analysis for comparator-based circuits," IEEE Trans. Circuits Syst. I, Reg. Papers, vol. 56, no. 3, pp. 541-553, March 2009.

[19.1] B. Øksendal, Stochastic Differential Equations. Berlin, Germany: Springer-Verlag, 1998.

[20.1] M. S. Akter, K. A. A. Makinwa, and K. Bult, "A capacitively degenerated 100-dB linear 20-150 MS/s dynamic amplifier," IEEE J. Solid-State Circuits, vol. 53, no. 4, pp. 1115-1126, April 2018.

[21.1] L. Shen et al., "A 0.01 mm2 25 µW 2 MS/s 74 dB-SNDR continuous-time pipelined-SAR ADC with 120 fF input capacitor," in IEEE Int. Solid-State Circuits Conf. (ISSCC) Dig. Tech. Papers, February 2019, pp. 64-66.

[22.1] B. Razavi, Design of Analog CMOS Integrated Circuits. Boston, Mass., USA: McGraw-Hill, 2001.

[23.1] Y. Tsividis and C. McAndrew, Operation and Modeling of the MOS Transistor, vol. 2. Oxford, U.K.: Oxford Univ. Press, 1999.

[24.1] G. Reimbold and P. Gentil, "White noise of MOS transistors operating in weak inversion," IEEE Trans. Electron Devices, vol. ED-29, no. 11, pp. 1722-1725, November 1982.

Reference List #2

[1.2] H.-Y. Tai, Y.-S. Hu, H.-W. Chen, and H.-S. Chen, "A 0.85 fJ/conversion-step 10b 200 kS/s sub-ranging SAR ADC in 40 nm CMOS," in Solid-State Circuits Conference Digest of Technical Papers (ISSCC), 2014 IEEE International. IEEE, 2014, pp. 196-197.

[2.2] S.-E. Hsieh and C.-C. Hsieh, "A 0.44-fJ/Conversion-Step 11-Bit 600-kS/s SAR ADC With Semi-Resting DAC," IEEE Journal of Solid-State Circuits, vol. 53, no. 9, pp. 2595-2603, 2018.

[3.2] X. Tang, L. Chen, J. Song, and N. Sun, "A 1.5 fJ/conv-step 10b 100 kS/s SAR ADC with gain-boosted dynamic comparator," in Solid-State Circuits Conference (A-SSCC), 2017 IEEE Asian. IEEE, 2017, pp. 229-232.

[4.2] J. A. Fredenburg and M. P. Flynn, "A 90-MS/s 11-MHz-Bandwidth 62-dB SNDR Noise-Shaping SAR ADC," IEEE Journal of Solid-State Circuits, vol. 47, no. 12, pp. 2898-2904, 2012.

[5.2] Y.-S. Shu, L.-T. Kuo, and T.-Y. Lo, "An oversampling SAR ADC with DAC mismatch error shaping achieving 105 dB SFDR and 101 dB SNDR over 1 kHz BW in 55 nm CMOS," IEEE Journal of Solid-State Circuits, vol. 51, no. 12, pp. 2928-2940, 2016.

[6.2] K. Obata, K. Matsukawa, T. Miki, Y. Tsukamoto, and K. Sushihara, "A 97.99 db sndr, 2 khz bw, 37.1 w noise-shaping sar-adc with dynamic element matching and modulation dither effect," in 2016 IEEE Symposium on VLSI Circuits (VLSI-Circuits). IEEE, 2016, pp. 1-2.

[7.2] H. Zhuang, W. Guo, J. Liu, H. Tang, Z. Zhu, L. Chen, and N. Sun, "A second-order noise-shaping SAR ADC with passive integrator and tri-level voting," IEEE Journal of Solid-State Circuits, vol. 54, no. 6, pp. 1636-1647, 2019.

[8.2] Y.-Z. Lin, C.-Y. Lin, S.-C. Tsou, C.-H. Tsai, and C.-H. Lu, "A 40MHz-BW 320MS/s Passive Noise-Shaping SAR ADC With Passive Signal-Residue Summation in 14 nm FinFET," in 2019 IEEE International Solid-State Circuits Conference-(ISSCC). IEEE, 2019, pp. 330-332.

[9.2] Y.-Z. Lin, C.-H. Tsai, S.-C. Tsou, R.-X. Chu, and C.-H. Lu, "A 2.4-mW 25-MHz BW 300-MS/s passive noise shaping SAR ADC with noise quantizer technique in 14-nm CMOS," in 2017 Symposium on VLSI Circuits. IEEE, 2017, pp. C234-C235.

[10.2] Z. Chen, M. Miyahara, and A. Matsuzawa, "A 9.35-ENOB, 14.8 fJ/conv.-step fully-passive noise-shaping SAR ADC," IEICE Transactions on Electronics, vol. 99, no. 8, pp. 963-973, 2016.

[11.2] Z. Chen, M. Miyahara, and A. Matsuzawa, "A 2-nd order fully-passive noise-shaping SAR ADC with embedded passive gain," in 2016 IEEE Asian Solid-State Circuits Conference (A-SSCC). IEEE, 2016, pp. 309-312.

[12.2] J. Liu, X. Wang, Z. Gao, M. Zhan, X. Tang, and N. Sun, "A 40 kHz-BW 90 dB-SNDR Noise-Shaping SAR with 4Passive Gain and 2nd-Order Mismatch Error Shaping," in 2020 IEEE International Solid-State Circuits Conference-(ISSCC). IEEE, 2020, pp. 158-160.

[13.2] W. Guo and N. Sun, "A 12b-ENOB 61W noise-shaping SAR ADC with a passive integrator," in ESSCIRC Conference 2016: 42nd European Solid-State Circuits Conference. IEEE, 2016, pp. 405-408.

[14.2] C.-C. Liu and M.-C. Huang, "A 0.46 mW 5 MHz-BW 79.7 dB-SNDR noise-shaping SAR ADC with dynamic-amplifier-based FIR-IIR filter," in 2017 IEEE International Solid-State Circuits Conference (ISSCC). IEEE, 2017, pp. 466-467.

[15.2] M. Miyahara and A. Matsuzawa, "An 84-dB dynamic range 62.5-625 kHz bandwidth clock-scalable noise-shaping SAR ADC with open-loop integrator using dynamic amplifier," in 2017 IEEE Custom Integrated Circuits Conference (CICC). IEEE, 2017, pp. 1-4.

[16.2] S. Li, B. Qiao, M. Gandara, D. Z. Pan, and N. Sun, "A 13-ENOB second-order noise-shaping SAR ADC realizing optimized NTF zeros using the error-feedback structure," IEEE Journal of Solid-State Circuits, vol. 53, no. 12, pp. 3484-3496, 2018.

[17.2] L. Jie, B. Zheng, and M. P. Flynn, "A Calibration-Free Time-Interleaved Fourth-Order Noise-Shaping SAR ADC," IEEE Journal of Solid-State Circuits, vol. 54, no. 12, pp. 3386-3395, 2019.

[18.2] X. Tang, X. Yang, W. Zhao, C.-K. Hsu, J. Liu, L. Shen, A. Mukherjee, W. Shi, D. Z. Pan, and N. Sun, "A 13.5 b-ENOB Second-Order Noise-Shaping SAR with PVT-Robust Closed-Loop Dynamic Amplifier," in 2020 IEEE International Solid-State Circuits Conference-(ISSCC). IEEE, 2020, pp. 162-164.

[19.2] T. Kobayashi, K. Nogami, T. Shirotori, Y. Fujimoto, and O. Watanabe, "A current-mode latch sense amplifier and a static power saving input buffer for low-power architecture," in 1992 Symposium on VLSI Circuits Digest of Technical Papers. IEEE, 1992, pp. 28-29.

[20.2] J. Montanaro, R. T. Witek, K. Anne, A. J. Black, E. M. Cooper, D. W. Dobberpuhl, P. M. Donahue, J. Eno, W. Hoeppner, D. Kruckemyer et al., "A 160-Mhz, 32-b, 0.5-W CMOS RISC microprocessor," IEEE Journal of Solid-State Circuits, vol. 31, no. 11, pp. 1703-1714, 1996.

[21.2] X. Tang, L. Shen, B. Kasap, X. Yang, W. Shi, A. Mukherjee, D. Z. Pan, and N. Sun, "An Energy-Efficient Comparator With Dynamic Floating Inverter Amplifier," IEEE Journal of Solid-State Circuits, vol. 55, no. 4, pp. 1011-1022, 2020.

[22.2] S.-H. W. Chiang, H. Sun, and B. Razavi, "A 10-Bit 800-MHz 19-mW CMOS ADC," IEEE Journal of Solid-State Circuits, vol. 49, no. 4, pp. 935-949, 2014.

[23.2] M. S. Akter, K. A. Makinwa, and K. Bult, "A capacitively degenerated 100-dB linear 20-150 MS/s dynamic amplifier," IEEE Journal of Solid-State Circuits, vol. 53, no. 4, pp. 1115-1126, 2017.

[24.2] S. Billa, A. Sukumaran, and S. Pavan, "Analysis and design of continuous-time delta-sigma converters incorporating chopping," IEEE Journal of Solid-State Circuits, vol. 52, no. 9, pp. 2350-2361, 2017.

[25.2] B. Hershberg, S. Weaver, K. Sobue, S. Takeuchi, K. Hamashita, and U.-K. Moon, "Ring amplifiers for switched capacitor circuits," IEEE Journal of Solid-State Circuits, vol. 47, no. 12, pp. 2928-2942, 2012.

[26.2] Y. Lim and M. P. Flynn, "A 1 mW 71.5 dB SNDR 50 MS/s 13 bit fully differential ring amplifier-based SAR-assisted pipeline ADC," IEEE Journal of Solid-State Circuits, vol. 50, no. 12, pp. 2901-2911, 2015.

[27.2] Y. Lim and M. P. Flynn, "A 100 MS/s, 10.5-bit, 2.46 mW comparator-less pipeline ADC using self-biased ring amplifiers," IEEE Journal of Solid-State Circuits, vol. 50, no. 10, pp. 2331-2341, 2015.

[28.2] J. Lagos, B. P. Hershberg, E. Martens, P. Wambacq, and J. Craninckx, "A 1-GS/s, 12-b, single-channel pipelined ADC with dead-zone-degenerated ring amplifiers," IEEE Journal of Solid-State Circuits, vol. 54, no. 3, pp. 646-658, 2019.

[29.2] A. ElShater, P. K. Venkatachala, C. Y. Lee, J. Muhlestein, S. Leuenberger, K. Sobue, K. Hamashita, and U.-K. Moon, "A 10-mW 16-b 15-MS/s Two-Step SAR ADC With 95-dB DR Using Dual-Deadzone Ring Amplifier," IEEE Journal of Solid-State Circuits, vol. 54, no. 12, pp. 3410-3420, 2019.

[30.2] S.-W. M. Chen and R. W. Brodersen, "A 6-bit 600-MS/s 5.3-mW Asynchronous ADC in 0.13-m CMOS," IEEE Journal of Solid-State Circuits, vol. 41, no. 12, pp. 2669-2680, 2006.

Reference List #3

[1.3] Y. Lim and M. P. Flynn, "A 1 mW 71.5 dB SNDR 50 MS/s 13 bit Fully Differential Ring Amplifier Based SAR-Assisted Pipeline ADC," IEEE J. Solid-State Circuits, vol. 50, no. 12, pp. 2901-2911, December 2015.

[2.3] B. Hershberg et al., "3.6 A 6-to-600 MS/s Fully Dynamic Ringamp Pipelined ADC with Asynchronous Event-Driven Clocking in 16 nm," in 2019 IEEE International Solid-State Circuits Conference—(ISSCC), February 2019, pp. 68-70.

[3.3] A. ElShater et al., "3.7 A 10 mW 16b 15 MS/s Two-Step SAR ADC with 95 dB DR Using Dual-Deadzone Ring-Amplifier," in 2019 IEEE International Solid-State Circuits Conference—(ISSCC), February 2019, pp. 70-72.

[4.3] T.-C. Hung, J.-C. Wang, and T.-H. Kuo, "16.4 A Calibration-Free 71.7 dB SNDR 100 MS/s 0.7 mW Weighted-Averaging Correlated Level Shifting Pipelined SAR ADC with Speed-Enhancement Scheme," in 2020 IEEE International Solid-State Circuits Conference—(ISSCC), February 2020, pp. 256-258.

[5.3] X. Tang et al., "9.5 A 13.5b-ENOB Second-Order Noise-Shaping SAR with PVT-Robust Closed-Loop Dynamic Amplifier," in 2020 IEEE International Solid-State Circuits Conference—(ISSCC), February 2020, pp. 162-164.

[6.3] X. Tang et al., "An Energy-Efficient Comparator With Dynamic Floating Inverter Amplifier," IEEE J. Solid-State Circuits, vol. 55, no. 4, pp. 1011-1022, April 2020.

[7.3] Y. Song, Y. Zhu, C.-H. Chan, L. Geng, and R. P. Martins, "A 77 dB SNDR 12.5 MHz Bandwidth 0-1 MASH ΣΔ ADC Based on the Pipelined-SAR Structure," in 2018 IEEE Symposium on VLSI Circuits, June 2018, pp. 203-204.

What is claimed is:

1. An apparatus comprising:
a floating inverter amplifier, wherein the floating inverter amplifier comprises a pair of inverters forming a bridge, the bridge comprising an input configured to be switchable between a floating reservoir capacitor that powers the pair of inverters during a first phase of operation and to a device power source that powers the pair of inverters during a second phase of operation, wherein the floating reservoir capacitor is charged by the device power source during the second phase of operation.

2. The apparatus of claim 1, wherein the floating inverter amplifier is configured to boost $g_m/I_D$ from current reuse and dynamic bias.

3. The apparatus of claim 2, wherein the floating inverter amplifier is configured for at least 2-time current reuse.

4. The apparatus of claim 2, wherein the floating inverter amplifier is configured to provide an intrinsically constant output common-mode voltage.

5. The apparatus of claim 2, wherein the floating inverter amplifier is configured to provide process, voltage, and temperature robustness.

6. The apparatus of claim 2, wherein the floating inverter amplifier is configured to provide high-gain with constant output common-mode voltage.

7. The apparatus of claim 2, wherein the apparatus comprises a comparator having input-referred noise less than 46-μV that consumes about or less than 1 pJ per comparison under a 1.2-V supply.

8. The apparatus of claim 1, further comprising:
a SA latch coupled to the floating inverter amplifier to collectively form a comparator.

9. The apparatus of claim 8, wherein the floating inverter amplifier is configured to reduce the influence of process corner and of input common-mode voltage on the comparator, which yields reduction in noise, offset, and delay variations.

10. The apparatus of claim 1, wherein the apparatus is selected from an amplifier, a comparator, a sensor, a DC-DC converter, a power regulator, and a low drop-out regulator.

11. The apparatus of claim 1, wherein the floating inverter amplifier is configured as a loop filter in a closed feedback-loop operation of the apparatus, the apparatus being selected from the group consisting of Delta-Sigma modulator, a pipeline ADC, and capacitance-to-digital converter, configured with loop filter.

12. The apparatus of claim 1, wherein the apparatus is configured as a mixed-signal circuit device, an integrated circuit device, and microcontroller circuit device.

13. The apparatus of claim 1, wherein the apparatus is configured for current reuse and dynamic bias and for constant output common-mode voltage and PVT/input common mode.

14. The apparatus of claim 1, wherein the apparatus is configured as a $2^{nd}$-order noise-shaping successive-approximation register ADC.

15. The apparatus of claim 14, wherein the $2^{nd}$-order noise-shaping successive-approximation register ADC comprise a multi-stage dynamic amplifier each comprising the floating inverter amplifier.

16. The apparatus of claim 1, wherein the floating reservoir capacitor comprises a metal-on-metal (MoM) capacitor.

17. The apparatus of claim 1, wherein the apparatus is configured as an event-driven pipelined ADC with multi-stage cascoded floating inverter amplifier.

18. An integrated circuit device comprising:
a floating inverter amplifier, wherein the floating inverter amplifier comprises a pair of inverters forming a bridge, the bridge comprising an input configured to be switchable between a floating reservoir capacitor that powers the pair of inverters during a first phase of operation and to a device power source that powers the pair of inverters during a second phase of operation, wherein the floating reservoir capacitor is charged by the device power source during the second phase of operation.

19. The integrated circuit device of claim 18, wherein the floating inverter amplifier is located along an input signal path for the subsequent stage.

20. The integrated circuit device of claim 18, wherein the floating inverter amplifier is located along feedback path for the subsequent stage.

* * * * *